(12) United States Patent
Liao et al.

(10) Patent No.: US 11,891,477 B2
(45) Date of Patent: Feb. 6, 2024

(54) CONJUGATED POLYMER MATERIAL AND ORGANIC PHOTOVOLTAIC DEVICE USING THE SAME

(71) Applicant: Raynergy Tek Incorporation, Hsinchu (TW)

(72) Inventors: Chuang-Yi Liao, Hsinchu (TW); Wei-Long Li, Hsinchu (TW)

(73) Assignee: RAYNERGY TEK INCORPORATION, Hsinchu (TW)

( * ) Notice: Subject to any disclaimer, the term of this patent is extended or adjusted under 35 U.S.C. 154(b) by 570 days.

(21) Appl. No.: 17/106,645

(22) Filed: Nov. 30, 2020

(65) Prior Publication Data

US 2021/0171705 A1 Jun. 10, 2021

Related U.S. Application Data

(60) Provisional application No. 62/943,834, filed on Dec. 5, 2019.

(51) Int. Cl.
*C08G 61/12* (2006.01)
*H10K 30/82* (2023.01)
(Continued)

(52) U.S. Cl.
CPC ........... *C08G 61/126* (2013.01); *C08G 61/00* (2013.01); *H10K 30/82* (2023.02); *H10K 85/113* (2023.02);
(Continued)

(58) Field of Classification Search
CPC .................. C08G 61/126; C08G 61/00; C08G 2261/1646; C08G 2261/18;
(Continued)

(56) References Cited

U.S. PATENT DOCUMENTS

| 2015/0065671 A1 | 3/2015 | Terai |
| 2017/0237010 A1 | 8/2017 | Facchetti et al. |

FOREIGN PATENT DOCUMENTS

| CN | 102124044 A | 7/2011 |
| CN | 103804653 A | 5/2014 |

(Continued)

OTHER PUBLICATIONS

Taiwan Patent Office "Office Action" dated Sep. 24, 2021, Taiwan.
(Continued)

*Primary Examiner* — Shane Fang
(74) *Attorney, Agent, or Firm* — WPAT, P.C.

(57) ABSTRACT

An organic photovoltaic device comprises a first electrode, a first carrier transporting layer, an active layer, a second carrier transporting layer, and a second electrode. The first electrode is a transparent electrode. The active layer includes a conjugated polymer material, which includes a structure of formula I:

(formula I)

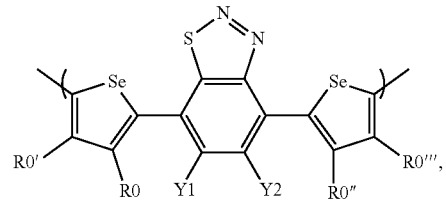

wherein R0, R0', R0'', R0''', Y1 and Y2 can be the same or different from each other, and independently selected from one of the following groups and their derivatives: C1-C30 alkyl, C3-C30 branched alkyl, C1-C30 silyl, C2-C30 ester, (Continued)

C1-C30 alkoxy, C1-C30 alkylthio, C1-C30 haloalkyl, C2-C30 olefin, C2-C30 alkyne, C2-C30 carbon chain containing cyano, C1-C30 carbon chain containing nitro, C1-C30 carbon chain containing hydroxyl, C3-C30 carbon chain containing keto, halogen, cyano, and hydrogen. The organic photovoltaic device of the present invention has good power conversion efficiency.

10 Claims, 10 Drawing Sheets

(51) Int. Cl.
  *H10K 85/10* (2023.01)
  *H10K 85/60* (2023.01)
  *C08G 61/00* (2006.01)
(52) U.S. Cl.
  CPC ......... *H10K 85/654* (2023.02); *H10K 85/656* (2023.02); *H10K 85/6572* (2023.02); *H10K 85/6574* (2023.02); *H10K 85/6576* (2023.02); *C08G 2261/1646* (2013.01); *C08G 2261/18* (2013.01); *C08G 2261/3225* (2013.01); *C08G 2261/3246* (2013.01); *C08G 2261/91* (2013.01)

(58) Field of Classification Search
  CPC .... C08G 2261/3225; C08G 2261/3246; C08G 2261/91; H10K 85/654; H10K 85/656; H10K 85/6576; H10K 85/6572; H10K 85/113; H10K 85/6574; H10K 30/82
  See application file for complete search history.

(56) References Cited

FOREIGN PATENT DOCUMENTS

| | | |
|---|---|---|
| CN | 106795318 A | 5/2017 |
| CN | 108148182 A | 6/2018 |
| JP | 2013201252 A | 10/2013 |
| JP | 2014229799 A | 12/2014 |

OTHER PUBLICATIONS

Jyun-Fong Jheng et al., "Synthesis and Characterization of Copolymers Based on 5,6-difluoro-benzo-2,1,3-thiadiazole Acceptor and Thiophene, Furan and Selenophene Donor Units and Their Copolymers Containing Porphyrin Side Chain Units for Photovoltaics Applications", Jun. 2013, Published 2012, National Chiao Tung University in partial Fulfillment of the Requirementsfor the Degree of Master in Applied Chemistry.

CONJUGATED POLYMER MATERIAL AND ORGANIC PHOTOVOLTAIC DEVICE USING THE SAME

The present application is based on, and claims priority from, America provisional patent application number U.S. 62/943,834, filed on Dec. 5, 2019, the disclosure of which is hereby incorporated by reference herein in its entirety.

BACKGROUND OF THE INVENTION

Field of the Invention

The present invention relates to a conjugated polymer material applied to an organic photovoltaic device, and an organic photovoltaic device including the said conjugated polymer material.

Description of the Prior Art

In view of global warming, climate change has become a common challenge in the international communities. The Kyoto protocol proposed by the "United Nations Framework Convention on Climate Change (UNFCCC)" in 1997 which had entered into force in 2005 is aimed at reducing carbon dioxide emissions. In this regard, countries are focusing on the development of renewable energy to reduce the use of petrochemical fuels. As the sun provides far enough energy needs of people at present and for the future, renewable energy becomes a major concern for solar power generation, which has led to the use of organic photovoltaic devices for solar power generation as the primary development target.

Compared with the existing silicon-based photovoltaic devices, the new type of organic photovoltaic devices is a promising candidate to solve the energy and environmental crisis due to low production cost, flexibility, less toxicity, and indoor and outdoor applications. The active layer material in the polymer-based organic photovoltaic devices plays a main role in achieving a high-efficiency organic photovoltaic device. The components of the active layer are donor material and acceptor material. At the early stage, fullerenes derivatives (PCBM) are the main acceptor material. However, non-fullerene materials are attracting more and more attention because they are beneficial to adjust the crystallinity of the active layer materials. In addition, due to the absorption range and intensity of PCBM are insufficient, PCBM is only suitable for low bandgap donors to achieve high power conversion efficiency (PCE) (about 10%). Non-fullerene materials show a red-shift absorption range to 700-1000 nm, which matches well with medium bandgap conjugated polymers and can achieve more than 10% photovoltaic conversion efficiency. In this regard, to improve the power conversion efficiency of polymer-based organic photovoltaic devices, how to provide an active layer material with high power energy conversion efficiency and an organic photovoltaic device using the same is a very important topic at present.

SUMMARY OF THE INVENTION

In view of this, one category of the present invention is to provide a conjugated polymer material to break through the power conversion efficiency of the prior art. According to a specific embodiment of the present invention, the conjugated polymer material comprises a structure of formula I:

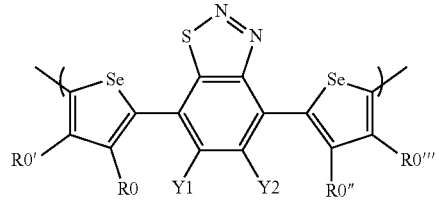

(formula I)

Wherein, R0, R0', R0", R0''', Y1 and Y2 can be the same or different from each other, and can be independently selected from the following groups and their derivatives consisting of C1-C30 alkyl, C3-C30 branched alkyl, C1-C30 silyl, C2-C30 ester, C1-C30 alkoxy, C1-C30 alkylthio, C1-C30 haloalkyl, C2-C30 alkene, C2-C30 alkyne, C2-C30 cyano-containing carbon chain, C1-C30 nitro-containing carbon chain, C1-C30 hydroxy-containing carbon chain, C3-C30 keto-containing carbon chain, halogen, cyano and hydrogen atom.

Another category of the present invention is to provide an organic photovoltaic device which comprises a first electrode, a first carrier transfer layer, an active layer, a second carrier transfer layer, and a second electrode. The first electrode is a transparent electrode. The active layer includes at least one of the aforementioned conjugated polymer materials. Wherein, the first carrier transfer layer is disposed between the first electrode and the active layer, the active layer is disposed between the first carrier transfer layer and the second carrier transfer layer, and the second carrier transfer layer is disposed between the active layer and the second electrode.

Compared with the prior art, the conjugated polymer material of the present invention has good morphology control and can effectively improve the power conversion efficiency of the organic photovoltaic device.

BRIEF DESCRIPTION OF THE APPENDED DRAWINGS

Some of the embodiments will be described in detail, with reference to the following figures, wherein like designations denote like members, wherein.

Figure 1:
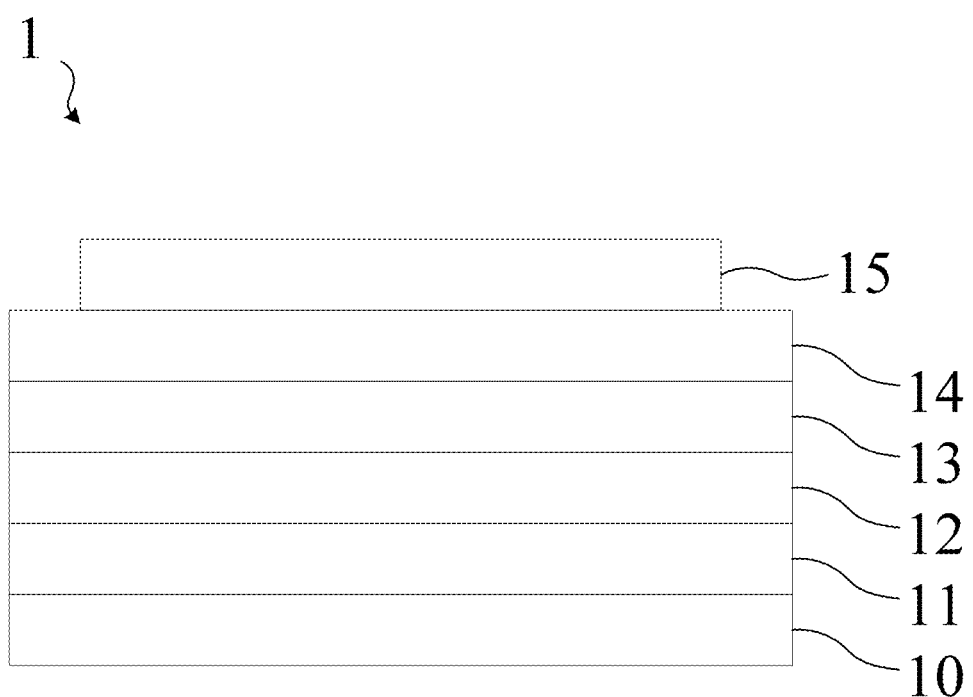
FIG. 1 shows a schematic structural diagram of one embodiment of an organic photovoltaic device of the present invention.

The advantages, spirits, and features of the present invention will be explained and discussed with embodiments and figures as follows.

DETAILED DESCRIPTION OF THE INVENTION

In order to make the advantages, spirit, and features of the present invention easier and clearer, it will be detailed and discussed in the following with reference to the embodiments and the accompanying drawings. It is worth noting that the specific embodiments are merely representatives of the embodiments of the present invention, but it can be implemented in many different forms and is not limited to the embodiments described in this specification. Rather, these embodiments are provided so that this disclosure will be thorough and complete.

The terminology used in the various embodiments disclosed in the present invention is only for the purpose of describing specific embodiments and is not intended to limit the various embodiments disclosed in the present invention. As used herein, singular forms also include plural forms unless the context clearly indicates otherwise. Unless otherwise defined, all terms (including technical and scientific terms) used in this specification have the same meanings as commonly understood by one of ordinary skill in the art to which the various embodiments disclosed herein belong. The above terms (such as those defined in commonly used dictionaries) will be interpreted as having the same meaning as the contextual meaning in the same technical field, and will not be interpreted as having an idealized or overly formal meaning unless explicitly defined in the various embodiments disclosed herein.

In the description of this specification, the description of the reference terms "an embodiment", "a specific embodiment" and the like means that specific features, structures, materials, or characteristics described in connection with the embodiment are included in at least one embodiment of the present invention. In this specification, the schematic expressions of the above terms do not necessarily refer to the same embodiment. Furthermore, the particular features, structures, materials, or characteristics described may be combined in any suitable manner in any one or more embodiments.

Definition:

As used herein, "donor" material refers to a semiconductor material, such as an organic semiconductor material, having electron holes as a primary current or charge carrier. In some embodiments, when a P-type semiconductor material is deposited on a substrate, it can provide the electron holes with hole mobility greater than about $10^{-5}$ $cm^2/Vs$. In the case of field-effect devices, the current on/off ratio of the P-type semiconductor material exhibits more than about 10.

As used herein, "acceptor" material refers to the semiconductor material, such as the organic semiconductor material, having electrons as the primary current or the charge carrier. In some embodiments, when a N-type semiconductor material is deposited on a substrate, it can provide the electrons with electron mobility greater than about 10-5 cm2/Vs. In the case of field-effect devices, the current on/off ratio of the N-type semiconductor material exhibits more than about 10.

As used herein, "mobility" refers to the speed rate of the charge carrier moving through the material under the influence of an electric field. The charge carrier is the electron hole (positive charge) in the P-type semiconductor material and the electron (negative charge) in the N-type semiconductor material. This parameter depends on the architecture of the component and can be measured by field-effect component or space charge limiting current.

The compound as used herein is considered as "environmentally stable" or "stabilized under ambient conditions" and refers to that the carrier mobility of the transistor of the semiconductor material utilized the compound is maintained at an initial value while the transistor has been exposed to an environmental condition such as air, environmental temperature and humidity for a duration. For example, a compound may be considered to be environmentally stable if the change in carrier mobility of a transistor incorporating the compound is less than 20% or 10% of the initial value after being exposed to the environmental conditions including air, humidity, and temperature for 3, 5 or 10 days.

Fill factor (FF) used herein refers to the ratio of the actual maximum available power ($P_m$ or $V_{mp}*J_{mp}$) to the theoretical (non-actually available) power ($J_{sc}*V_{oc}$). Therefore, the fill factor can be determined by the following formula:

$$FF=(V_{mp}*J_{mp})/(V_{oc}*J_{sc})$$

Wherein, the $J_{mp}$ and $V_{mp}$ respectively represent the current density and voltage at the maximum power point (Pm), which is obtained by varying the resistance in the circuit to the maximum value of J*V. $J_{sc}$ and $V_{oc}$ represent short-circuit current and open-circuit voltage, respectively. The fill factor is a key parameter for evaluating solar cells. The fill factor of commercial solar cells is typically greater than about 60%.

The open-circuit voltage ($V_{oc}$) used herein is the potential difference between the anode and the cathode of the component without connecting the external load.

The power conversion efficiency (PCE) of solar cells used herein refers to the conversion percentage of power from the incident light to the electricity power. The power conversion efficiency (PCE) of solar cells can be calculated by dividing the maximum power point ($P_m$) by the incident light irradiance (E; $W/m^2$) under the standard test conditions (STC) and the surface area (Ac; $m^2$) of the solar cells. STC generally refers to the conditions of a temperature of 25° C., irradiance of 1000 $W/m^2$, and air mass (AM) 1.5 spectrum.

The member (e.g., a thin film layer) as used herein can be considered as "photoactive" if it contains one or more compounds capable of absorbing photons to generate excitons for producing photocurrents.

As used herein, "solution proceeding" refers to a process in which a compound (e.g., a polymer), material, or composition can be used in a solution state, such as spin coating, printing (e.g., inkjet printing, gravure printing, and lithography printing), spray coating, slit coating, drop-casting, dip coating, and knife coating.

As used herein, "annealing" refers to a post-deposition heat treatment to a semi-crystalline polymer film for a certain duration in the environment or under decompressed or pressurized environment. "Annealing temperature" refers to the temperature at which the polymer film or the mixed film of the polymer and other molecules can perform small-scale molecular movement and rearrangement during the annealing process. Without limitation by any particular theory, it is believed that annealing can lead to an increase in crystallinity in the polymer film, enhance the material carrier mobility of the polymer film or a mixed film of the polymer with other molecules, and the molecules are arranged alternately to achieve the effect of independent transmission paths of effective electrons and holes.

In the prior art, alternating conjugated polymers are widely used in organic semiconductors. The present invention provides a new type of random type conjugated polymer material. The main chain of the random type conjugated polymer material contains different electron donor groups and electron acceptor groups, and the random type conjugated polymer material can be adjusted the ratio between the electron donor groups and the electron acceptor groups to modify absorption range, energy level, solubility, and carrier mobility. The random type conjugated polymer materials have good compatibility with the acceptor material, thereby improving power conversion efficiency.

In one specific embodiment, a conjugated polymer material comprises a structure of formula I in the present invention:

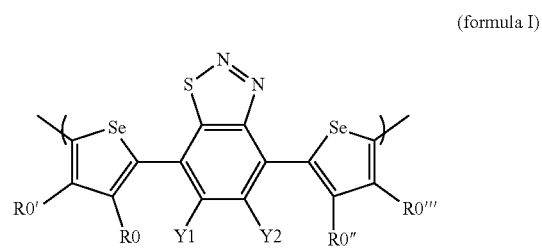

(formula I)

Wherein, R0, R0', R0'', R0''', Y1 and Y2 can be the same or different from each other, and can be independently selected from the following groups and their derivatives consisting of C1-C30 alkyl, C3-C30 branched alkyl, C1-C30 silyl, C2-C30 ester, C1-C30 alkoxy, C1-C30 alkylthio, C1-C30 haloalkyl, C2-C30 alkene, C2-C30 alkyne, C2-C30 cyano-containing carbon chain, C1-C30 nitro-containing carbon chain, C1-C30 hydroxy-containing carbon chain, C3-C30 keto-containing carbon chain, halogen, cyano and hydrogen atom.

In one specific embodiment, the conjugated polymer material comprises a structure of formula II in the present invention:

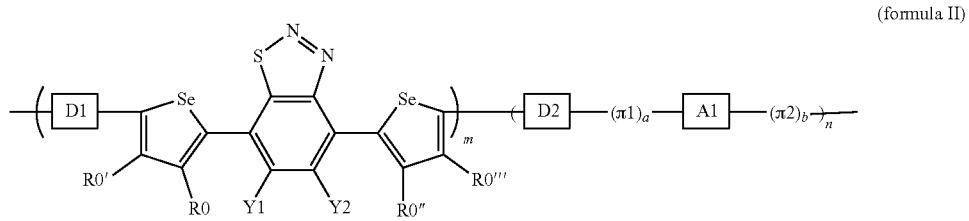

(formula II)

Wherein, D1 and D2 can be the same or different electron donor groups, A1 is an electron acceptor group, and π1 and π2 can be the same or different conjugated groups. a and b are independently selected from 0 or 1. m and n are integers, independently selected from 0 to 1000, wherein m is not equal to 0.

In one specific embodiment, the conjugated polymer material comprises a structure of formula III in the present invention:

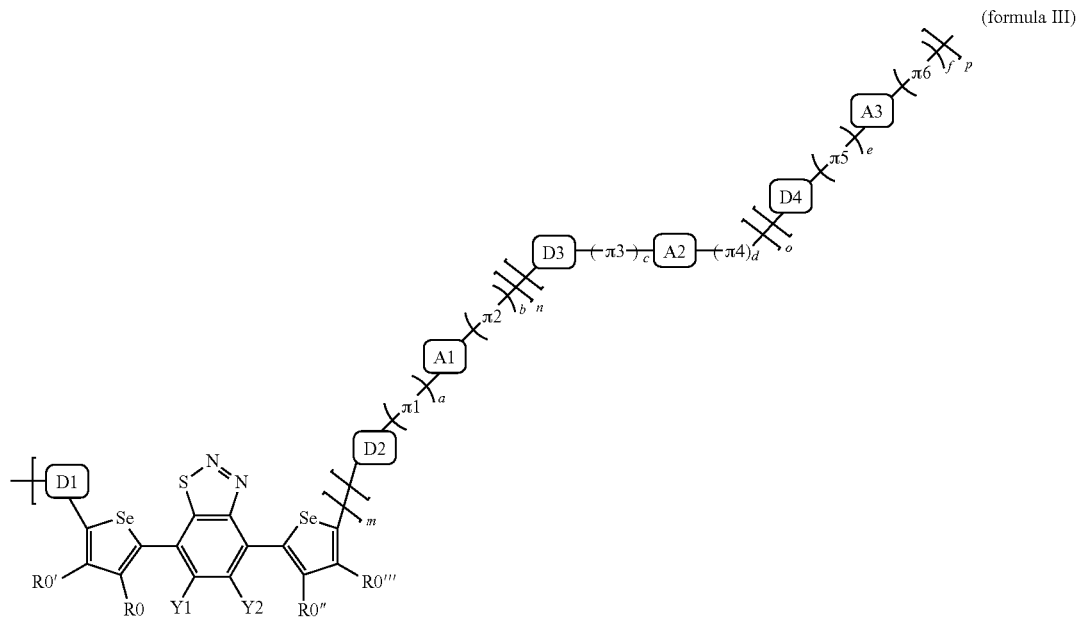

(formula III)

Wherein, D1, D2, D3, and D4 can be the same or different electron donor groups from each other. A1, A2, and A3 can be the same or different electron acceptor groups from each other. π1, π2, π3, π4, π5, and π6 can be the same or different conjugated groups from each other. a, b, c, d, e, and f are independently selected from 0 or 1. m, n, o, and p are integers and are independently selected from 0 to 1000, wherein m is not equal to 0, and o and p are not 0 at the same time.

Wherein, D1, D2, D3, and D4 further include substituted and unsubstituted heterocyclic ring, substituted and unsubstituted fused heterocyclic ring and derivatives thereof, wherein the heteroatom of the heterocyclic ring and the fused heterocyclic ring includes at least one of selenium, sulfur, nitrogen, and oxygen, and the number of the ring is at least 3. In practical application, D1, D2, D3, and D4 are independently selected from the following structures and their derivatives:

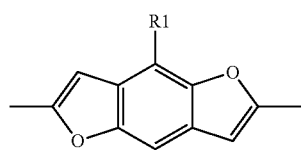

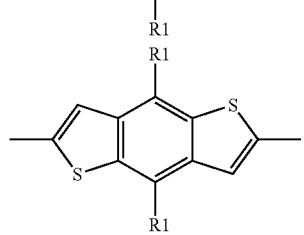

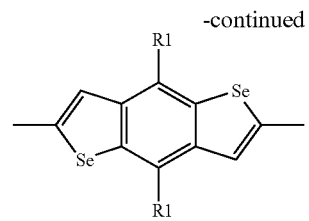

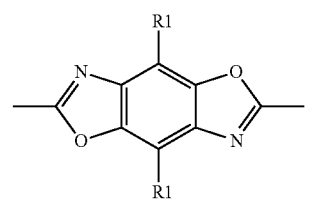

-continued

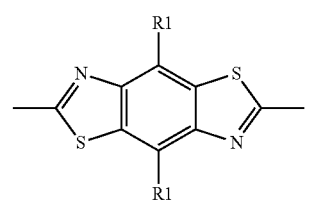

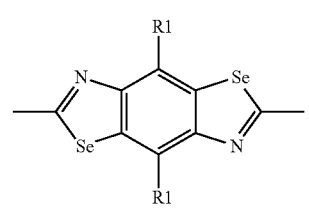

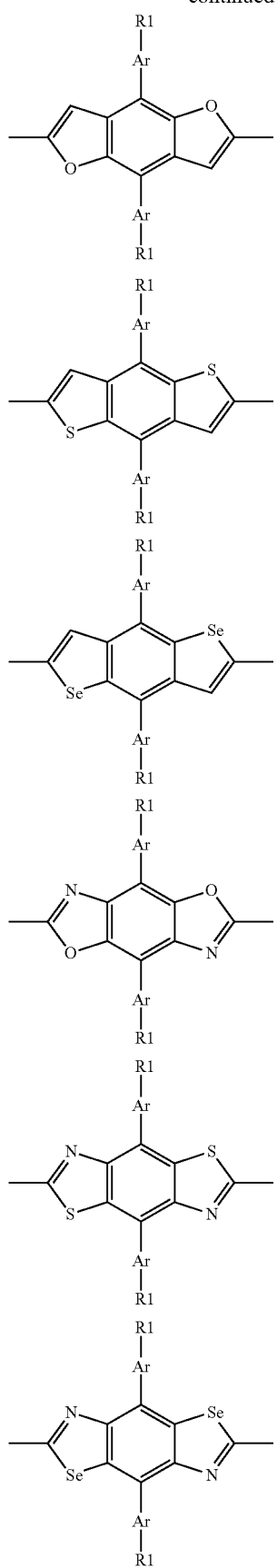
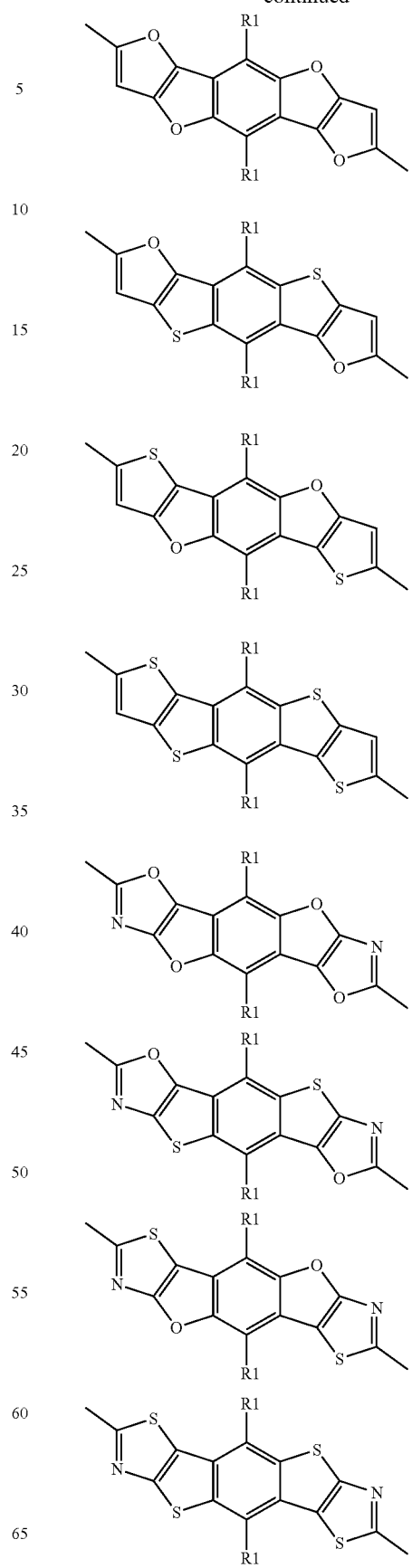

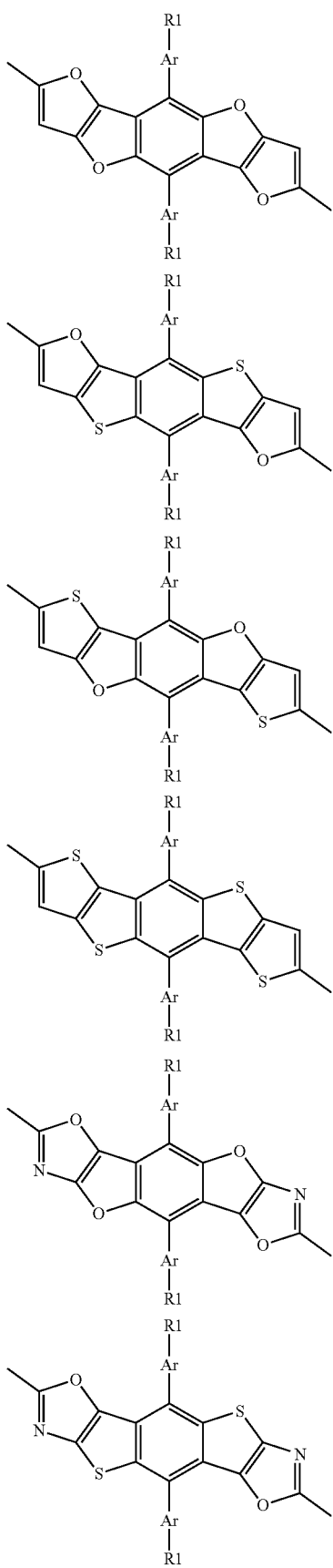
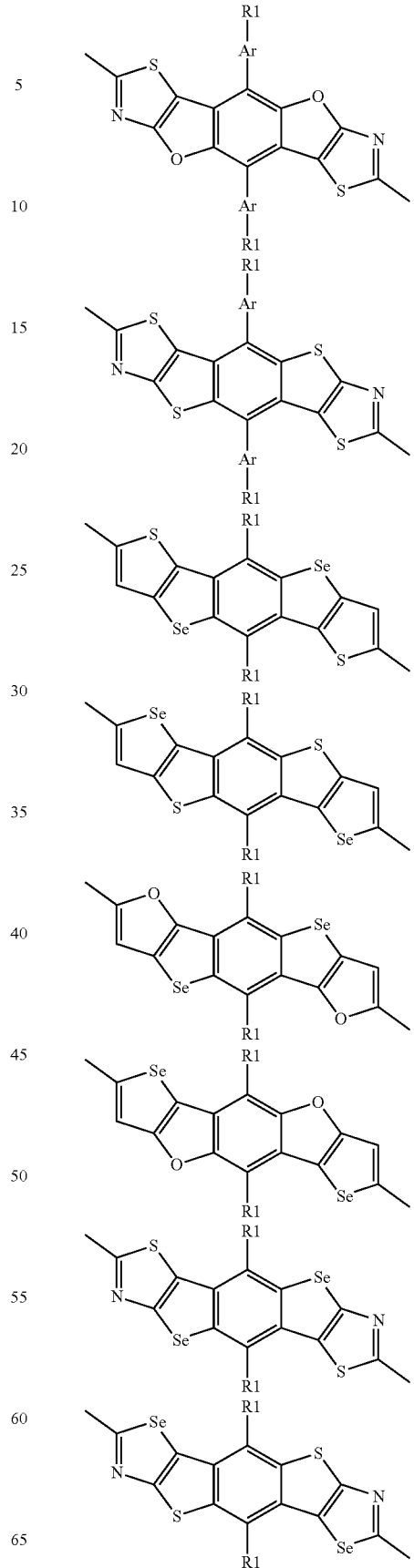

-continued
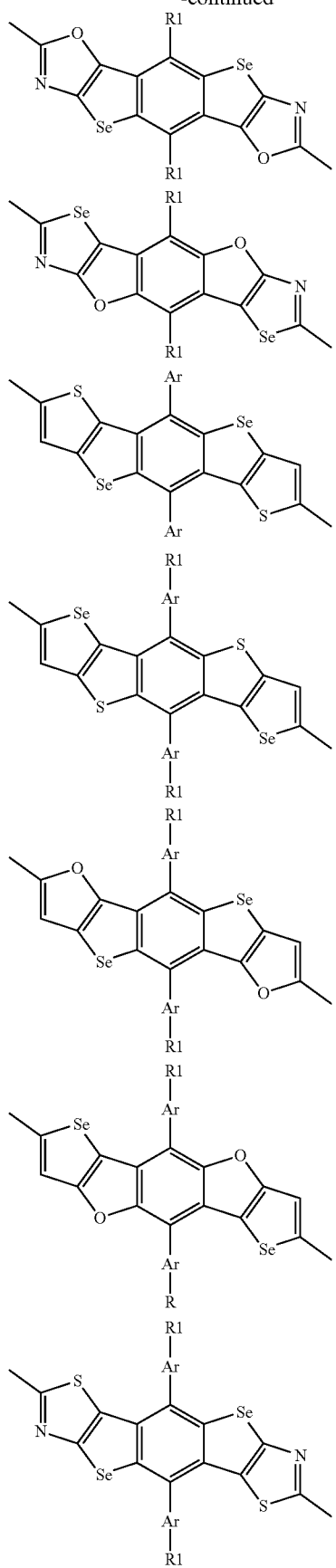
-continued
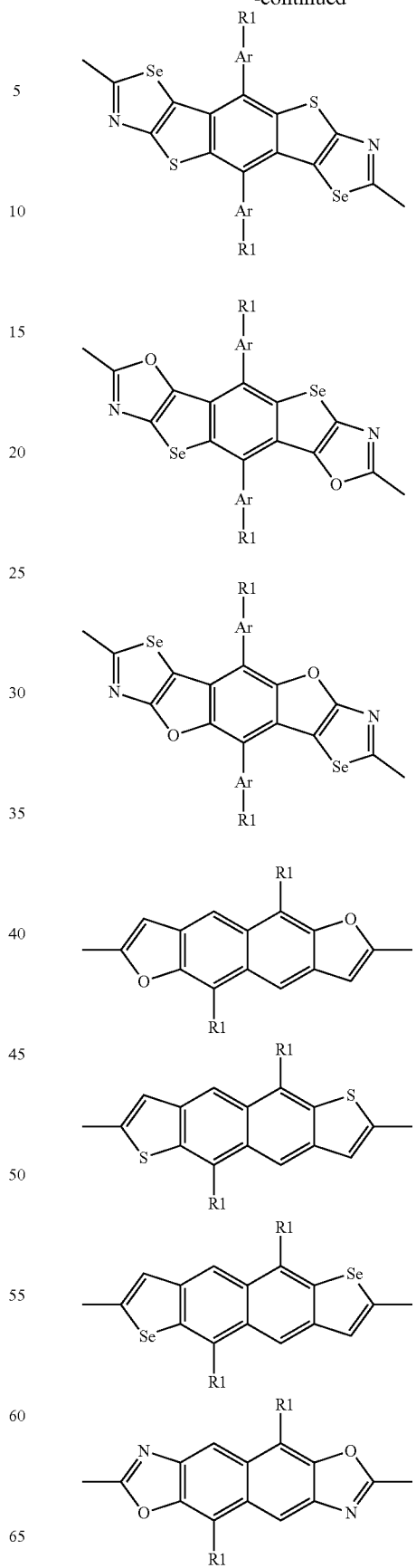

-continued
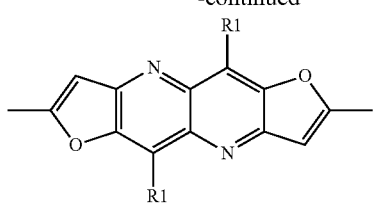
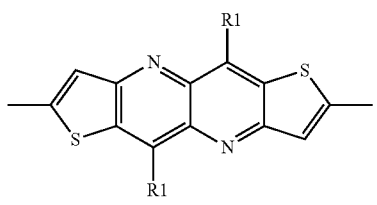
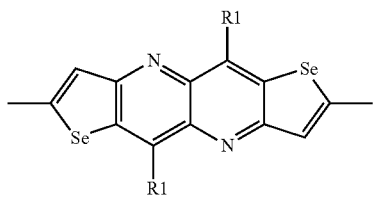
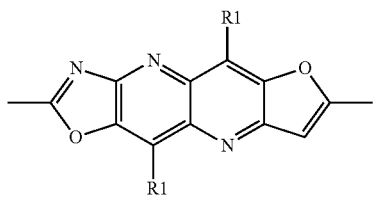
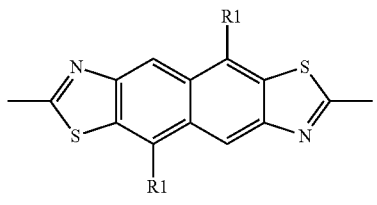
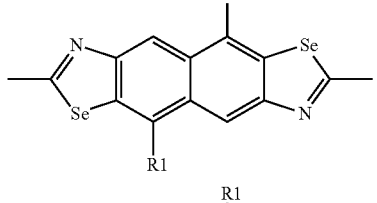
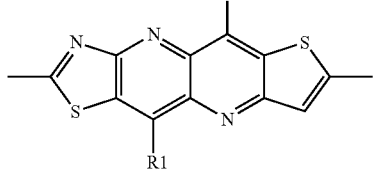
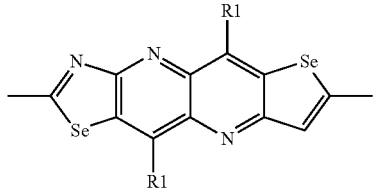
-continued
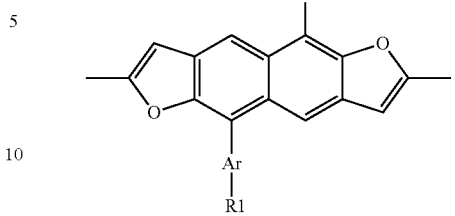
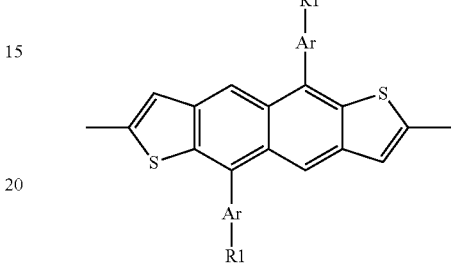
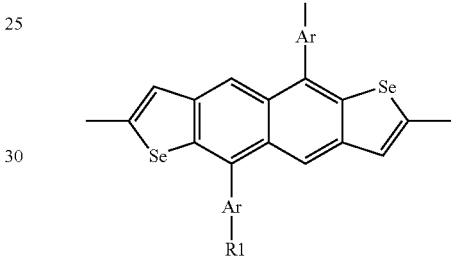
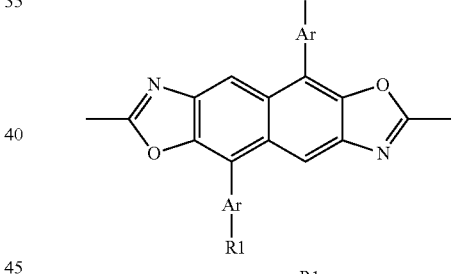
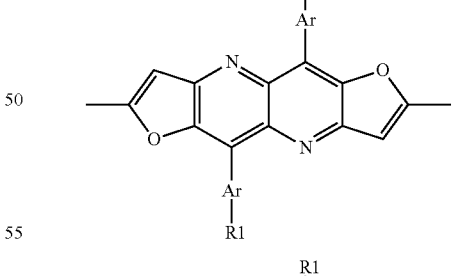
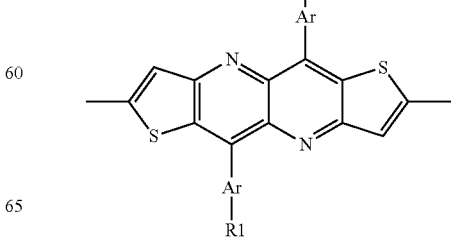

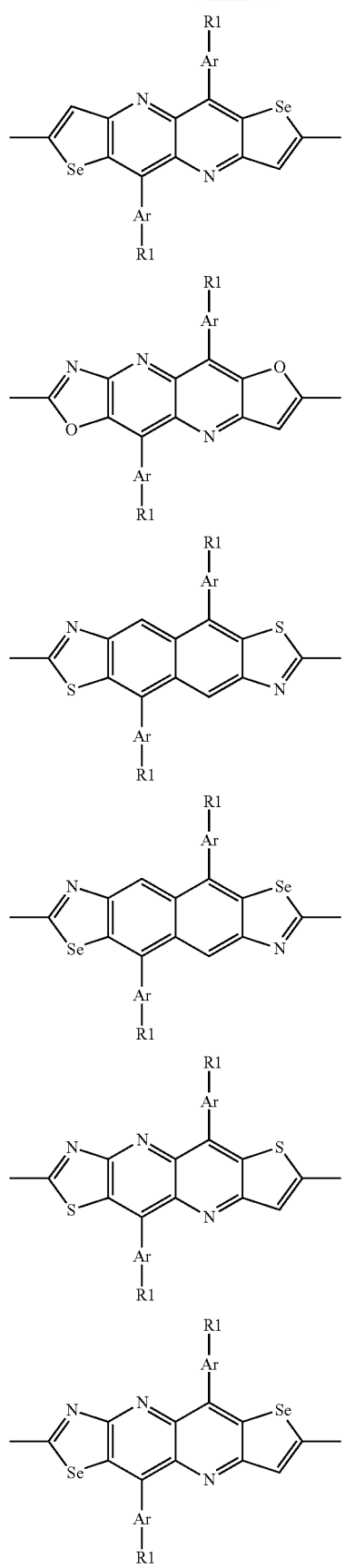
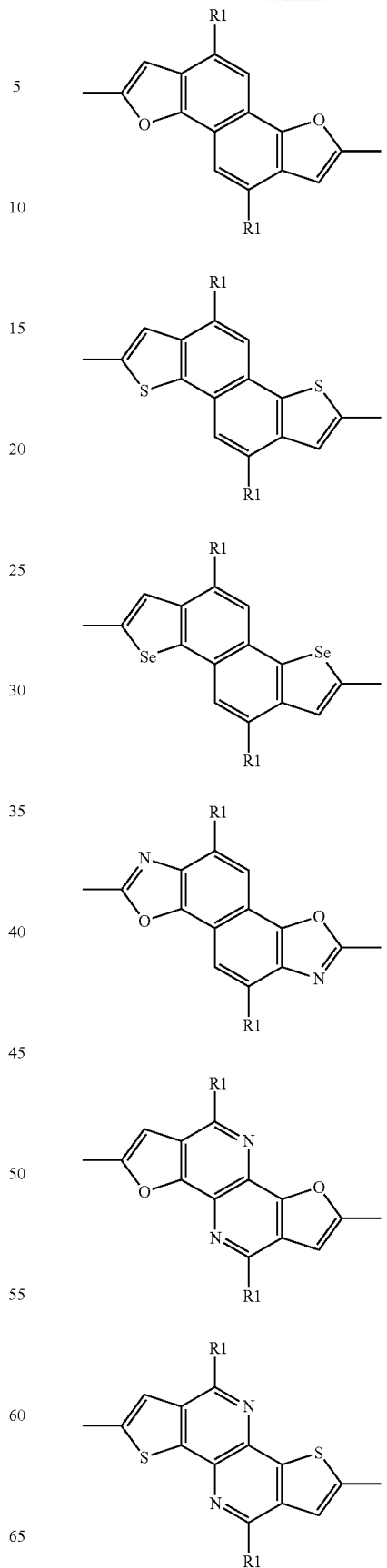

-continued
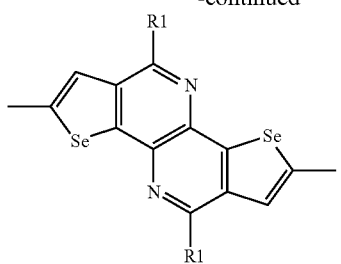
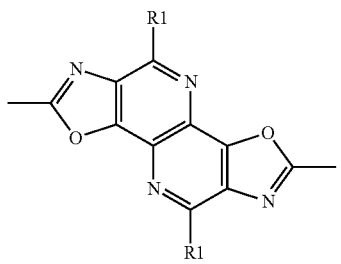
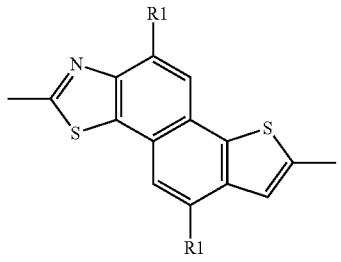
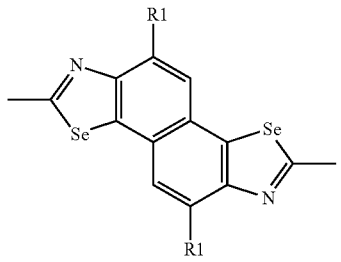
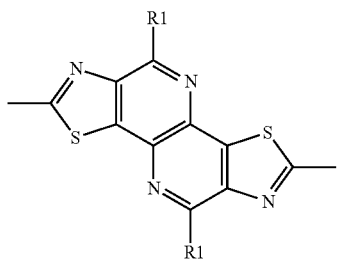
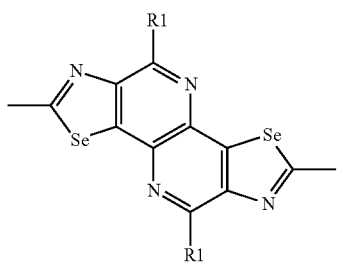
-continued
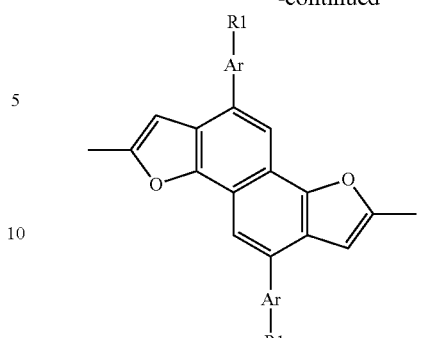
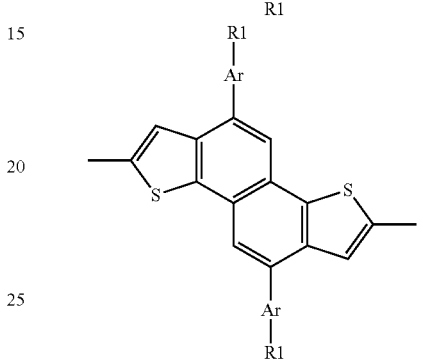
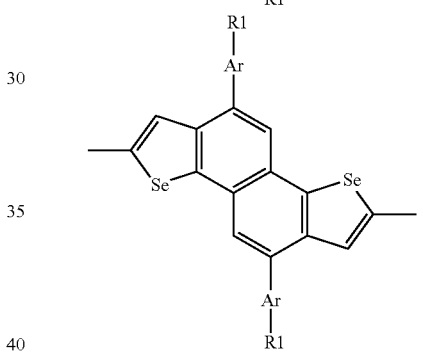
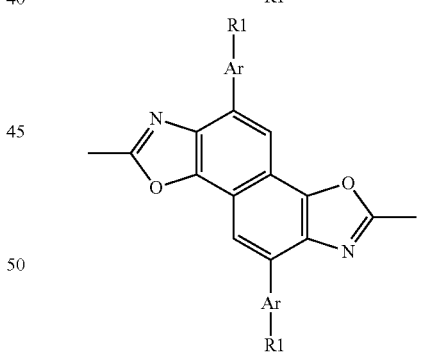
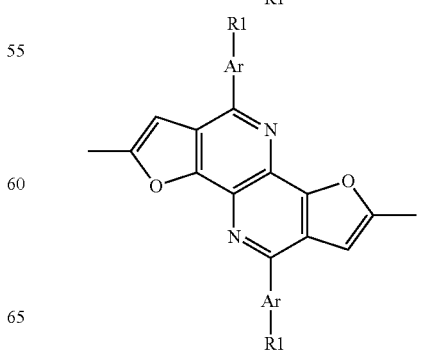

-continued
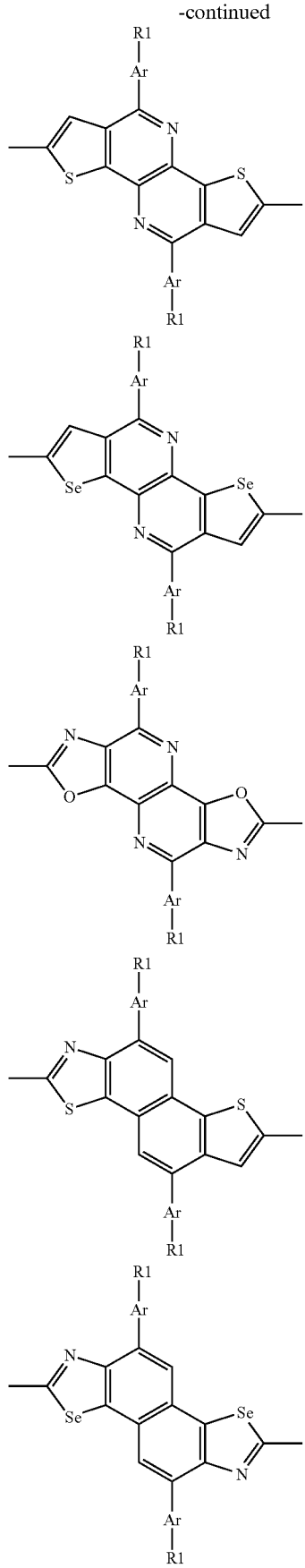
-continued
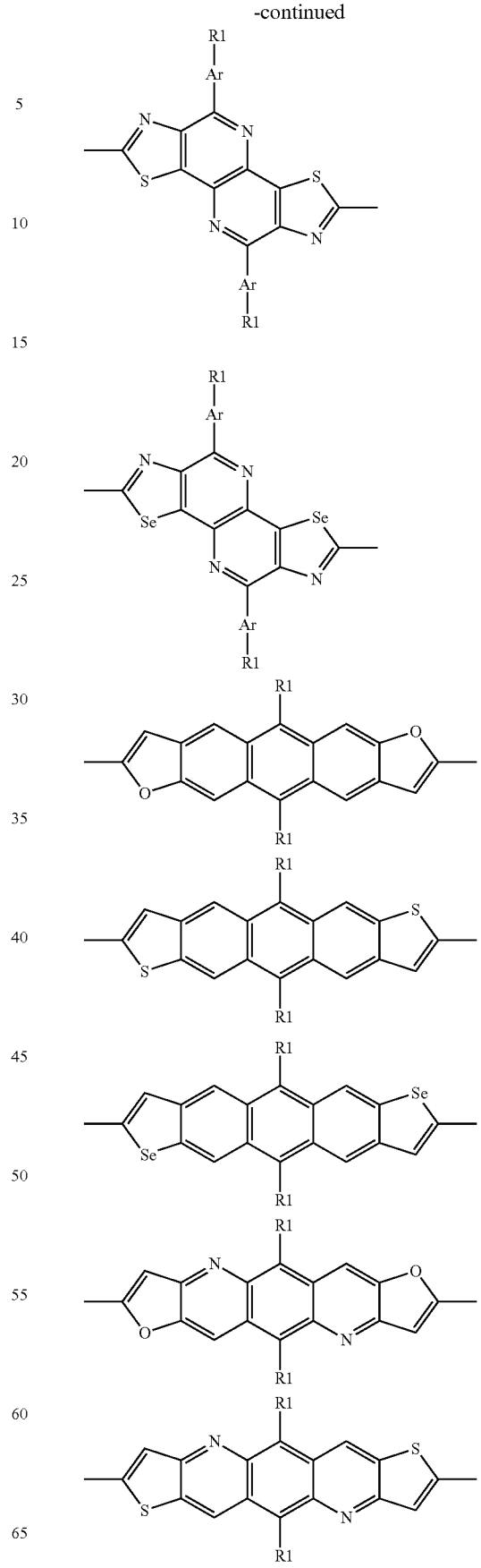

-continued
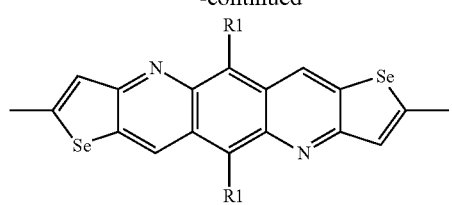
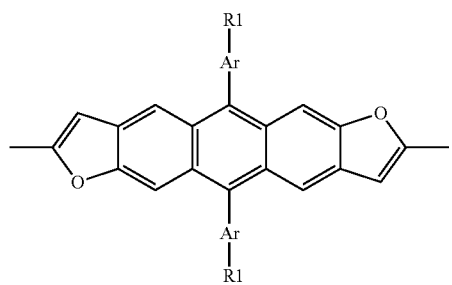
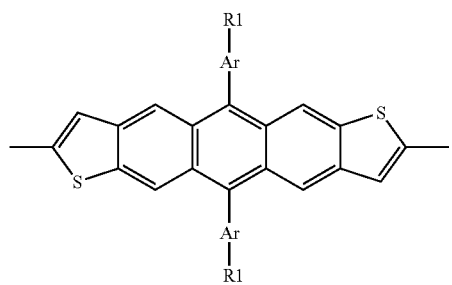
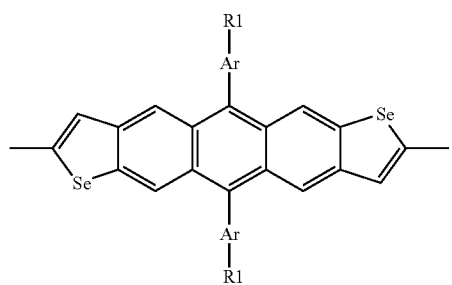
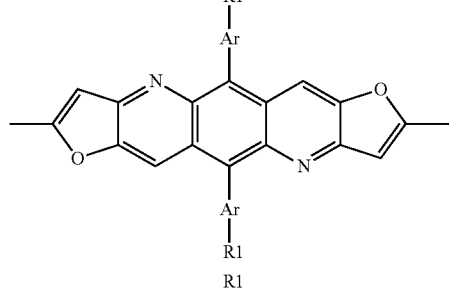
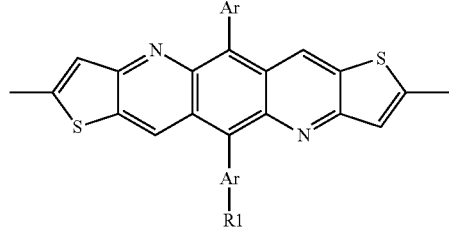
-continued
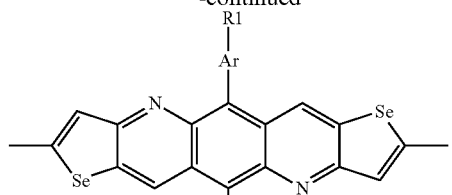
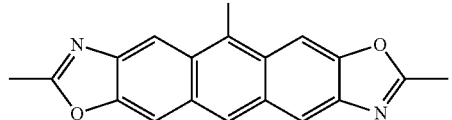
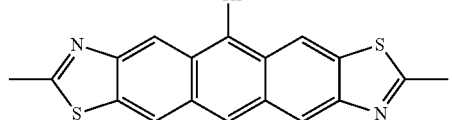
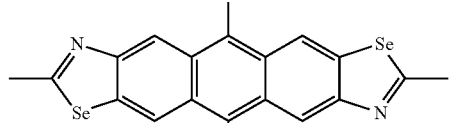
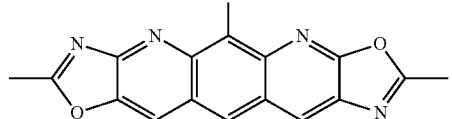
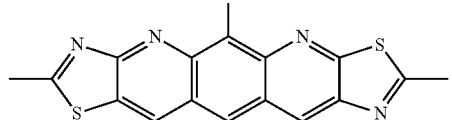
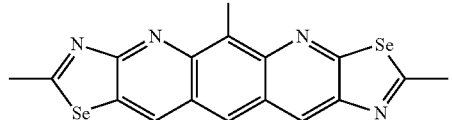
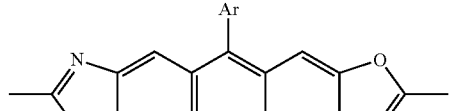

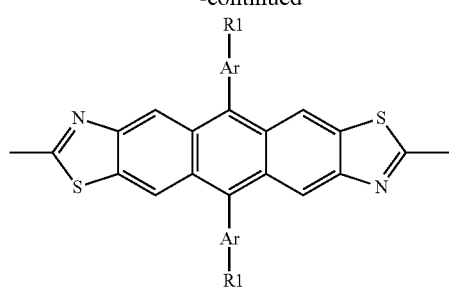
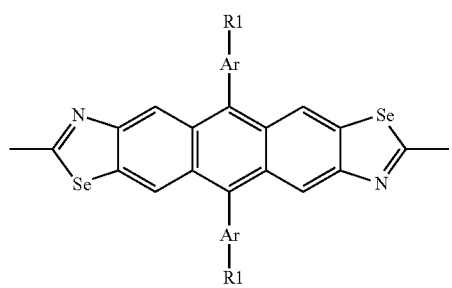
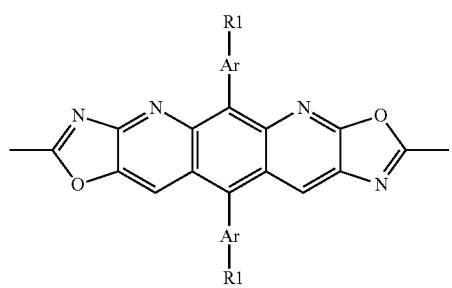
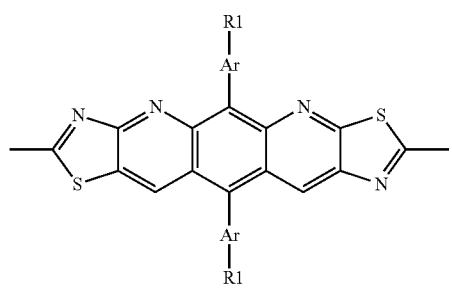
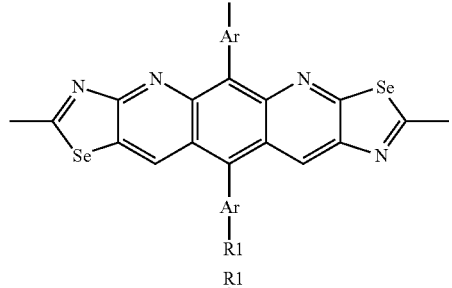
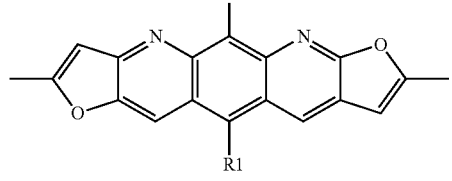
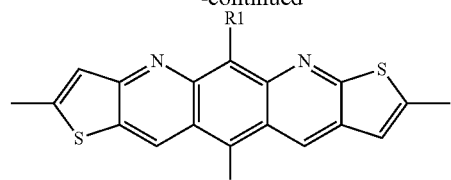
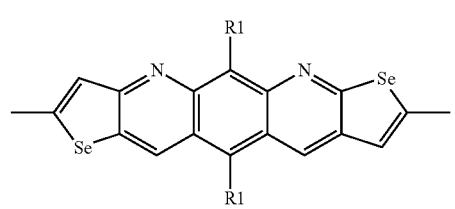
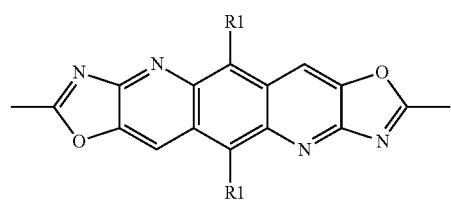
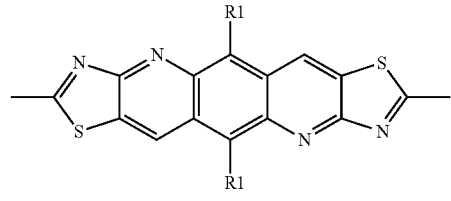
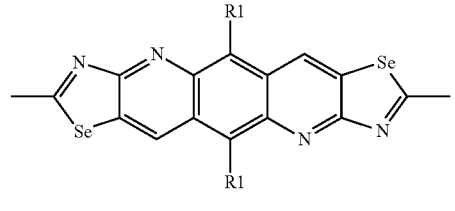
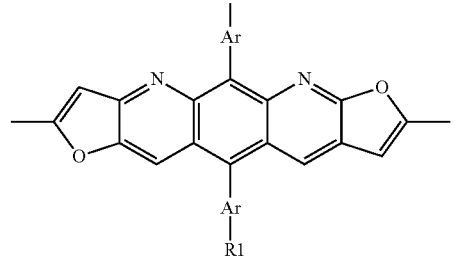
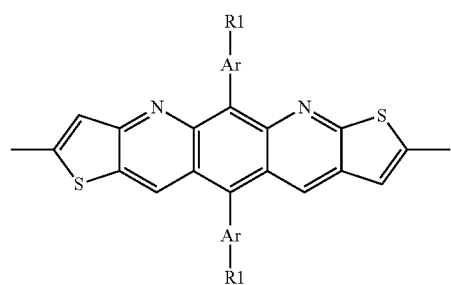

-continued

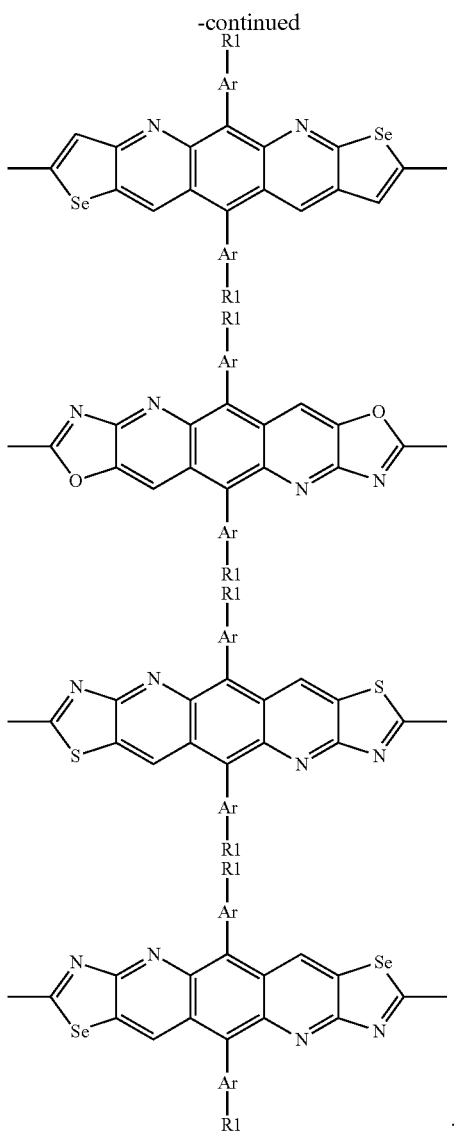

and

Wherein, R1 is selected from the following groups and their derivatives consisting of C1-C30 alkyl, C3-C30 branched alkyl, C1-C30 silyl, C2-C30 ester, C1-C30 alkoxy, C1-C30 alkylthio, C1-C30 haloalkyl, C2-C30 alkene, C2-C30 alkyne, C2-C30 cyano-containing carbon chain, C1-C30 nitro-containing carbon chain, C1-C30 hydroxy-containing carbon chain, C3-C30 keto-containing carbon chain, halogen, hydrogen atom, and cyano. Ar is selected from the following groups and their derivatives consisting of substituted and unsubstituted aromatic ring, substituted and unsubstituted heterocyclic ring, substituted and unsubstituted fused ring, substituted and unsubstituted fused heterocyclic ring, C1-C30 alkyl, C3-C30 branched alkyl, C1-C30 silyl, C2-C30 ester, C1-C30 alkoxy, C1-C30 alkylthio, C1-C30 haloalkyl, C2-C30 alkene, C2-C30 alkyne, C2-C30 cyano-containing carbon chain, C1-C30 nitro-containing carbon chain, C1-C30 hydroxy-containing carbon chain, C3-C30 keto-containing carbon chain, halogen-containing benzene ring, halogen-containing five-membered heterocyclic ring, and halogen-containing six-membered heterocyclic ring.

A1, A2, and A3 can further include substituted and unsubstituted heterocyclic ring, substituted and unsubstituted fused heterocyclic ring, and derivatives thereof, wherein the heteroatom of the heterocyclic ring and the fused heterocyclic ring includes at least one of selenium, sulfur, nitrogen, and oxygen, and the number of the ring is at least 2.

In practical application, A1, A2, and A3 are selected from the following structures and their derivatives:

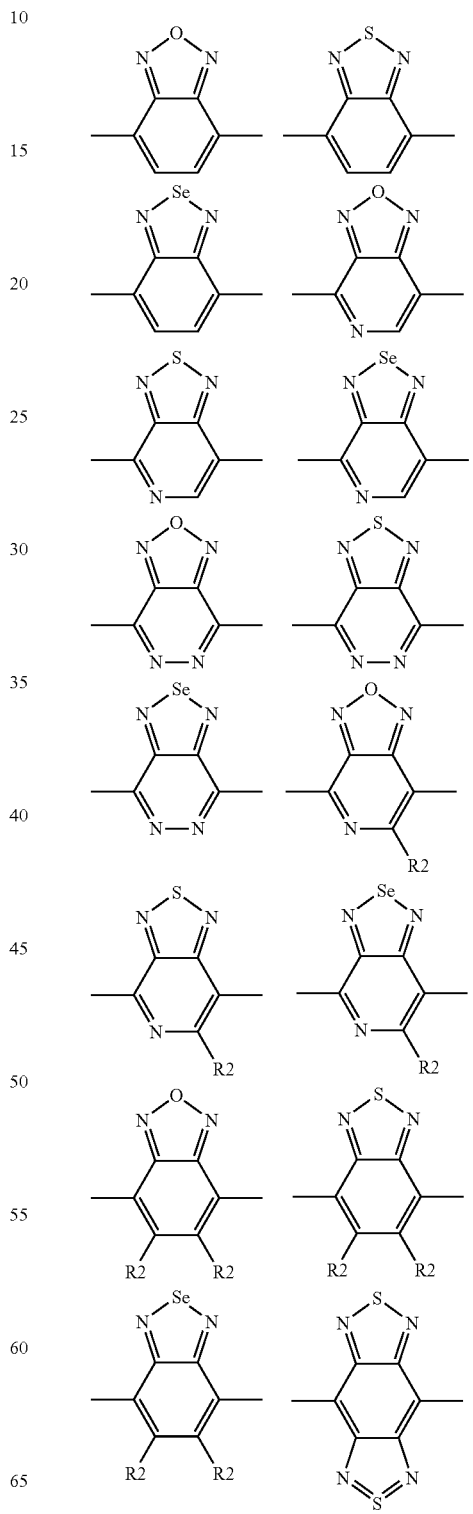

-continued
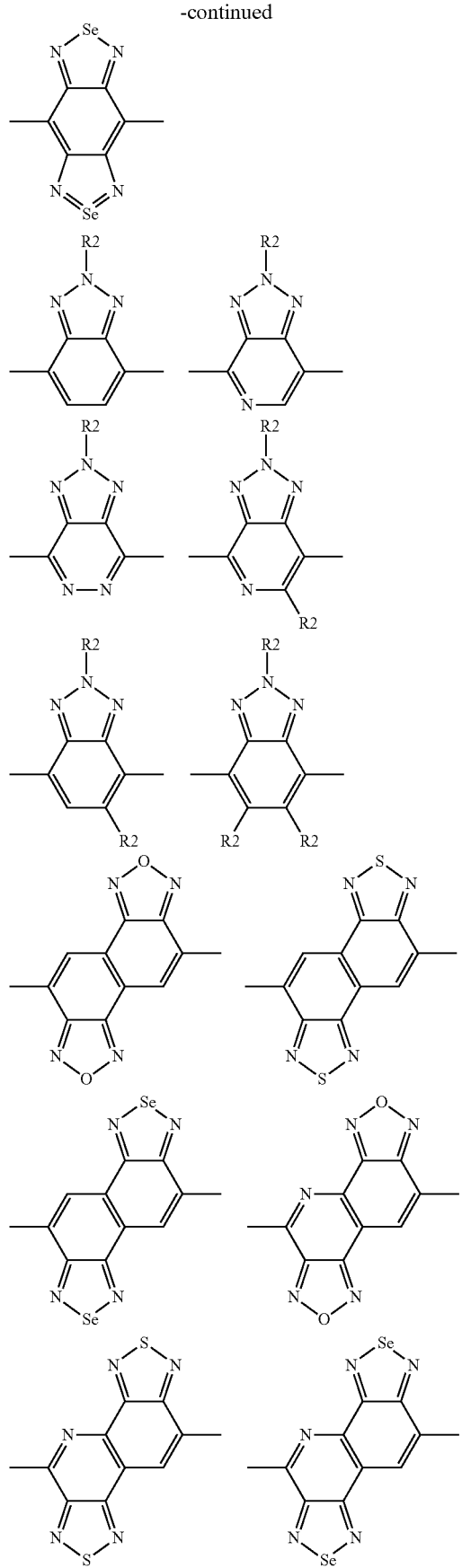
-continued
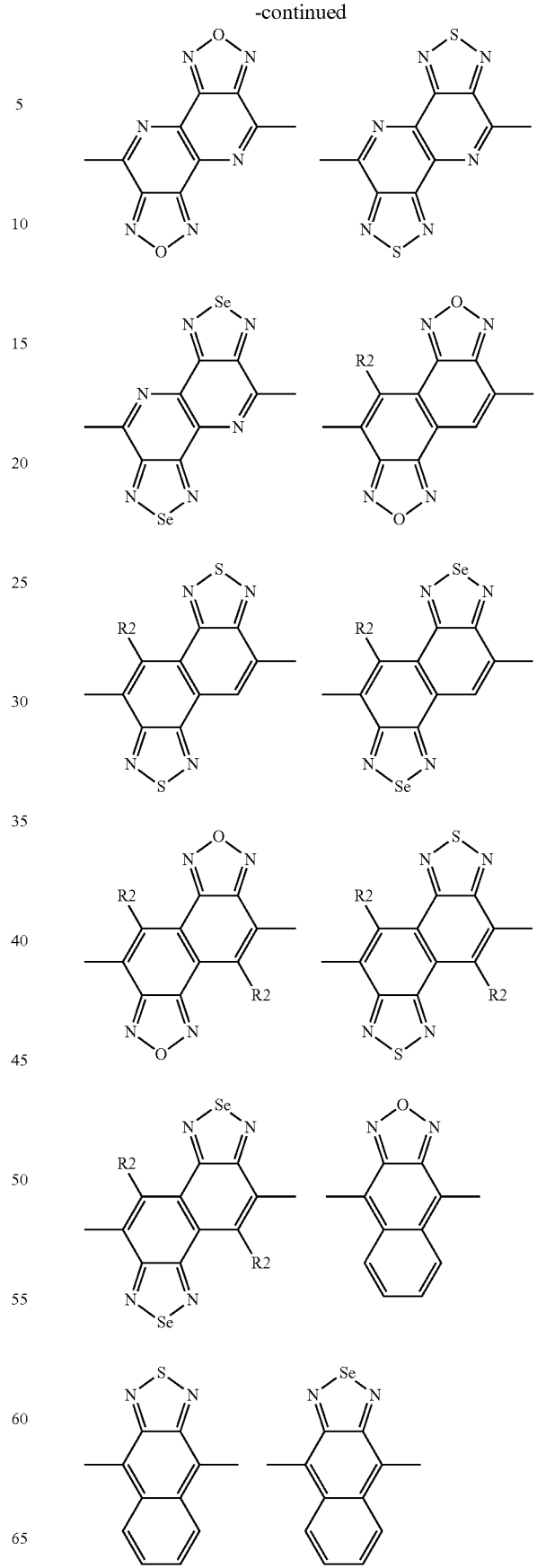

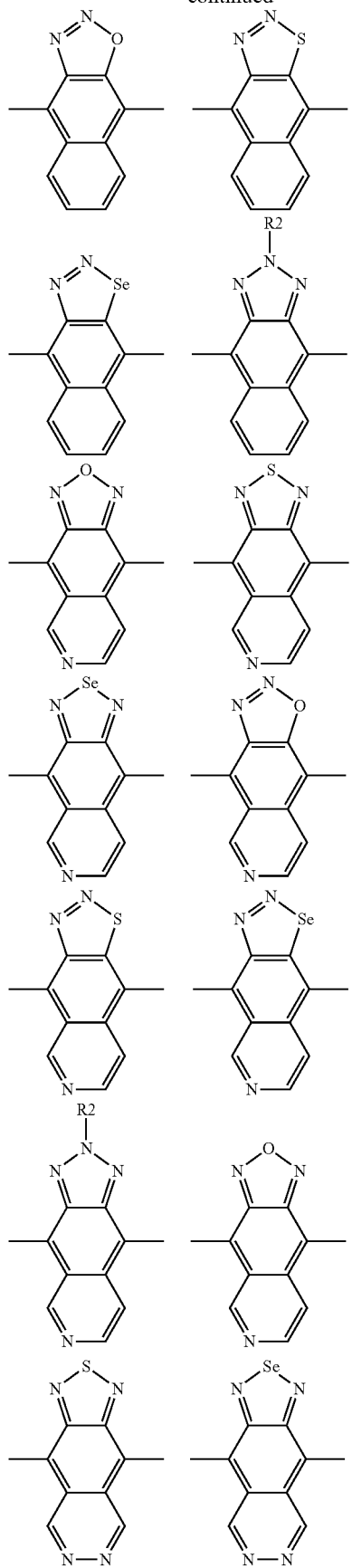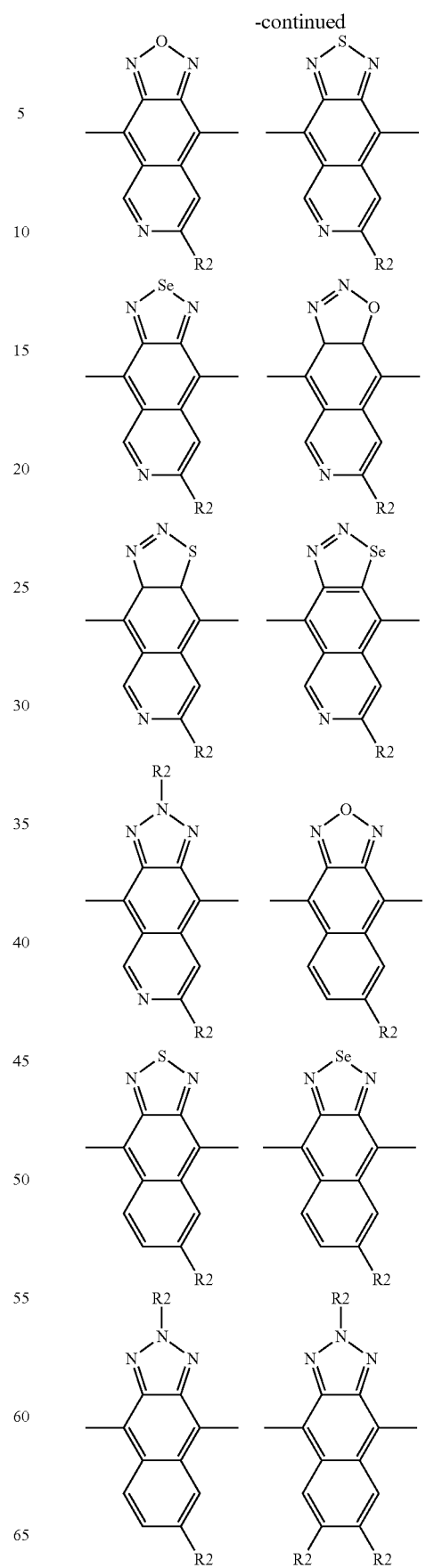

-continued
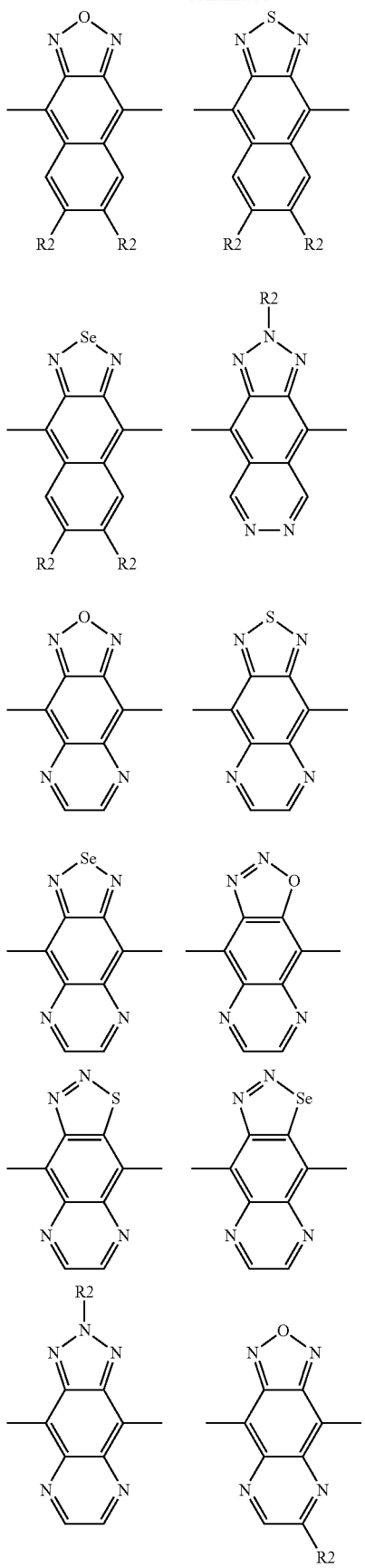
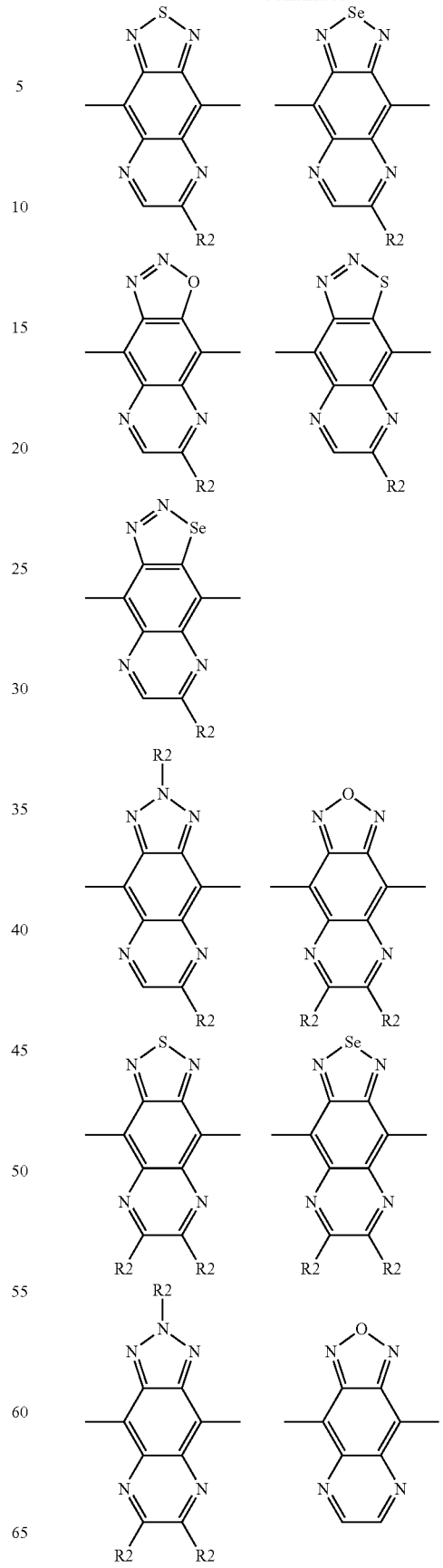

-continued
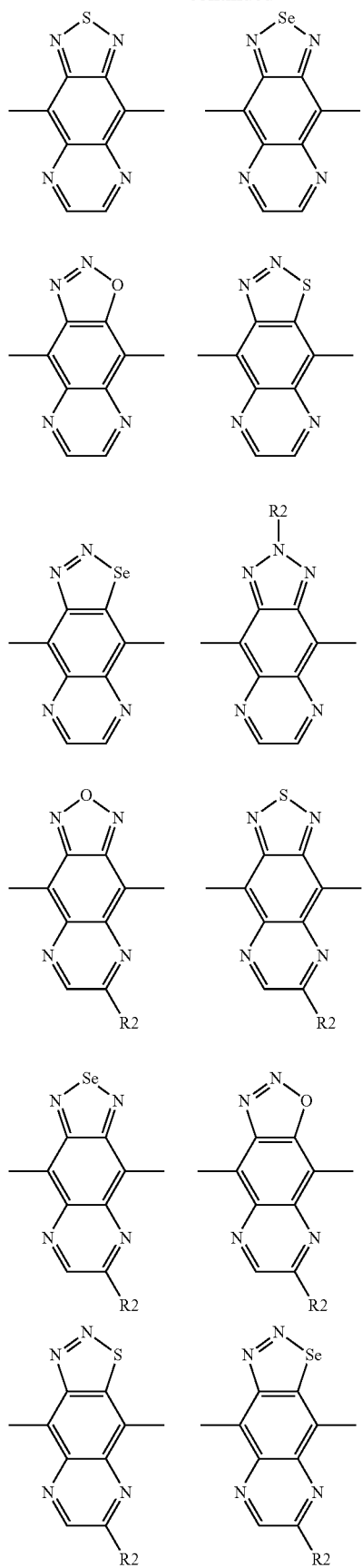
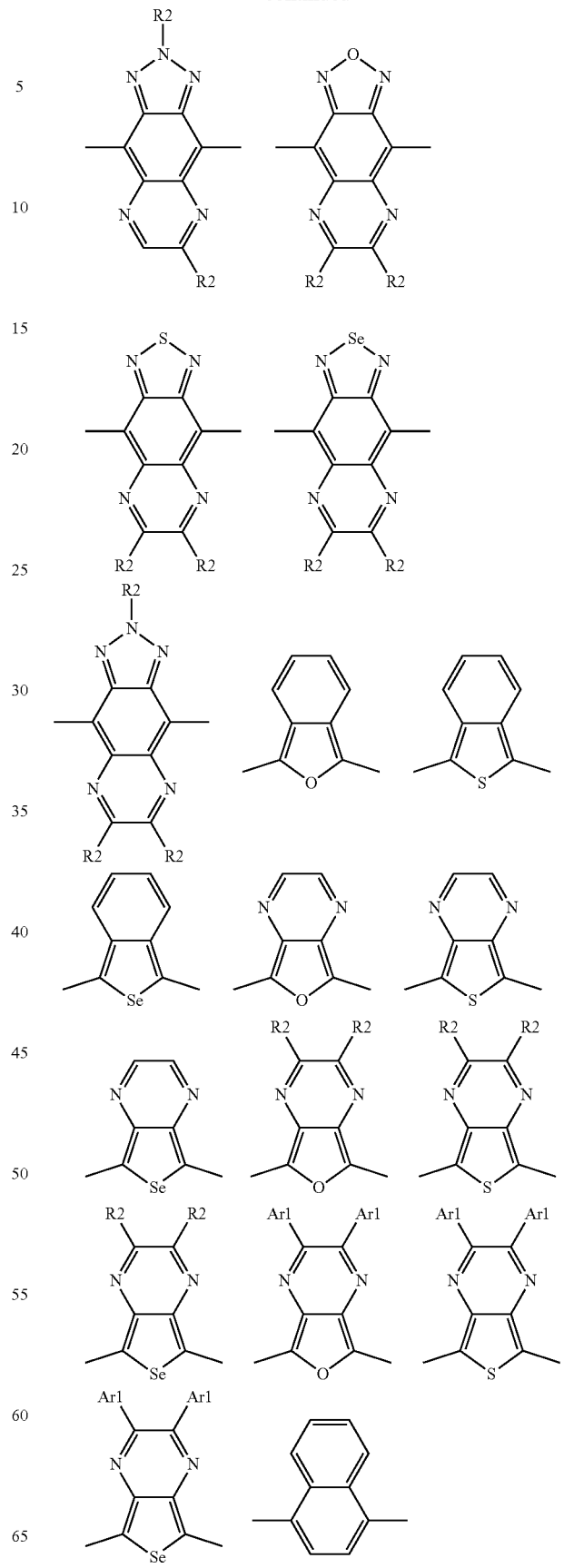

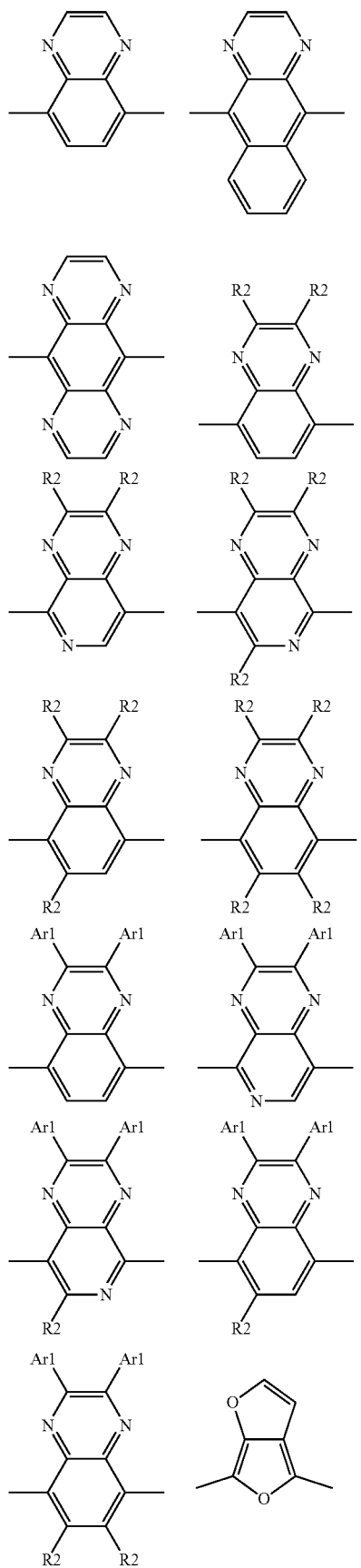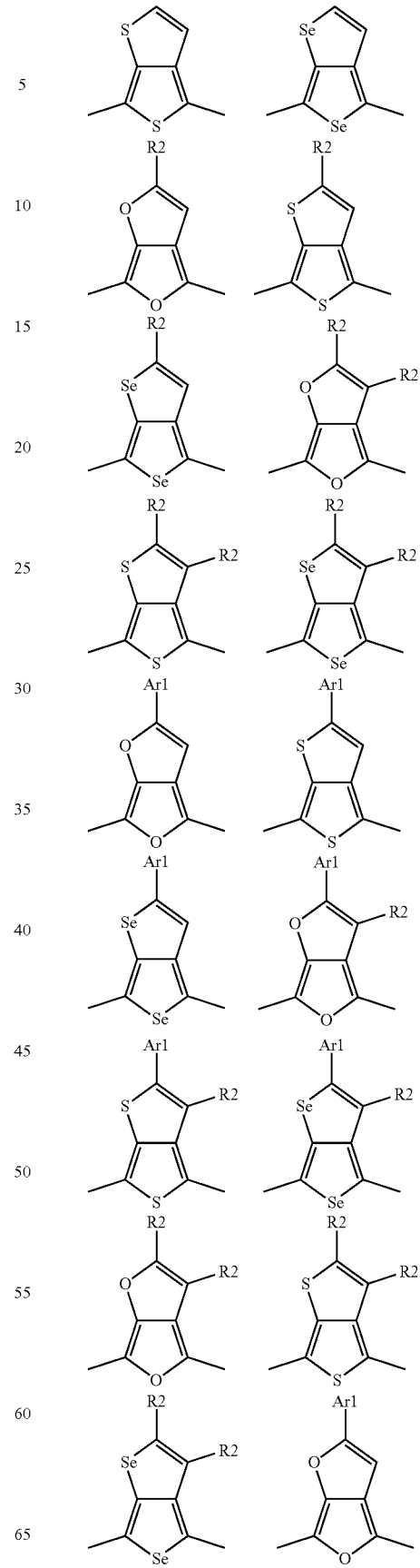

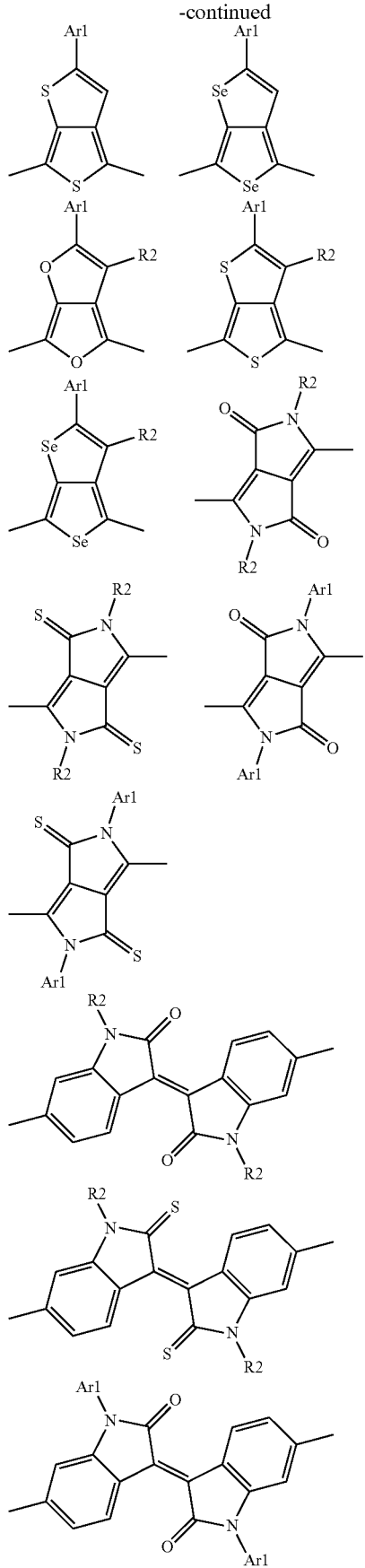
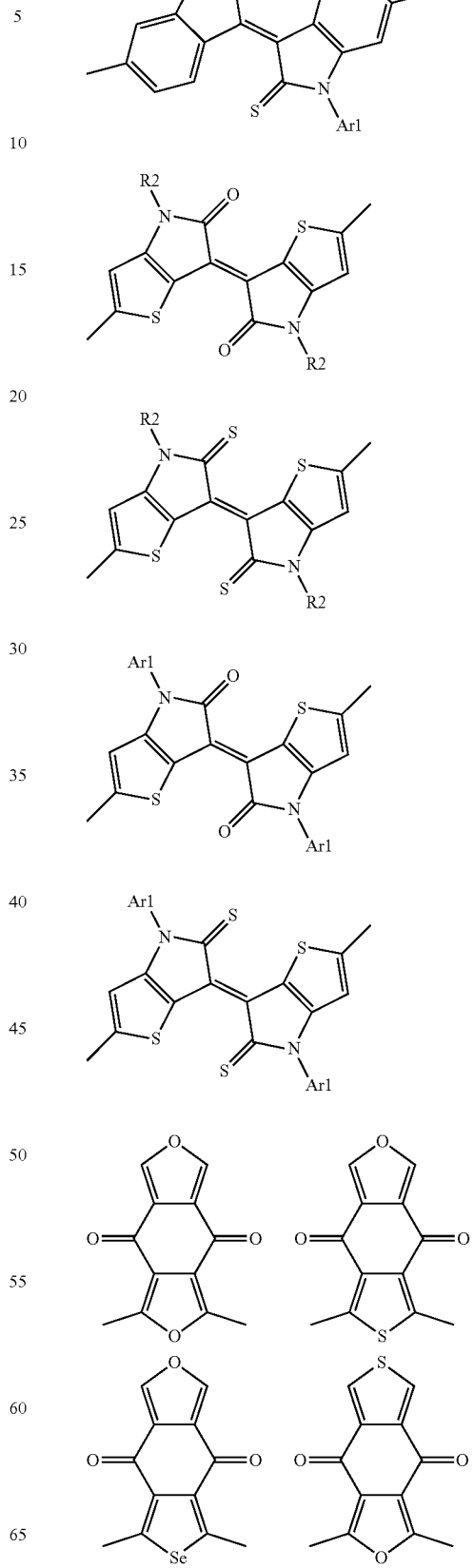

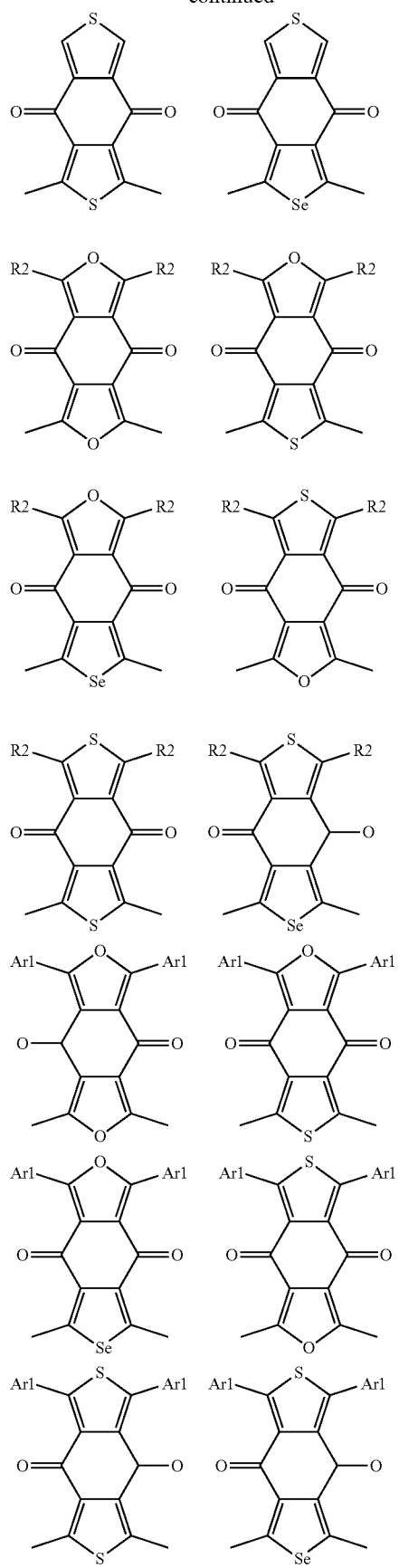
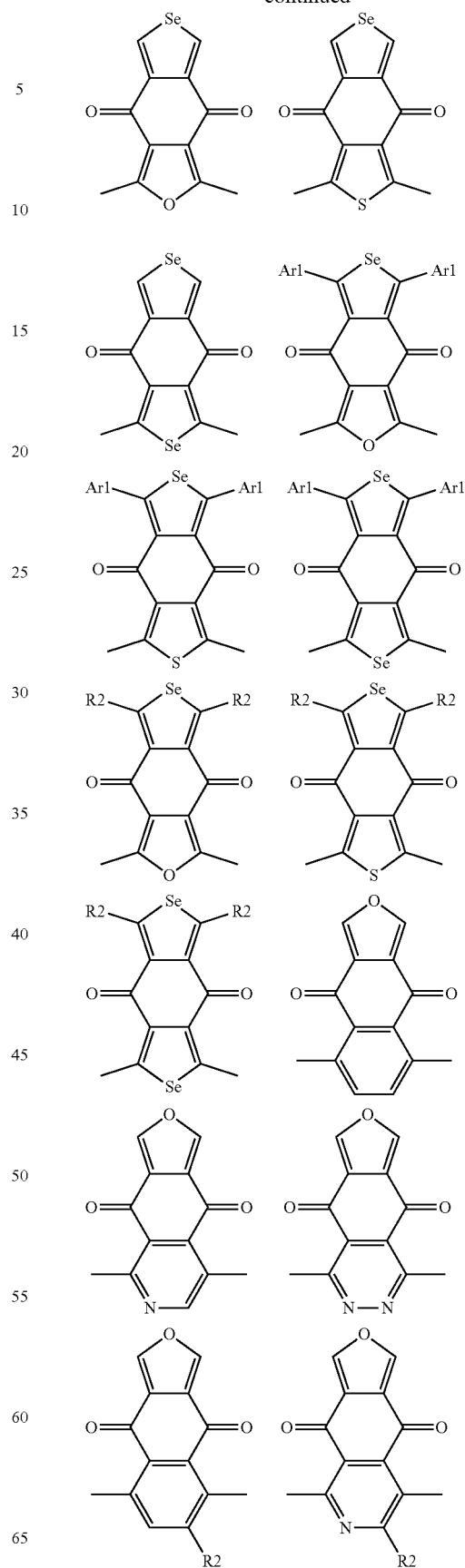

-continued
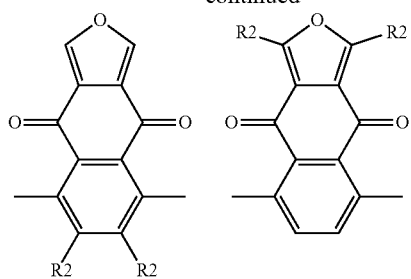 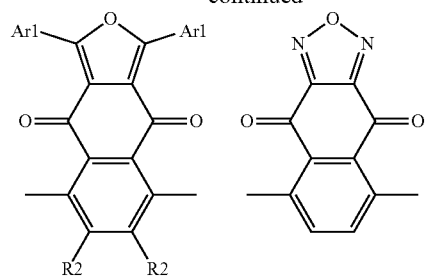
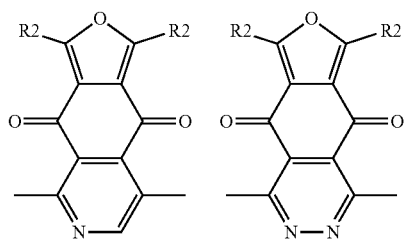 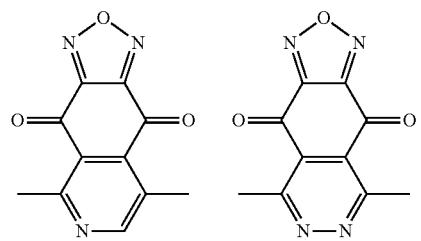
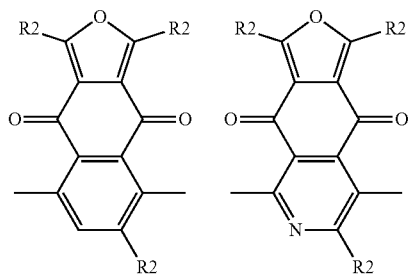 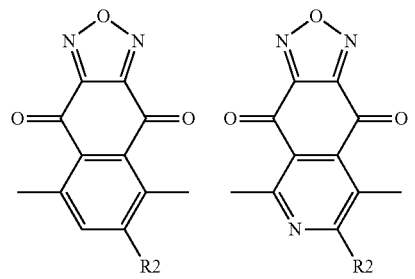
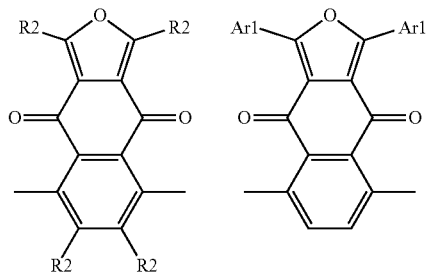 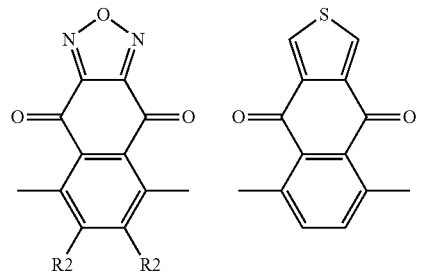
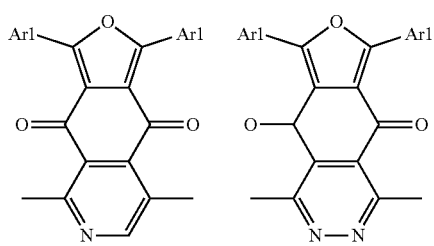 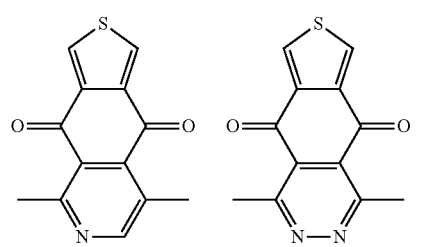
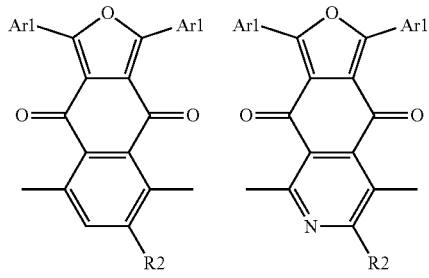 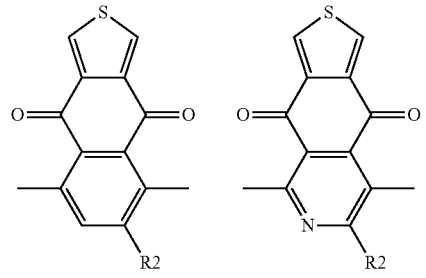

-continued
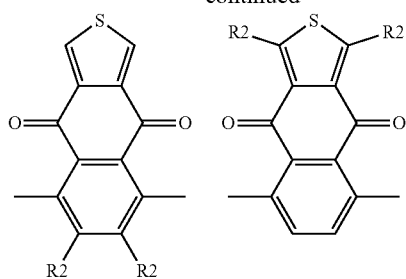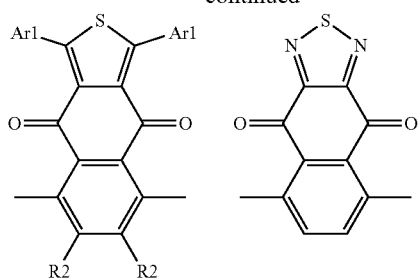
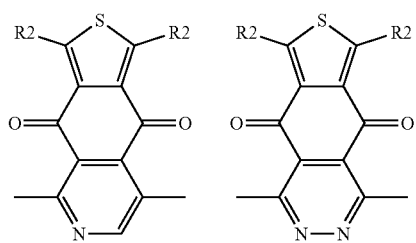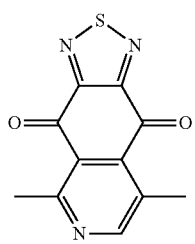
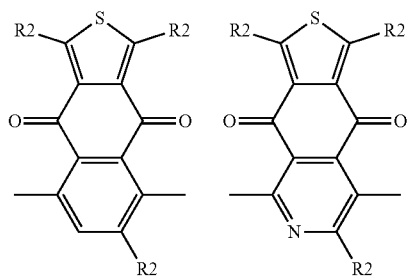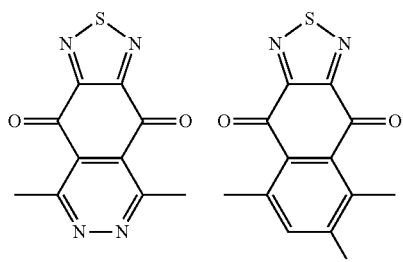
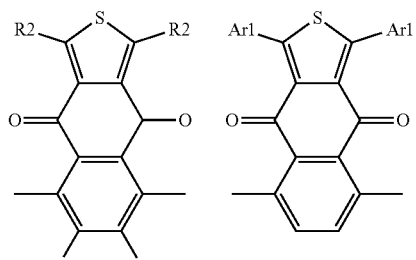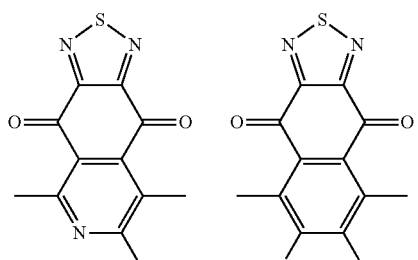
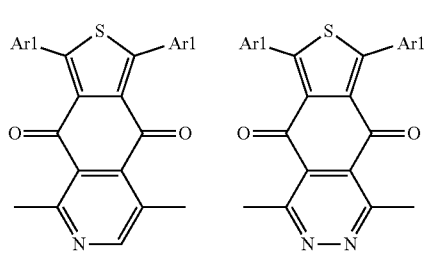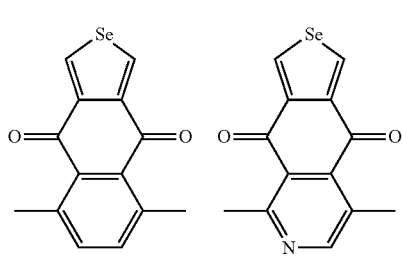
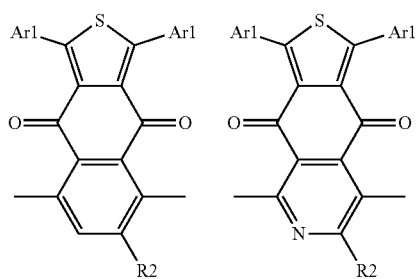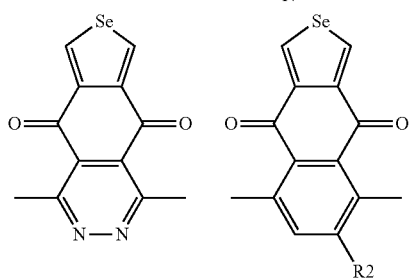

-continued
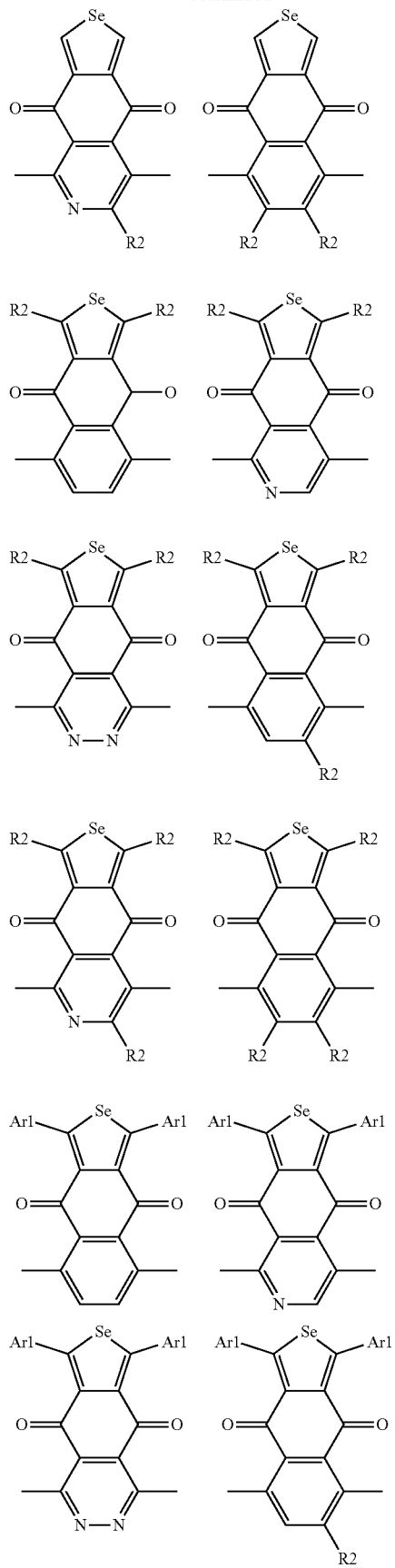
-continued
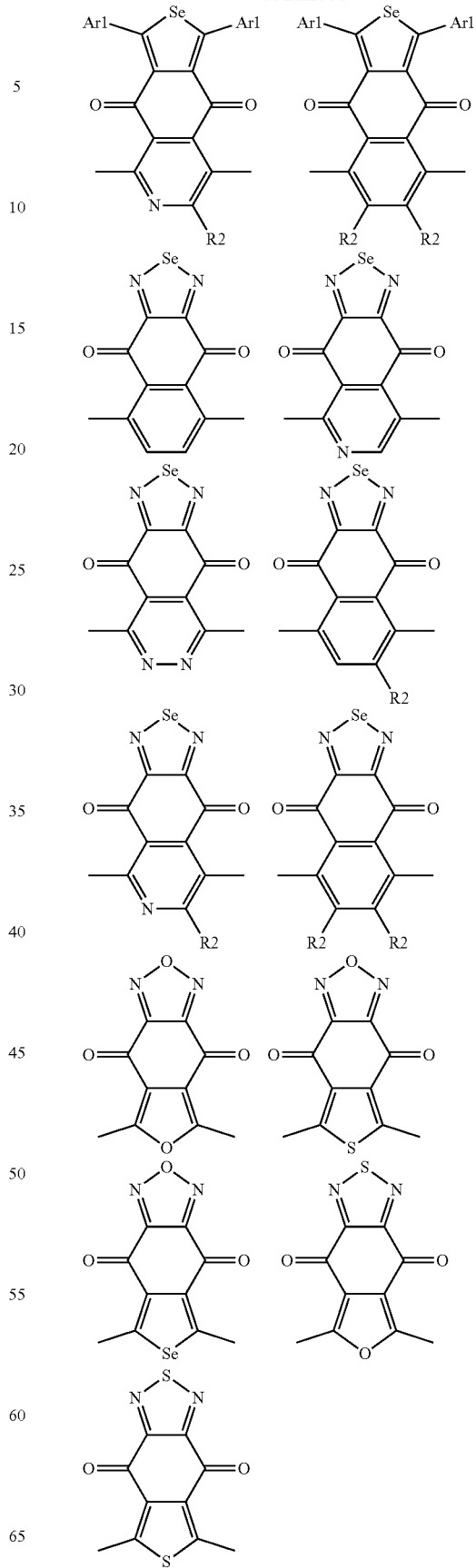

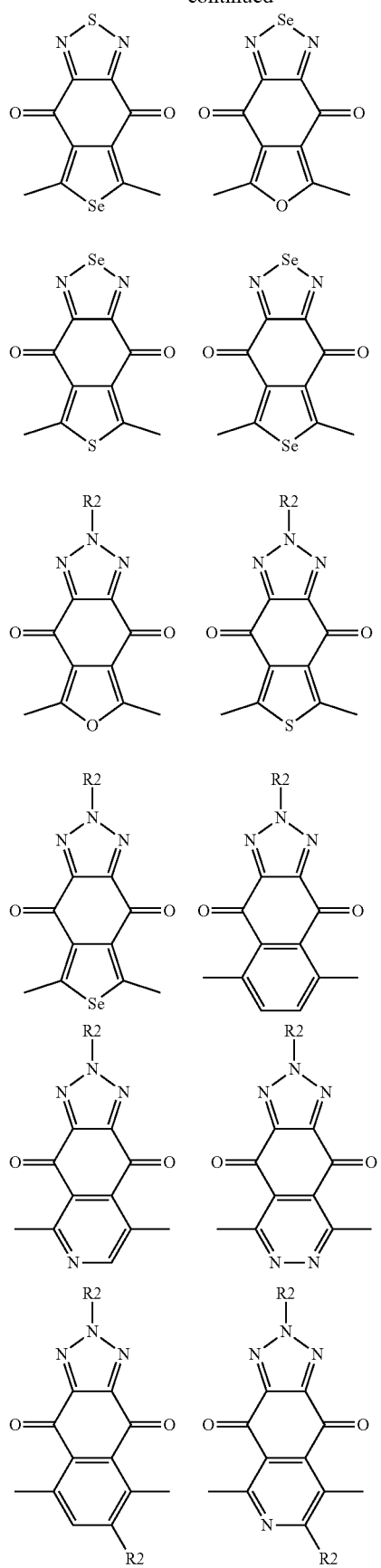
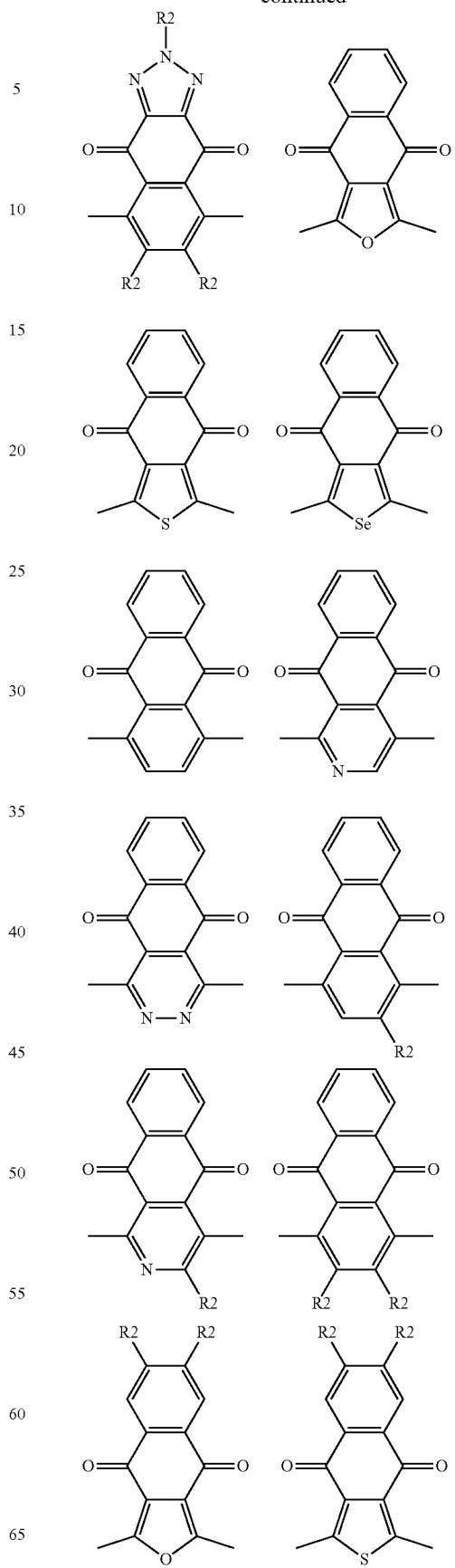

-continued

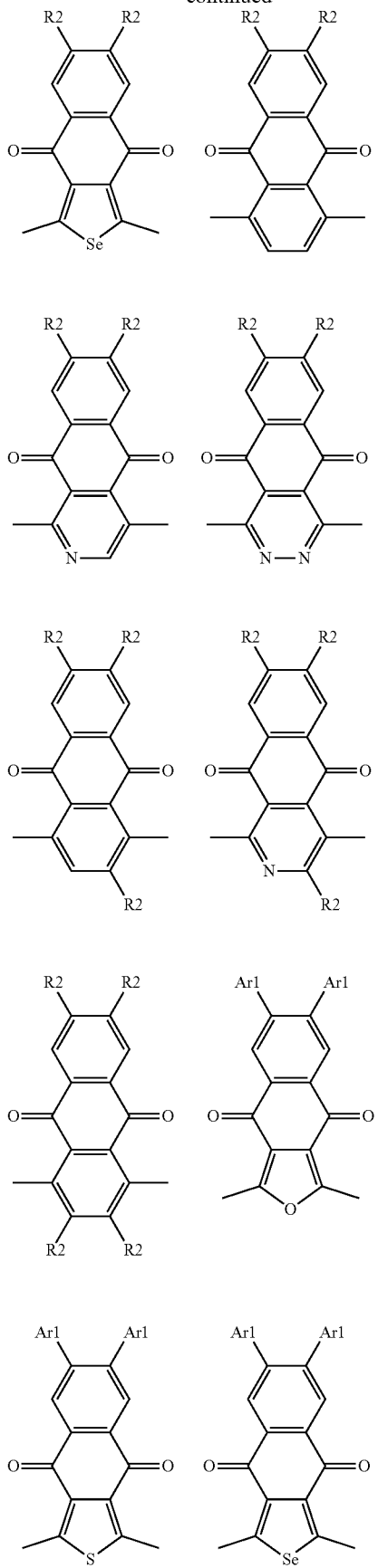
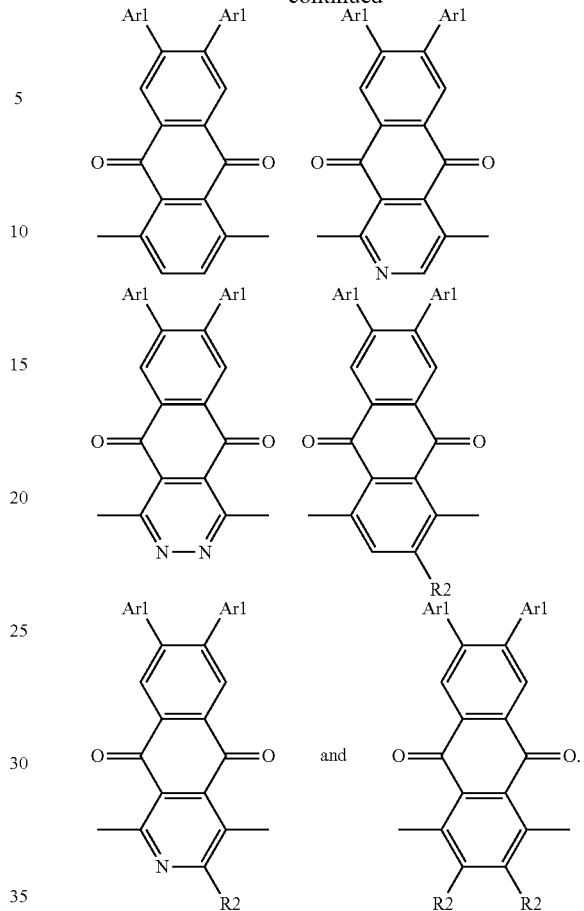

Wherein, R2 is selected from the following groups and their derivatives consisting of C1-C30 alkyl, C3-C30 branched alkyl, C1-C30 silyl, C2-C30 ester, C1-C30 alkoxy, C1-C30 alkylthio, C1-C30 haloalkyl, C2-C30 alkene, C2-C30 alkyne, C2-C30 cyano-containing carbon chain, C1-C30 nitro-containing carbon chain, C1-C30 hydroxy-containing carbon chain, C3-C30 keto-containing carbon chain, halogen, hydrogen atom, and cyano. Ar1 is selected from the following groups and their derivatives consisting of substituted and unsubstituted aromatic ring, substituted and unsubstituted heterocyclic ring, substituted and unsubstituted fused ring, substituted and unsubstituted fused heterocyclic ring, C1-C30 alkyl, C3-C30 branched alkyl, C1-C30 silyl, C2-C30 ester, C1-C30 alkoxy, C1-C30 alkylthio, C1-C30 haloalkyl, C2-C30 alkene, C2-C30 alkyne, C2-C30 cyano-containing carbon chain, C1-C30 nitro-containing carbon chain, C1-C30 hydroxy-containing carbon chain, C3-C30 keto-containing carbon chain, halogen-containing benzene ring, halogen-containing five-membered heterocyclic ring, and halogen-containing six-membered heterocyclic ring.

π1, π2, π3, π4, π5, and π6 can further include substituted and unsubstituted monocyclic aromatic ring, substituted and unsubstituted polycyclic aromatic ring, substituted and unsubstituted heterocyclic aromatic ring and derivatives thereof, wherein the heteroatom of the heterocyclic ring includes at least one of selenium, sulfur, nitrogen, and oxygen.

In practical application, π1, π2, π3, π4, π5, and π6 are independently selected from the following structures and their derivatives:

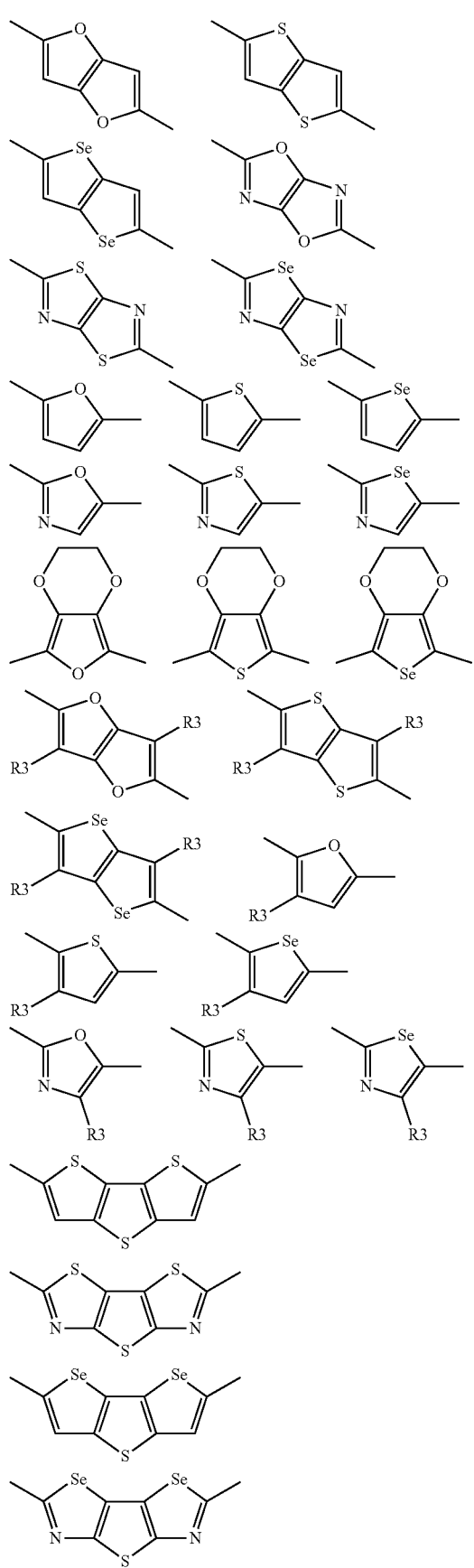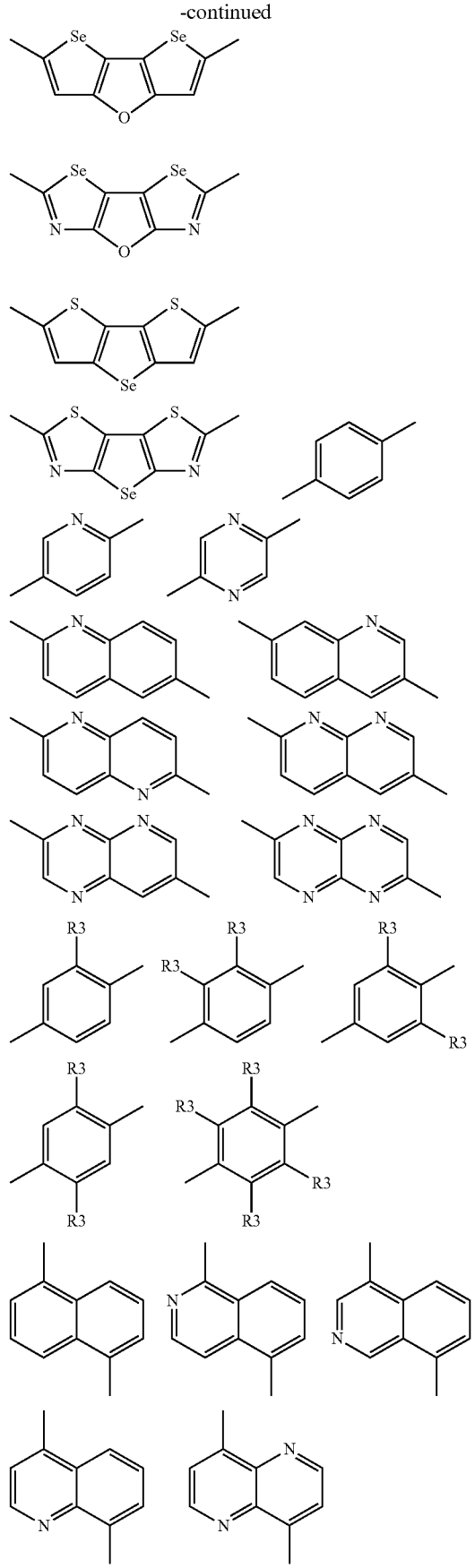

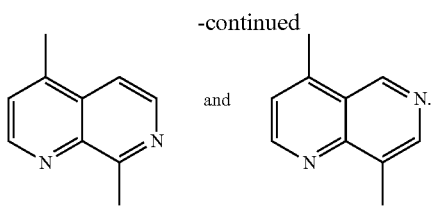

Wherein, R3 is selected from the following groups and their derivatives consisting of C1-C30 alkyl, C3-C30 branched alkyl, C1-C30 silyl, C2-C30 ester, C1-C30 alkoxy, C1-C30 alkylthio, C1-C30 haloalkyl, C2-C30 alkene, C2-C30 alkyne, C2-C30 cyano-containing carbon chain, C1-C30 nitro-containing carbon chain, C1-C30 hydroxy-containing carbon chain, C3-C30 keto-containing carbon chain, halogen, hydrogen atom, and cyano.

Since the main chain of the random conjugated polymer material of the present invention includes different electron donor groups and electron acceptors, wherein m, n, o, and p are parts of the structure of the formula II and the formula III, respectively. By adjusting the ratio between m, n, o, and p, the absorption range, molecular energy level, solubility, and carrier mobility can be changed to improve power conversion efficiency. Since the molecular formula is an integer multiple of the simplest formula, m, n, o, and p are independently selected from 0 to 1000, wherein m is not equal to 0. In practical application, m, n, o, and p are further selected from 2 to 200.

Please refer to FIG. 1. FIG. 1 shows a schematic structural diagram of one embodiment of an organic photovoltaic device 1 of the present invention. As shown in FIG. 1, in another embodiment, the present invention further provides an organic photovoltaic device 1, which comprises a first electrode 11, a second electrode 15, and an active layer 13. The active layer 13, which includes the aforementioned conjugated polymer material, is disposed between the first electrode 11 and the second electrode 15. In practice, the organic photovoltaic device 1 may have a laminated structure, which sequentially includes a substrate 10, the first electrode 11 (transparent electrode), a first carrier transfer layer 12, the active layer 13, a second carrier transfer layer 14, and the second electrode 15. In addition, the organic photovoltaic device 1 may include an organic photovoltaic device, an organic light sensing device, an organic light-emitting diode, and an organic thin-film transistor (OTFT).

In practical application, the active layer 13 of the organic photovoltaic device 1 of the present invention includes the conjugated polymer material including the structure of formula I.

Next, a further explanation will be given on the structure of formula I. The conjugated polymer material includes the structure of benzo[d][1,2,3]thiadiazole (IBT). Comparing with the prior art structure of benzo[c][1,2,5]thiadiazole (BT), the structure of benzo[d][1,2,3]thiadiazole (IBT) has the following advantages: 1. The structure of benzo[d][1,2,3]thiadiazole (IBT) is an asymmetrical and planar structure, which can effectively inhibit the problem of the easy crystallization of molecules; 2. The asymmetric design of the structure of benzo[d][1,2,3]thiadiazole (IBT) makes the conjugated polymer material of the present invention have a lower energy level position of the highest occupied molecular orbital (HOMO) to effectively increase the open-circuit voltage output of the organic photovoltaic device containing the conjugated polymer material of the present invention; 3. The structure of benzo[d][1,2,3]thiadiazole (IBT) has a large material energy gap, so that it can have better absorption complementarity when matched with N-type materials, and contribute to the photocurrent output of the organic photovoltaic device.

In addition, the structure of benzo[d][1,2,3]thiadiazole (IBT) in the conjugated polymer structure of the present invention further connects two selenophenes, thereby having the following advantages: 1. The atomic radius of the selenium atom of the selenophene is larger than the atomic radius of the sulfur atom, which is prone to intermolecular forces (including the force between selenium atom and selenium atom), and this intermolecular force can enhance carrier mobility; 2. Since selenophene has a better electron pushing ability than thiophene, it has the function of adjusting the energy gap and energy level position of the material.

In specific embodiments, the conjugated polymer material can include the following structures:

P1

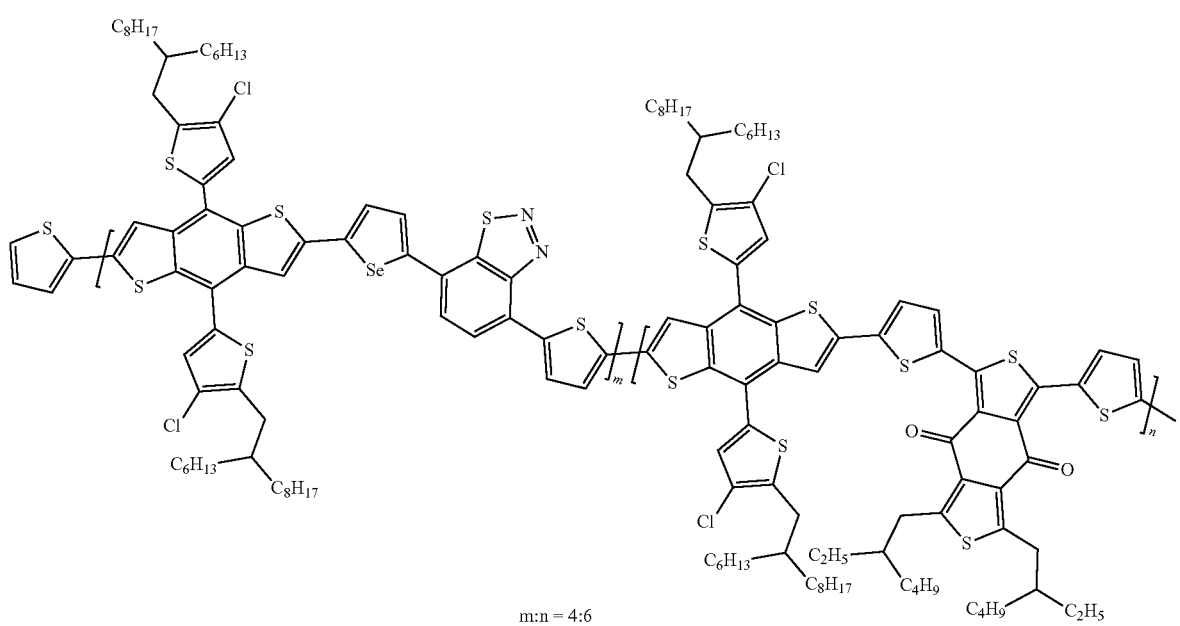

m:n = 4:6

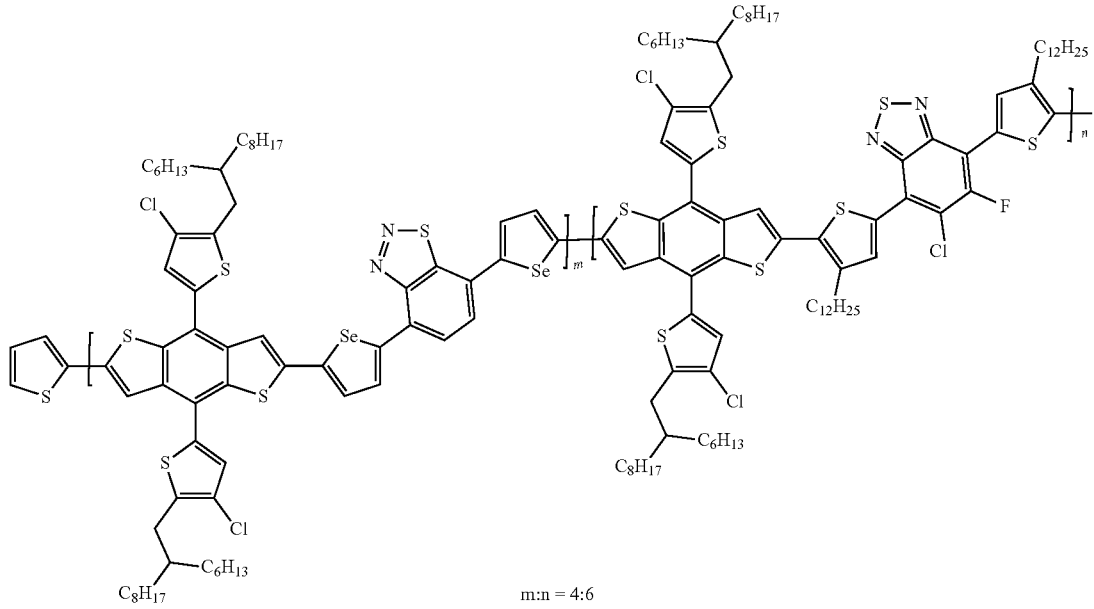
m:n = 4:6
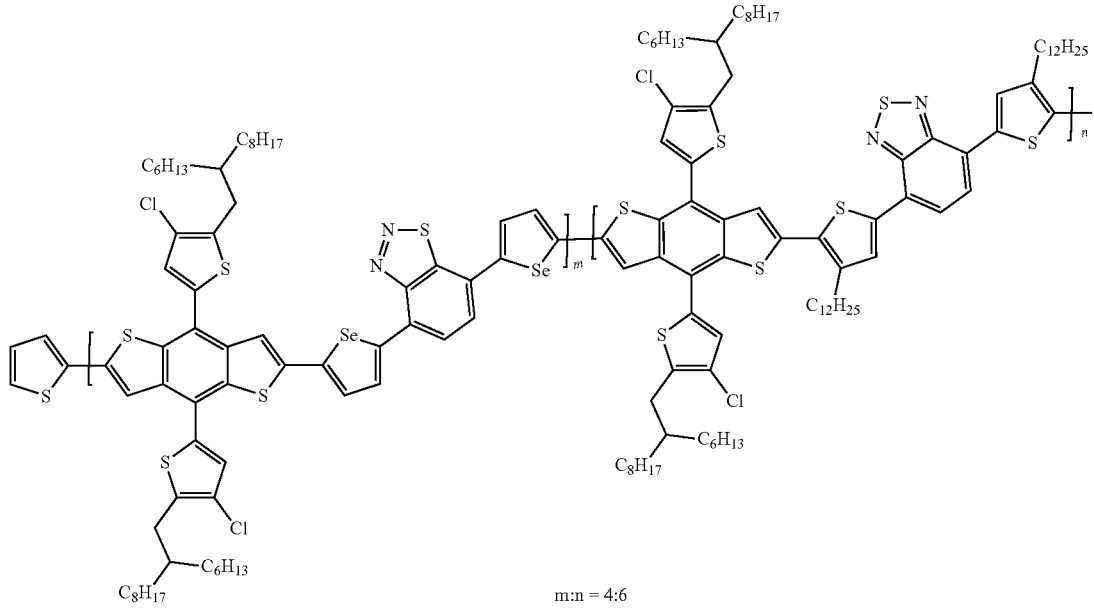
m:n = 4:6

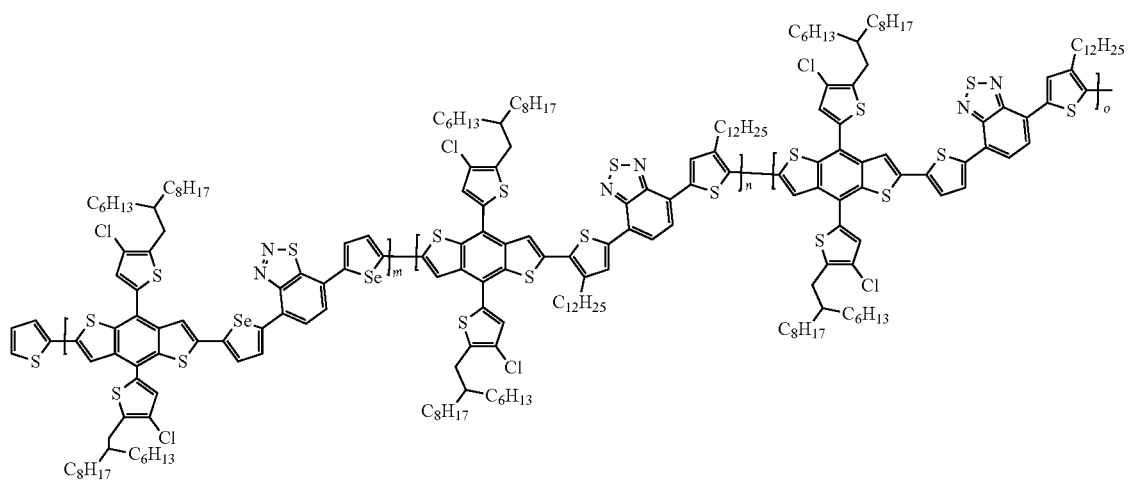
P4
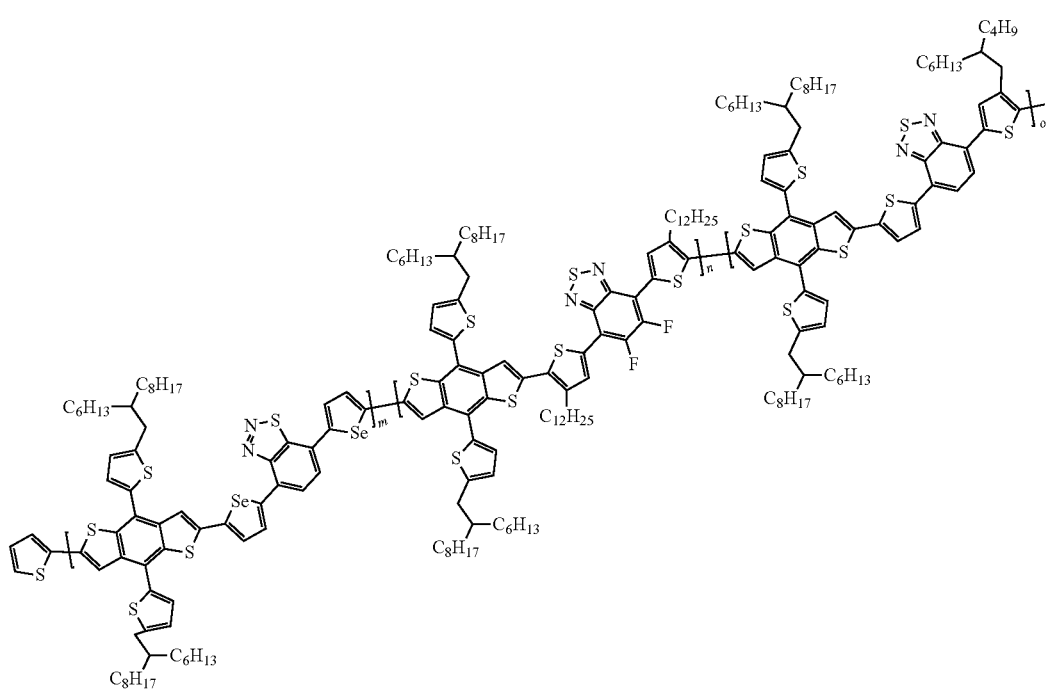
P5

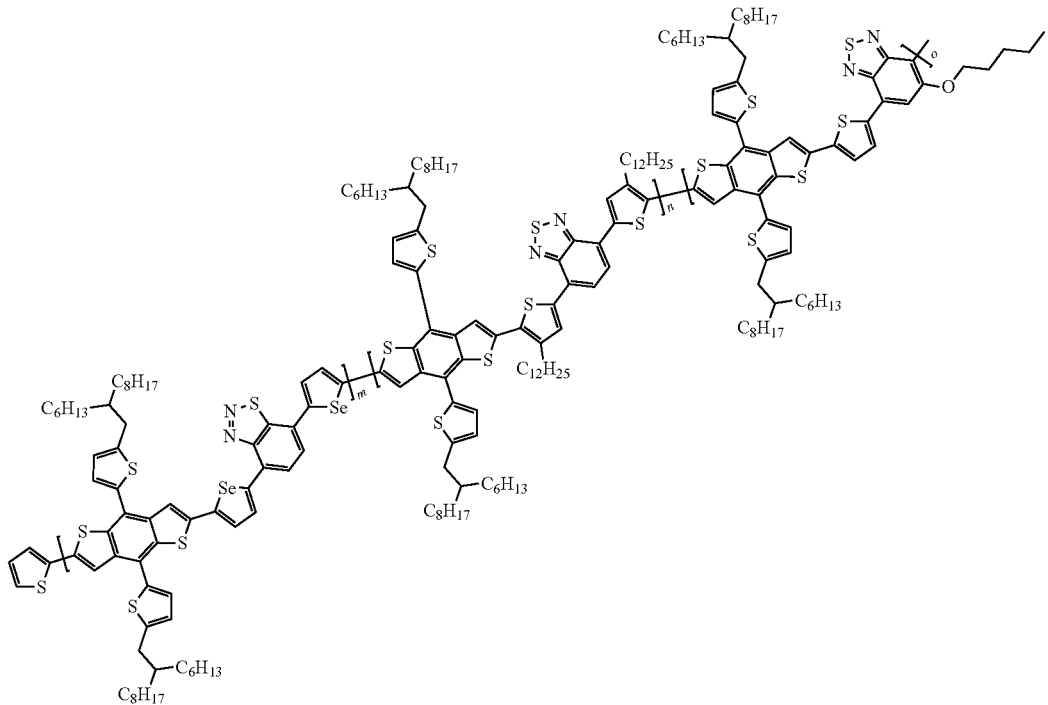
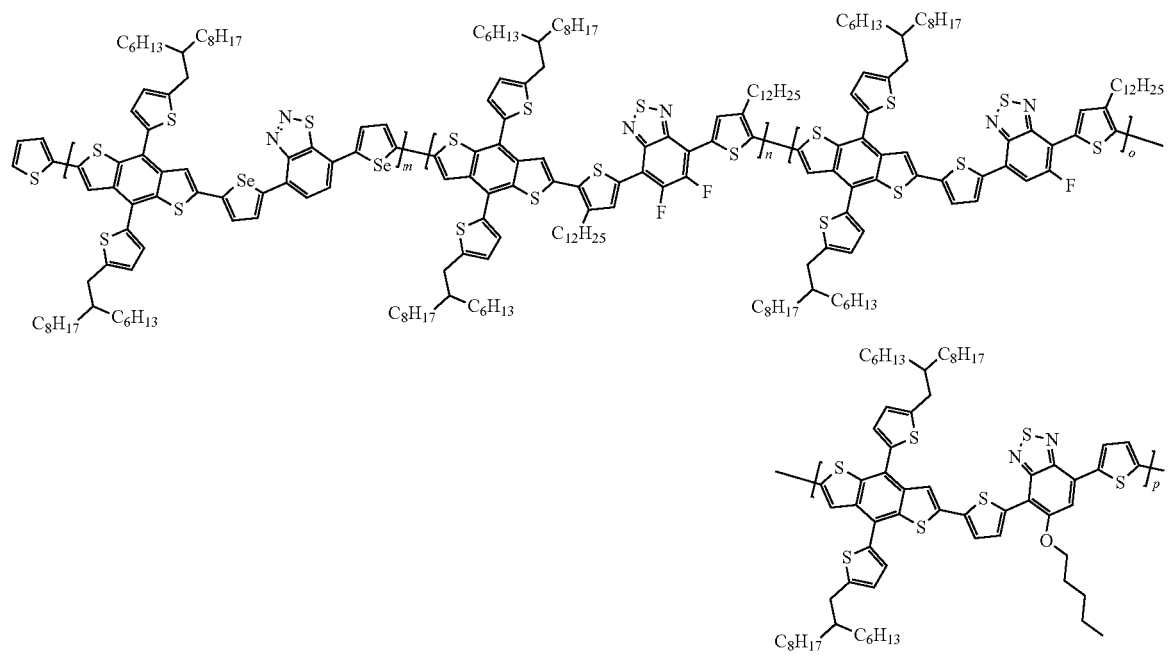

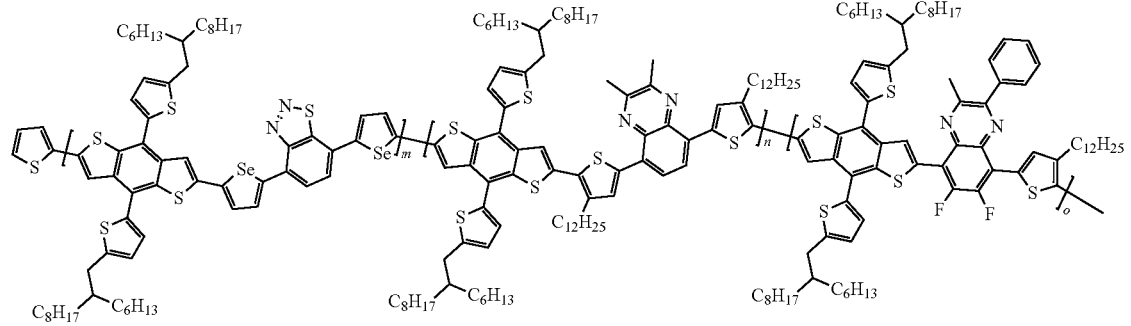
P8
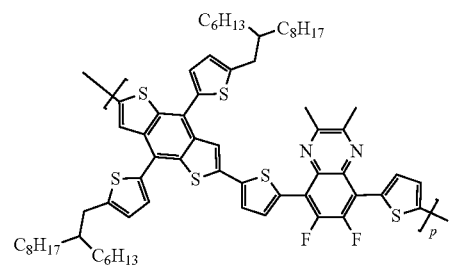
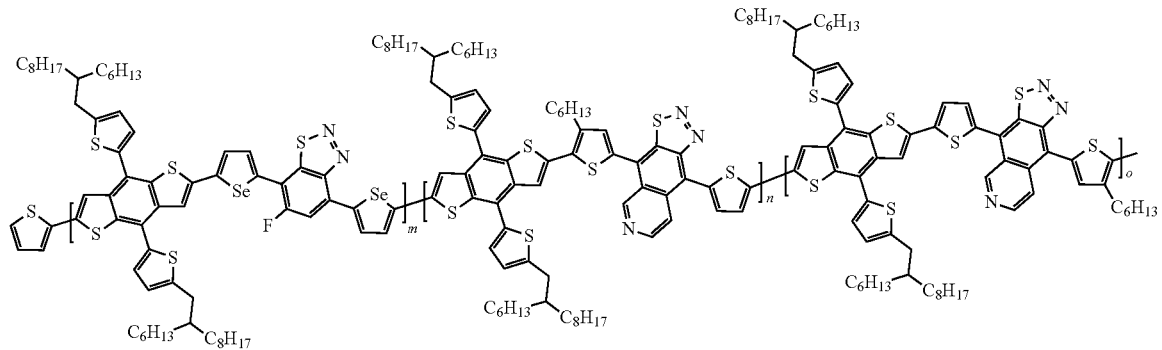
9
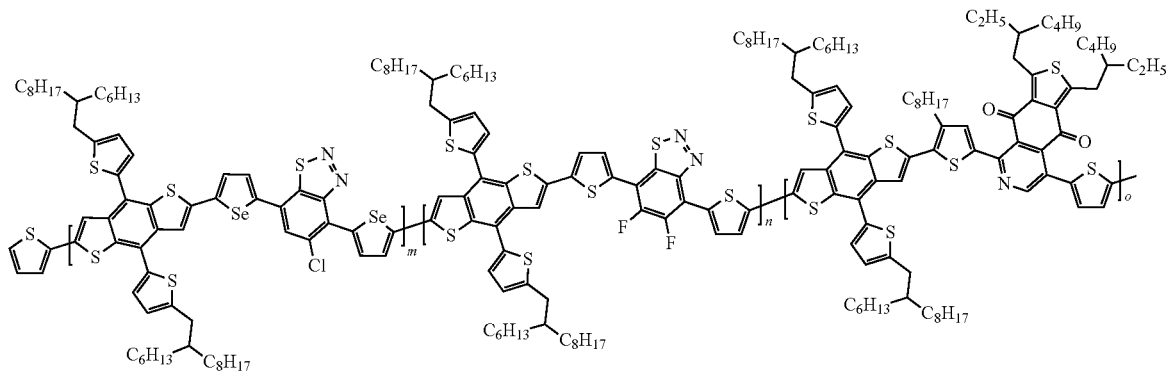
10

-continued

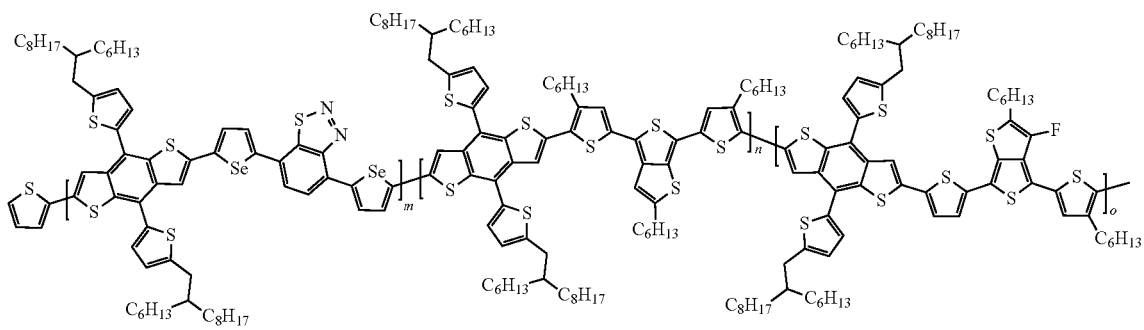

P12

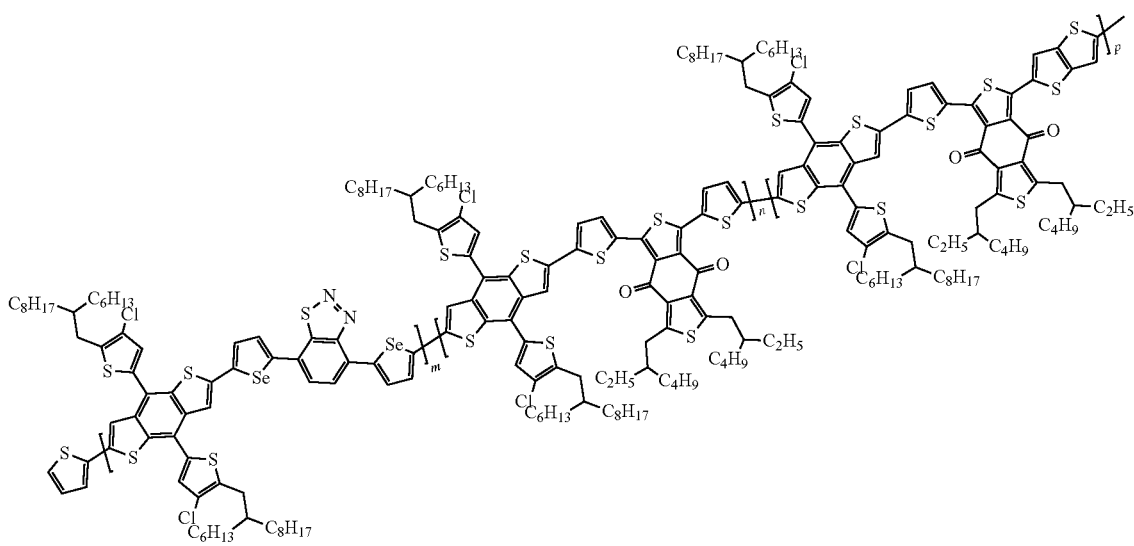

In order to explain the conjugated polymer material of the present invention more clearly, three specific embodiments P1, P2, and P3 will be configured to use the conjugated polymer material of the present invention as the P-type material of the active layer, and further prepare into the organic photovoltaic devices for experimentations.

Preparation of the Active Layer:

Synthesis of P1

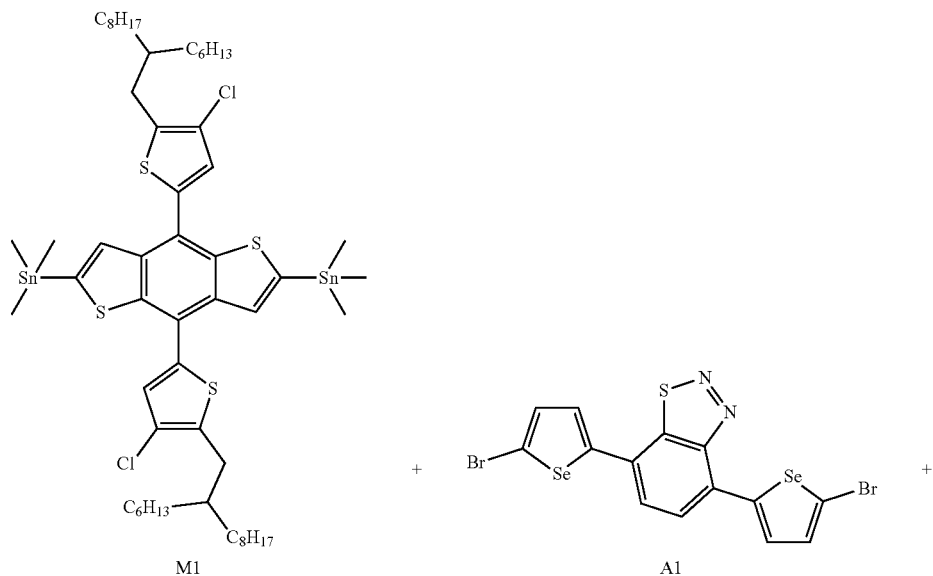

M1      +      A1      +

-continued

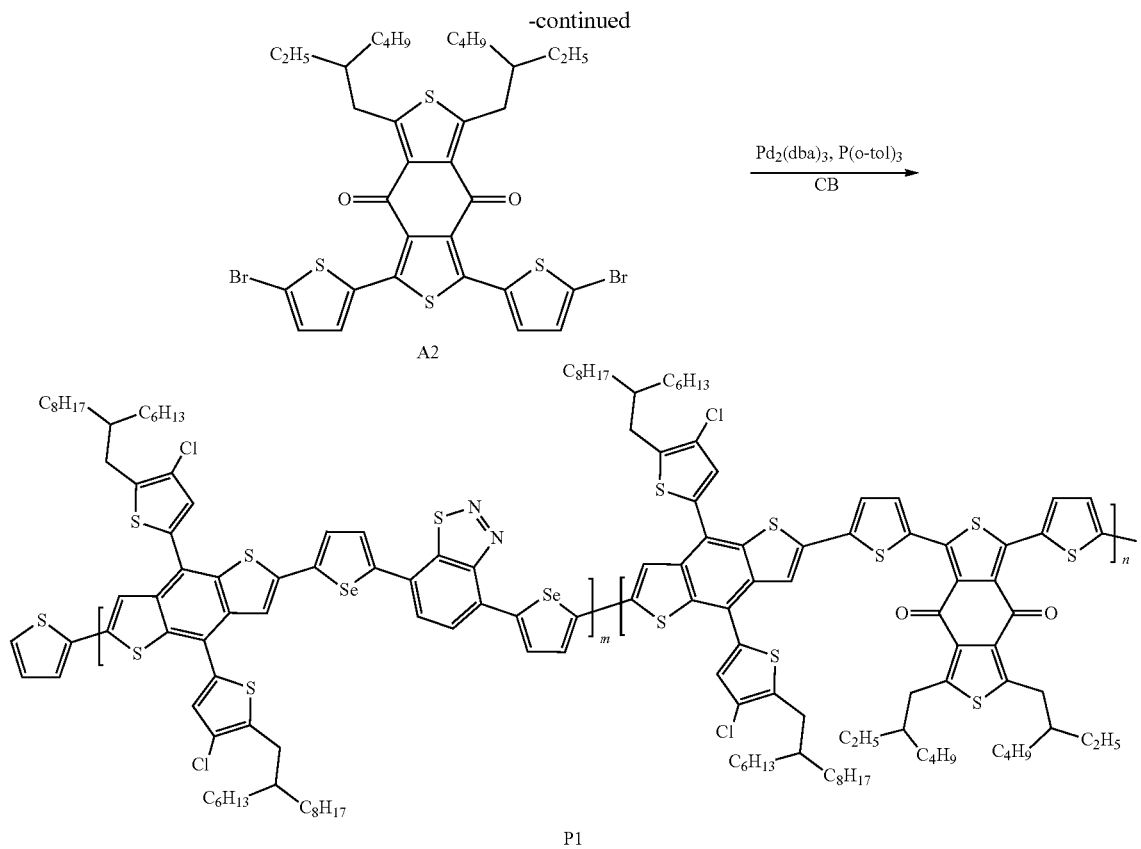

A2

P1

The three monomers of M1 (0.364 g, 0.304 mmol), A1 (0.067 g, 0.121 mmol), A2 (0.140 g, 0.182 mmol) are dissolved into 36 mL chlorobenzene in a two-neck round-bottom flask. The solution is flushed degassed with argon for 30 min, and then $Pd_2(dba)_3$ (0.006 g, 0.006 mmol), $P(o-tol)_3$ (0.007 g, 0.024 mmol) are added into the flask. The polymerization is carried out at 130° C. for 18 hours under argon protection. After cooling to 90° C., end-capping is carried out for 4 hours by sequentially adding 0.5 mL 2-bromothiophene and removing metal ions by adding SDDC (Sodium diethyldithiocarbamate). After cooling to room temperature, the reaction mixture is poured into 72 mL of methanol and stirred for 1 hour. Then, the precipitated product is subjected to sequential Soxhlet extraction with methanol and dichloromethane. The residue is dissolved into 40 mL chlorobenzene and poured into 80 mL of methanol with vigorous stirring. The polymer precipitate is collected by filtration and dried to afford a black solid as the product, 0.35 g, 82.3%.

Synthesis of P2

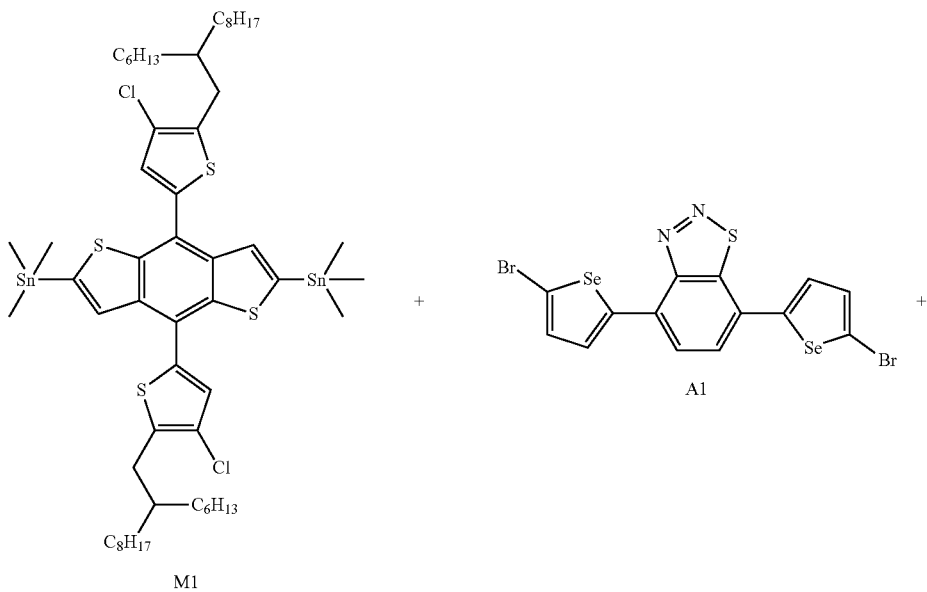

M1        A1

-continued

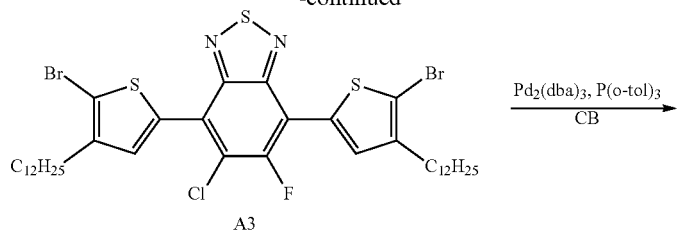

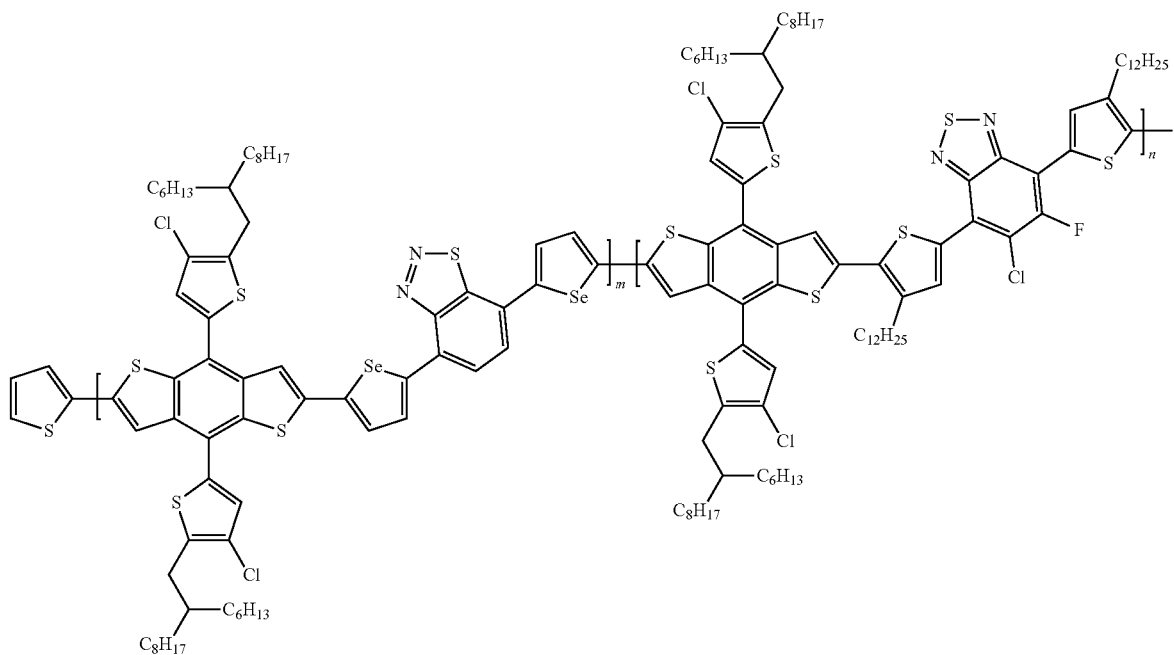

The three monomers of M1 (0.267 g, 0.225 mmol), A1 (0.050 g, 0.090 mmol), A3 (0.115 g, 0.135 mmol) are dissolved into 18.9 mL chlorobenzene in a two-neck round-bottom flask. The solution is flushed and degassed with argon for 30 min, and then Pd$_2$(dba)$_3$ (0.008 g, 0.009 mmol), P(o-tol)$_3$ (0.011 g, 0.036 mmol) is added into the flask. The polymerization is carried out at 130° C. for 18 hours under argon protection. After cooling to 90° C., end-capping is carried out for 4 hours by sequentially adding 0.5 mL 2-bromothiophene and removing metal ions by adding SDDC. After cooling to room temperature, the reaction mixture is poured into 40 mL of methanol and stirred for 1 hour. Then, the precipitated product is subjected to sequential Soxhlet extraction with methanol and dichloromethane. The residue is dissolved into 30 mL chlorobenzene and dripped into 60 mL of methanol with vigorous stirring. The polymer precipitate is collected by filtration and dried to afford a black solid as the product, 0.26 g, 81.0%.

Synthesis of P3

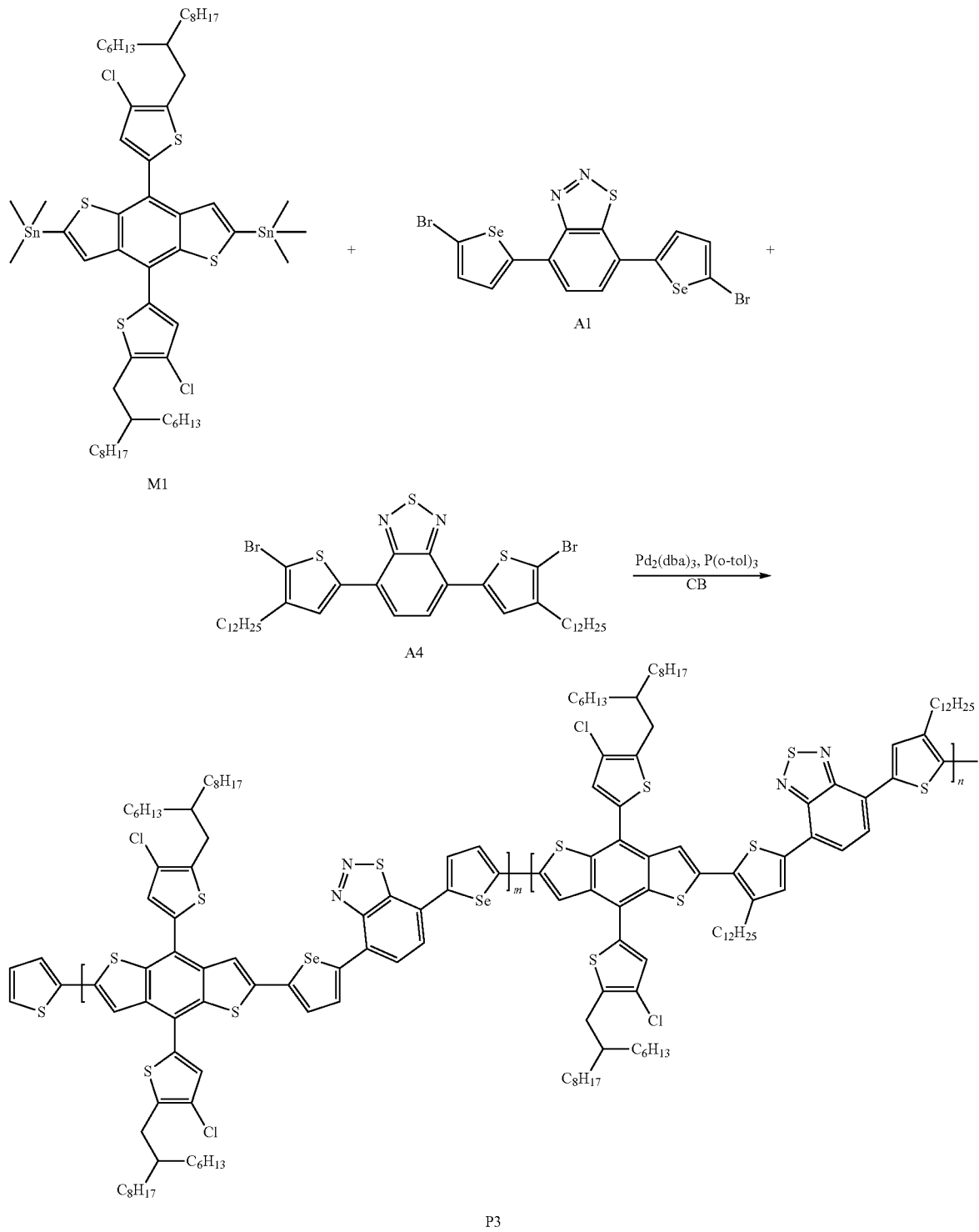

The three monomers of M1 (0.390 g, 0.330 mmol), A1 (0.073 g, 0.132 mmol), A4 (0.157 g, 0.198 mmol) are dissolved into 28 mL chlorobenzene in a two-neck round-bottom flask. The solution is flushed and degassed with argon for 30 min, and then Pd$_2$(dba)$_3$ (0.012 g, 0.013 mmol), P(o-tol)$_3$ (0.016 g, 0.053 mmol) are added into the flask. The polymerization is carried out at 130° C. for 18 hours under argon protection. After cooling to 90° C., end-capping is carried out for 4 hours by sequentially adding 0.5 mL 2-bromothiophene and removing metal ions by adding SDDC. After cooling to room temperature, the reaction mixture is poured into 56 mL of methanol and stirred for 1 hour. Then, the precipitated product is subjected to sequential Soxhlet extraction with methanol and dichloromethane.

The residue is dissolved into 40 mL chlorobenzene and dripped into 80 mL of methanol with vigorous stirring. The polymer precipitate is collected by filtration and dried to afford a black solid as the product, 0.40 g, 86.1%.

Characteristic Tests of the Conjugated Polymer Materials P1, P2, and P3

Figure 2:
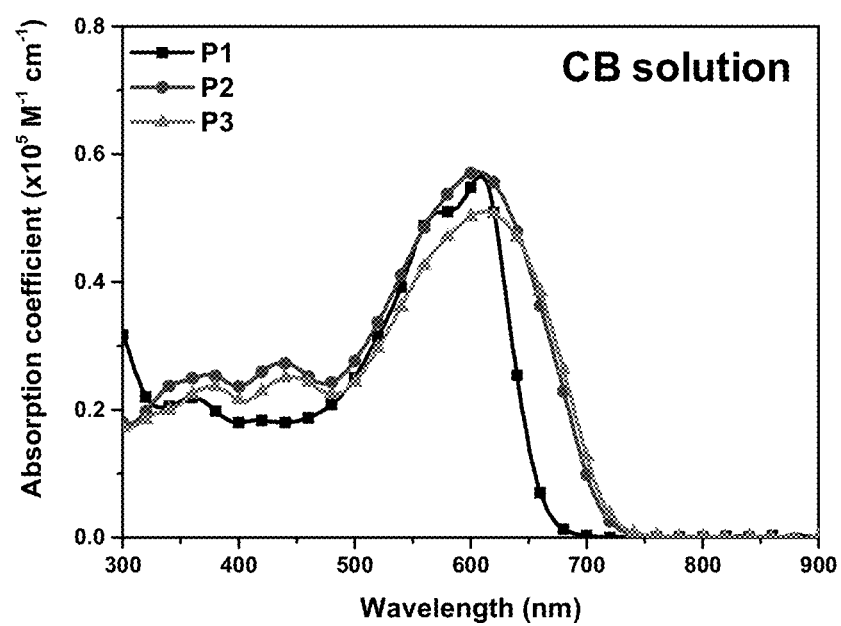
FIG. 2 shows the UV absorption test results of embodiments P1, P2, and P3 of the conjugated polymer material of the present invention in a CB solution.
Figure 3:
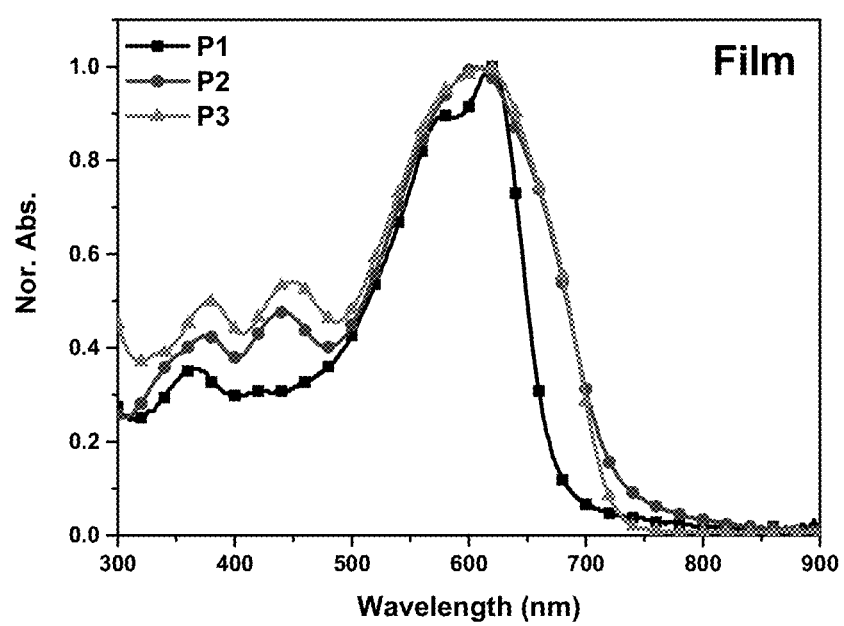
FIG. 3 shows the UV absorption test results of embodiments P1, P2, and P3 of the conjugated polymer material of the present invention in film.
Figure 4:
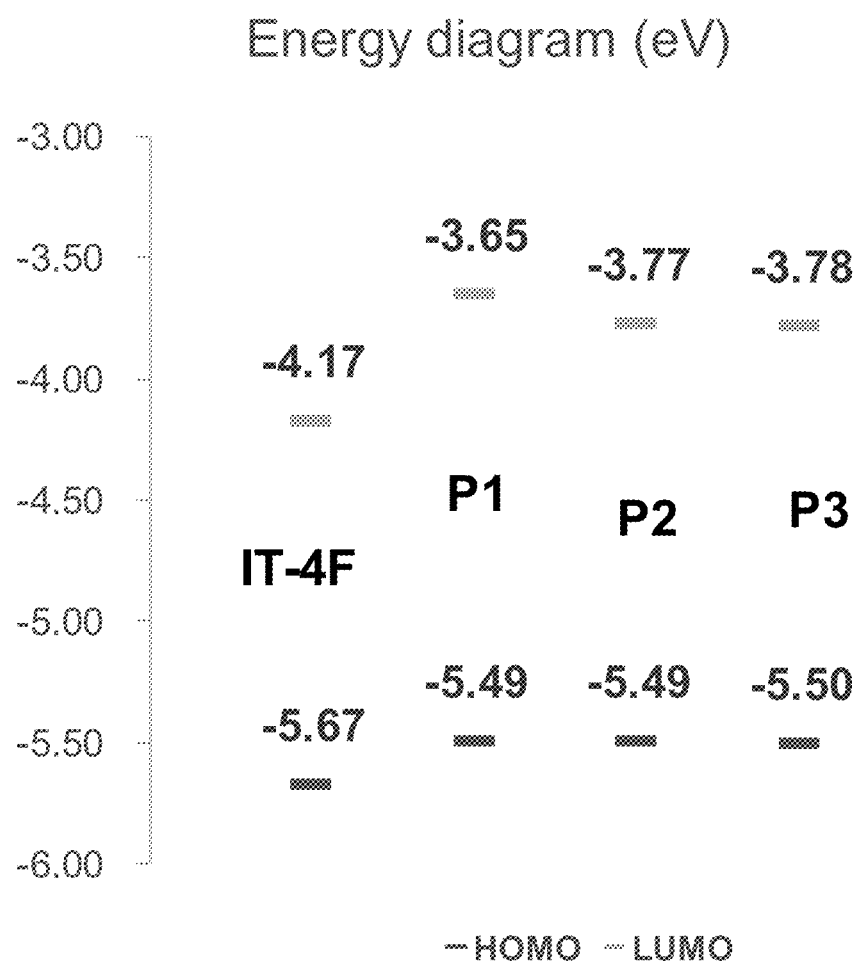
FIG. 4 shows the energy level comparison diagram of embodiments P1, P2, P3, and IT-4F of the conjugated polymer material of the present invention.
Figure 5A:
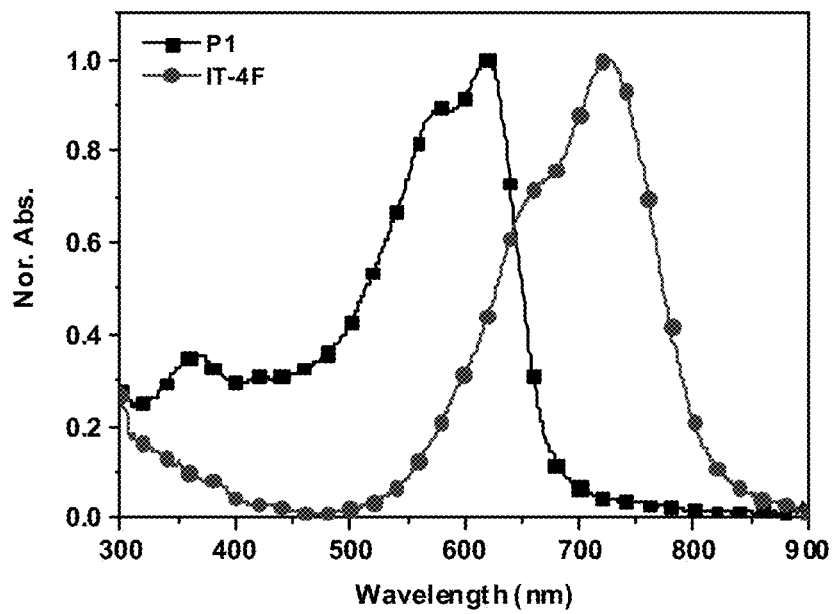
FIG. 5A shows the UV absorption test results of the embodiment P1 and IT-4F of the conjugated polymer material of the present invention.
Figure 5B:
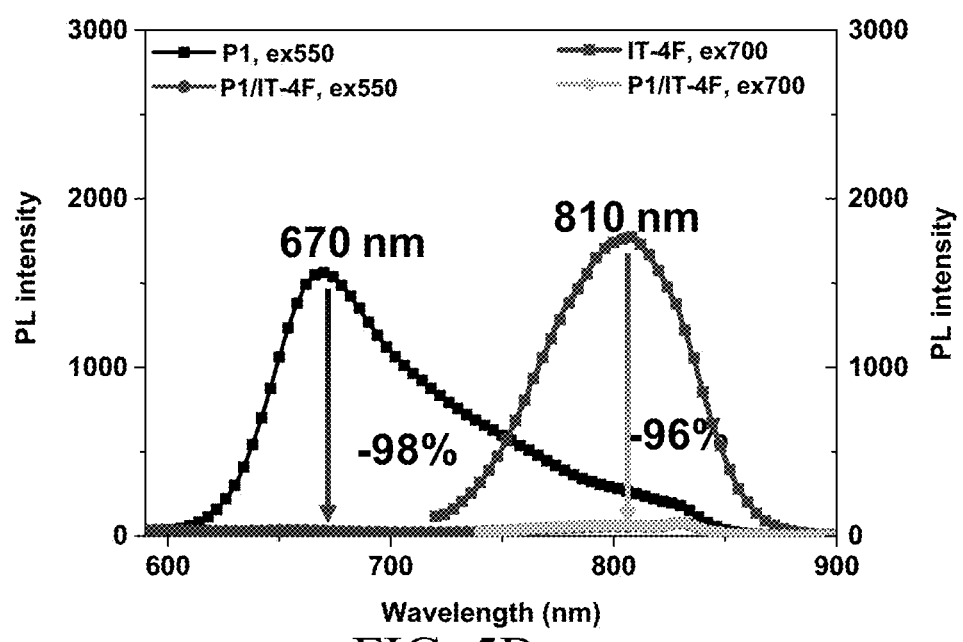
FIG. 5B shows the PL quenching test results of the embodiment P1 and IT-4F of the conjugated polymer material of the present invention.
Figure 6A:
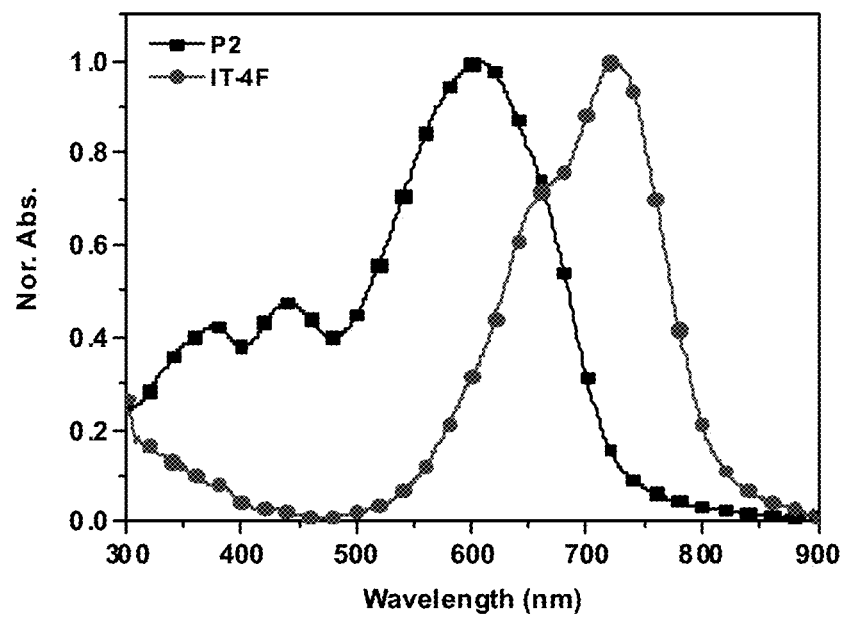
FIG. 6A shows the UV absorption test results of the embodiment P2 and IT-4F of the conjugated polymer material of the present invention.
Figure 6B:
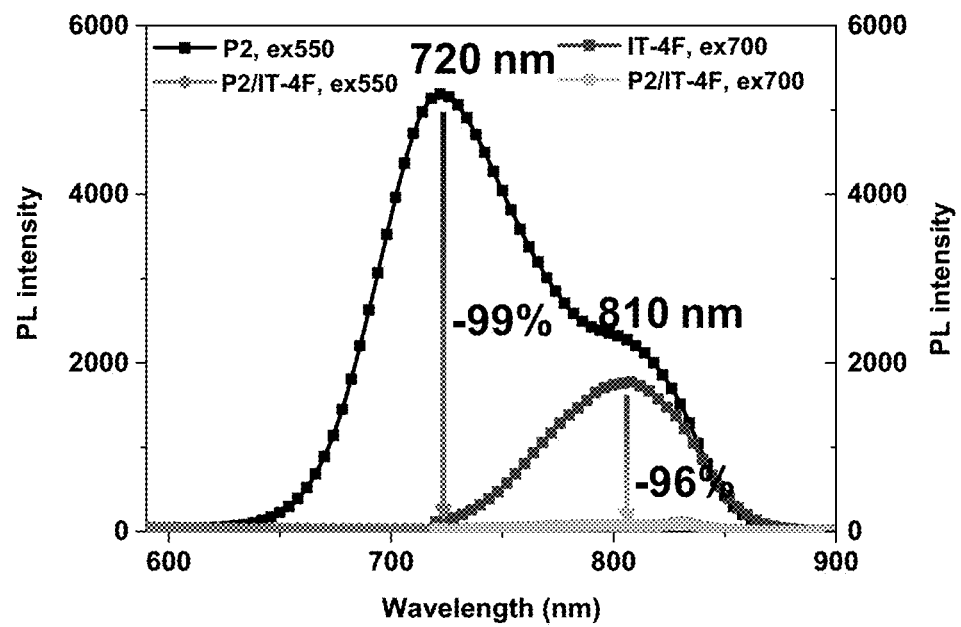
FIG. 6B shows the PL quenching test results of the embodiment P2 and IT-4F of the conjugated polymer material of the present invention.
Figure 7A:
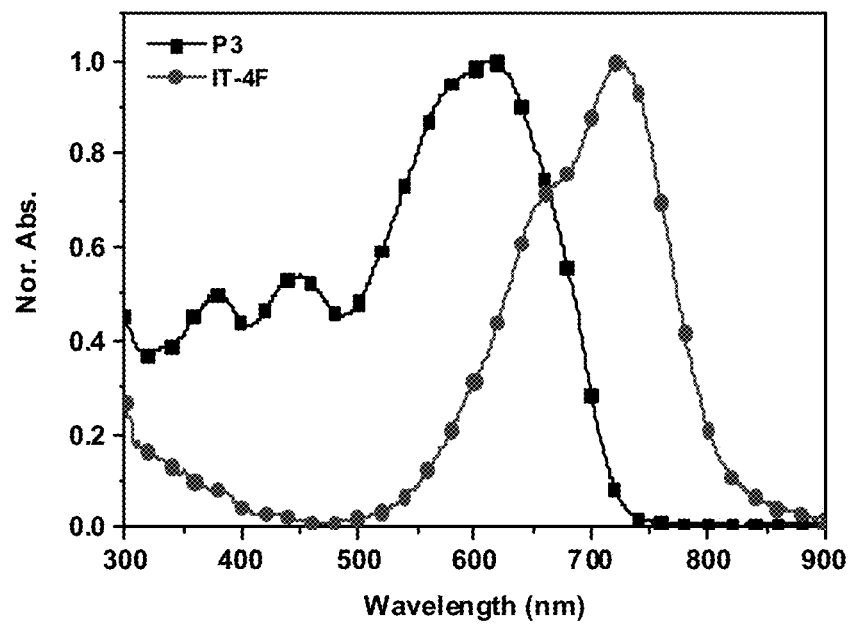
FIG. 7A shows the UV absorption test results of the embodiment P3 and IT-4F of the conjugated polymer material of the present invention.
Figure 7B:
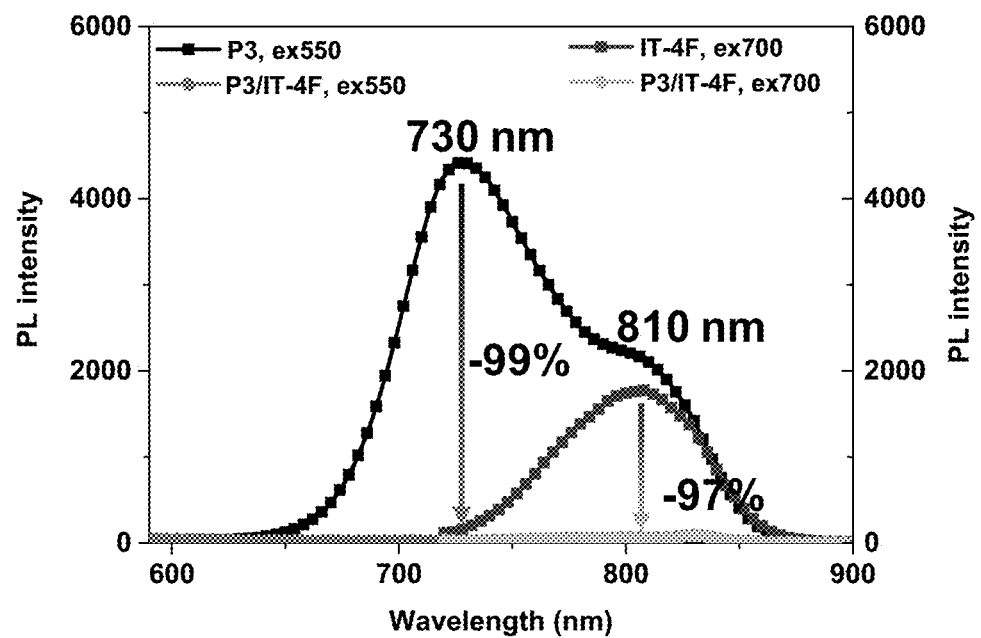
FIG. 7B shows the PL quenching test results of the embodiment P3 and IT-4F of the conjugated polymer material of the present invention.

Please refer to FIG. 2 to FIG. 4 and Table 1. FIG. 2 shows the UV absorption test results of embodiments P1, P2, and P3 of the conjugated polymer material of the present invention in a CB solution. FIG. 3 shows the UV absorption test results of embodiments P1, P2, and P3 of the conjugated polymer material of the present invention in film. FIG. 4 shows the energy level comparison diagram of embodiments P1, P2, P3, and IT-4F of the conjugated polymer material of the present invention. Table 1 shows the data results of FIG. 2 to FIG. 4. Wherein, the structure of IT-4F is as follows:

FIG. 5B shows the PL quenching test results of the embodiment P1 and IT-4F of the conjugated polymer material of the present invention. FIG. 6A shows the UV absorption test results of the embodiment P2 and IT-4F of the conjugated polymer material of the present invention. FIG. 6B shows the PL quenching test results of the embodiment P2 and IT-4F of the conjugated polymer material of the present invention. FIG. 7A shows the UV absorption test results of the embodiment P3 and IT-4F of the conjugated polymer material of the present invention. FIG. 7B shows the PL quenching test results of the embodiment P3 and IT-4F of the conjugated polymer material of the present invention. As shown in FIG. 5A to FIG. 7B, the specific embodiments P1, P2, P3 of the conjugated polymer material of the present invention and IT-4F are used to perform PL quenching tests, and it is found that the emission signals of single P1, P2, P3,

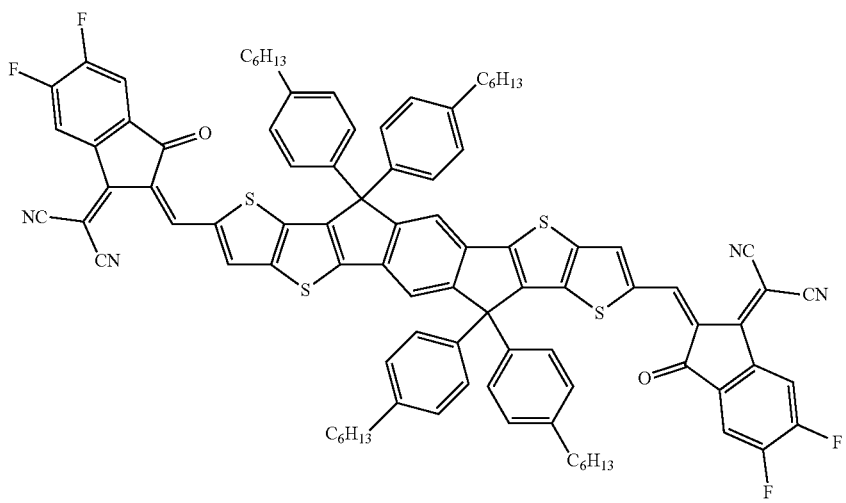

IT-4F

TABLE 1 conjugated polymer materials (P1, P2, and P3)

| | $\lambda_{soln}^{max}$ (nm) | $\varepsilon$ ($10^4$ cm$^{-1}$ M$^{-1}$) | $\lambda_{film}^{max}$ (nm) | $\lambda_{film}^{onset}$ (nm) | $E_g^{opt}$ (eV) | HOMO (eV) | LUMO (eV) |
|---|---|---|---|---|---|---|---|
| P1 | 609 | 5.66 | 620 | 674 | 1.84 | −5.49 | −3.65 |
| P2 | 604 | 5.73 | 608 | 722 | 1.72 | −5.49 | −3.77 |
| P3 | 616 | 5.10 | 616 | 720 | 1.72 | −5.50 | −3.78 |

As shown in FIG. 2 to FIG. 4 and Table 1, it can be seen that P1, P2, and P3 with different structures of A1, which have different material energy gaps. From this, it can be seen that the organic photovoltaic devices of the present invention can choose different structures of A1 to adjust the material energy gap (Eg) of the organic photovoltaic devices. In other words, the material energy gap of the conjugated polymer material of the present invention is adjustable, and the appropriate P-type polymer material energy gap can be selected and adjusted according to matching different N-type materials, and then an organic photovoltaic device with high power conversion efficiency is matched.

Please refer to FIG. 5A to FIG. 7B. FIG. 5A shows the UV absorption test results of the embodiment P1 and IT-4F of the conjugated polymer material of the present invention.

IT-4F have an effective quenching effect, which is more than 96%. This means that the electrons of the P-type materials can be transferred to the N-type material, the holes of the N-type material can be transferred to the P-type material, and then the charge is collected by the bilateral electrodes. It can be seen that the conjugated polymer materials of the present invention have excellent charge transfer effects.

Preparation and Testing of the Organic Photovoltaic Devices:

A glass coated by a pre-patterned Indium Tin Oxides (ITO) with a sheet resistance of ~15 Ω/sq is used as a substrate. The substrate is ultrasonically oscillated in soap deionized water, deionized water, acetone, and isopropanol in sequence, and washed in each step for 15 minutes. The washed substrate is further treated with a UV-ozone cleaner for 30 minutes. A top coating layer of ZnO (diethylzinc solution, 15 wt % in toluene, diluted with tetrahydrofuran) is spin coated on the ITO substrate with a rotation rate of 5000 rpm for 30 seconds and then baked at 150° C. in the air for 20 minutes. The active layer solution was prepared in o-xylene. The active layer includes the aforementioned organic semiconductor material. To completely dissolve the active layer material, the active layer solution is stirred on a hot plate at 120° C. for at least 1 hour. Then, the active layer material is returned to room temperature for spin coating. Finally, the thin film formed by the coated active layer is annealed at 120° C. for 5 minutes and then transferred to a thermal evaporation machine. A thin layer (8 nm) of MoO₃ is deposited as an anode intermediate layer under a vacuum of 3×10' Torr, and then a silver layer with a thickness of 100 nm is deposited as an upper electrode. All batteries are encapsulated with epoxy resin in the glove box to make organic electronic components (ITO/ETL/active layer/MoO₃/Ag). The J-V characteristics of the components are measured by a solar simulator (having a xenon lamp with an AM 1.5G filter) in air and at room temperature and under AM 1.5 G (100 mW cm⁻²). Here, a standard silicon-based diode with a KG5 filter is used as a reference cell to calibrate the light intensity to make the mismatch portion of the spectrum consistent. The J-V characteristics are recorded by a Keithley 2400 source meter instrument. A typical battery has an element area of 4 mm2, which is defined by the area of the metal mask aligning element with the aperture. Wherein, P1 is prepared with P1: IT-4F=1:1, with a concentration of 7 mg/mL in o-xylene, and adding 0.5% 1,8-diiodoocatane (DIO); P2 is prepared with P2: IT-4F=1:1, with a concentration of 10 mg/mL in o-xylene, and adding 0.5% 1,8-diiodoocatane (DIO); P3 is prepared with P3: IT-4F=1:1, with a concentration of 14 mg/mL in o-xylene, and adding 0.5% 1,8-diiodoocatane (DIO). The thicknesses of the above-mention active layers are about 100 nm, and the structures of the organic photovoltaic devices are glass/ITO/ZnO/ATL/MoO₃/Ag.

Figure 8:
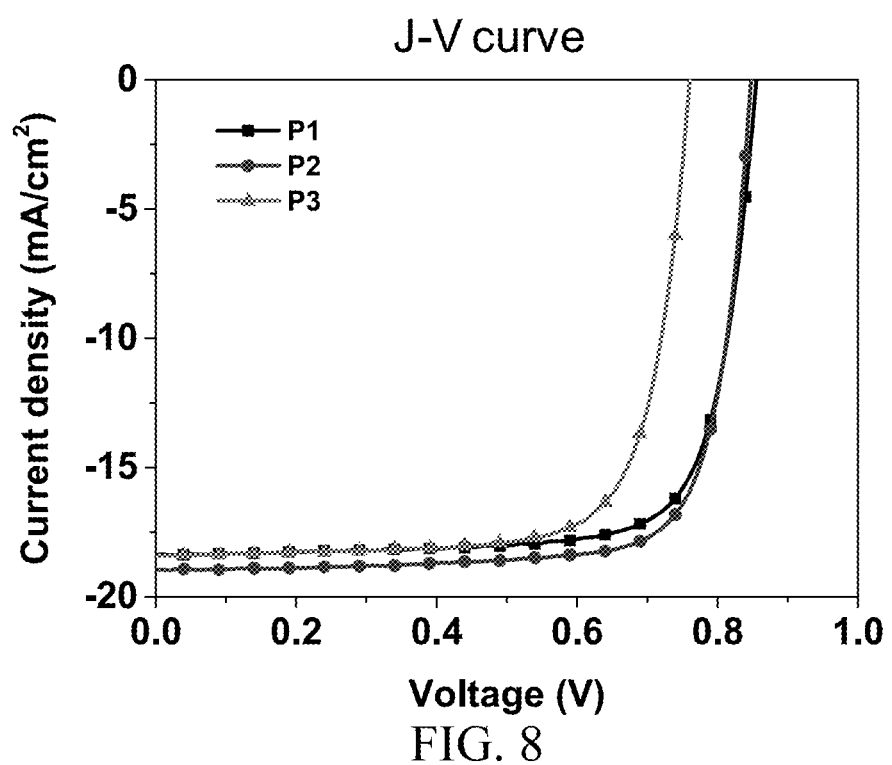
FIG. 8 shows the J-V test results of embodiments P1, P2, and P3 of the organic photovoltaic device of the present invention.
Figure 9:
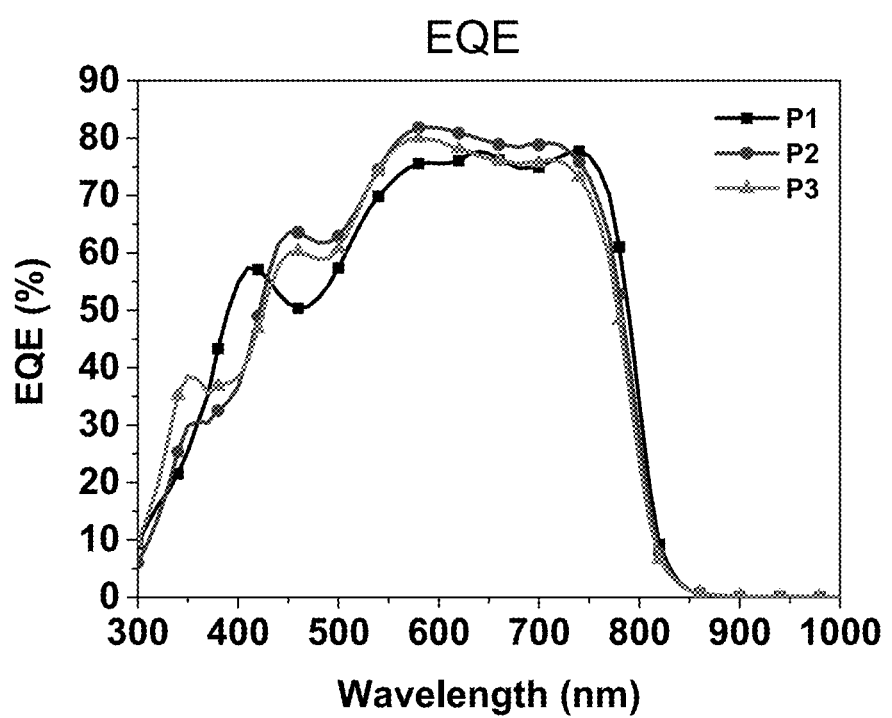
FIG. 9 shows the EQE test results of embodiments P1, P2, and P3 of the organic photovoltaic device of the present invention.
Figure 10:
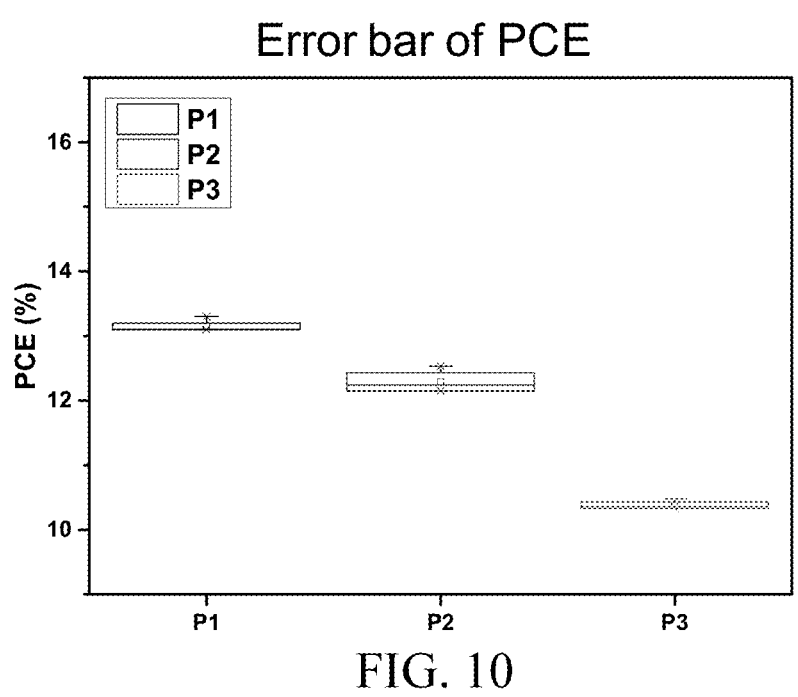
FIG. 10 shows the PCE error graphs of embodiments P1, P2, and P3 of the organic photovoltaic device of the present invention.

Efficiency Analysis of the Organic Photovoltaic Devices:

Please refer to FIG. 8 to FIG. 10 and Table 2. FIG. 8 shows the J-V test results of embodiments P1, P2, and P3 of the organic photovoltaic device of the present invention. FIG. 9 shows the EQE test results of embodiments P1, P2, and P3 of the organic photovoltaic device of the present invention. FIG. shows the PCE error graphs of embodiments P1, P2, and P3 of the organic photovoltaic device of the present invention. Table 2 shows the data results of FIG. 8 to FIG. 10.

TABLE 2

| | \multicolumn{7}{c|}{organic photovoltaic devices} |
|---|---|---|---|---|---|---|---|
| | $V_{oc}$ (V) | $J_{sc}$ (mA/cm²) | FF (%) | $R_s$ (Ohm) | $R_{sh}$ (Ohm) | $PCE_{Highest}$ (%) | $PCE_{average}$ (%) |
| P1:IT-4F | 0.86 | 19.8 | 77.9 | 188.8 | 16281.9 | 13.3 | 13.2 |
| P2:IT-4F | 0.85 | 19.0 | 77.9 | 198.4 | 17361.0 | 12.5 | 12.3 |
| P3:IT-4F | 0.76 | 18.4 | 74.9 | 198.6 | 14175.9 | 10.5 | 10.4 |

As shown in FIG. 8, FIG. 9, and Table 2, the organic photovoltaic devices made of the conjugated polymer materials P1, P2, and P3 of the present invention with IT-4F all have power conversion efficiency (PCE) performance which more than 10%. In addition, as shown in FIG. 10, it can be seen that the specific embodiments P1, P2, and P3 of the organic photovoltaic devices of the present invention have small errors among the test data. In other words, the test results are similar each time. This means that the specific embodiments P1, P2, and P3 of the organic photovoltaic devices of the present invention have good material stability.

It also means that the random polymer material characteristics of the present invention are conducive to obtain good and stable film quality so that the manufacturing processes of the organic photovoltaic devices are stable.

Based on the above experimental results, the organic photovoltaic devices of the present invention can effectively control the polymer energy gap and can have power conversion efficiency (PCE) which is more than 10% under different structures of A1.

With the detailed description of the above embodiments, it is hoped that the features and spirit of the present invention can be more clearly described, and the scoped of the present invention is not limited by the embodiments disclosed above. On the contrary, the intention is to cover various changes and equivalent arrangements within the scope of the patents to be applied for in the present invention.

What is claimed is:

1. A conjugated polymer material comprising a structure of formula I:

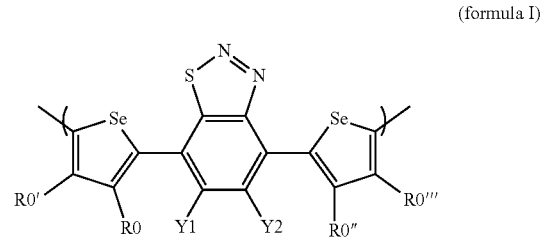

(formula I)

wherein, R0, R0', R0", R0''', Y1 and Y2 can be the same or different from each other, and can be independently selected from the following groups and their derivatives consisting of C1-C30 alkyl, C3-C30 branched alkyl, C1-C30 silyl, C2-C30 ester, C1-C30 alkoxy, C1-C30 alkylthio, C1-C30 haloalkyl, C2-C30 alkene, C2-C30 alkyne, C2-C30 cyano-containing carbon chain, C1-C30 nitro-containing carbon chain, C1-C30 hydroxy-containing carbon chain, C3-C30 keto-containing carbon chain, halogen, cyano and hydrogen atom.

2. A conjugated polymer material comprising a structure of formula II:

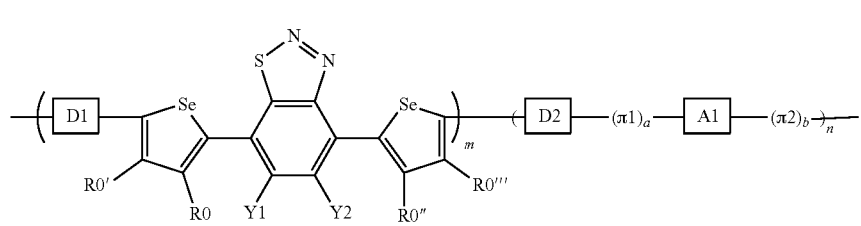

(formula II)

wherein D1 and D2 can be the same or different electron donor groups;

A1 is an electron acceptor group;

π1 and π2 can be the same or different conjugated groups;

a and b are independently selected from 0 or 1;

m and n are integers, independently selected from 0 to 1000, and m is not equal to 0; and R0, R0', R0", R0''', Y1 and Y2 can be the same or different from each other, and can be independently selected from the following groups and their derivatives consisting of C1-C30 alkyl, C3-C30 branched alkyl, C1-C30 silyl, C2-C30 ester, C1-C30 alkoxy, C1-C30 alkylthio, C1-C30 haloalkyl, C2-C30 alkene, C2-C30 alkene, C2-C30 cyano-containing carbon chain, C1-C30 nitro-containing carbon chain, C1-C30 hydroxy-containing carbon chain, C3-C30 keto-containing carbon chain, halogen, cyano and hydrogen atom.

3. The conjugated polymer material of claim 2, wherein D1 and D2 further include substituted and unsubstituted heterocyclic ring, substituted and unsubstituted fused heterocyclic ring, and derivatives thereof, and heteroatom of the heterocyclic ring and the fused heterocyclic ring includes at least one of selenium, sulfur, nitrogen, and oxygen, and the number of the ring is at least 3.

4. The conjugated polymer material of claim 3, wherein D1 and D2 are independently selected from the following structures and their derivatives:

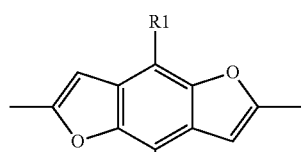

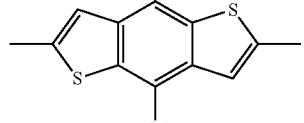

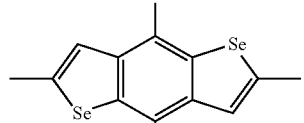

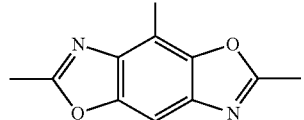

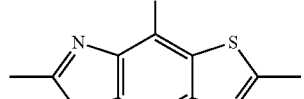

-continued

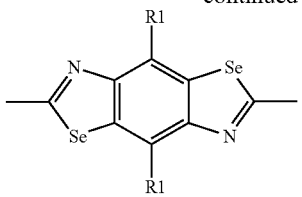

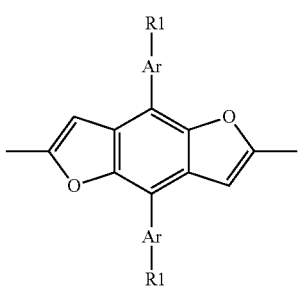

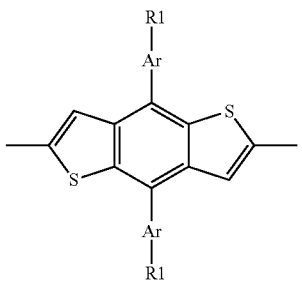

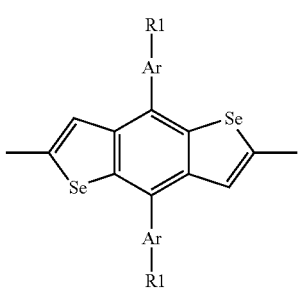

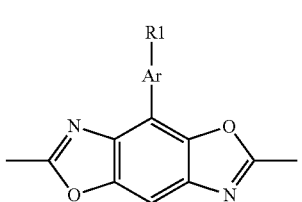

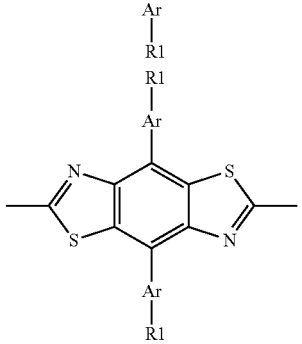

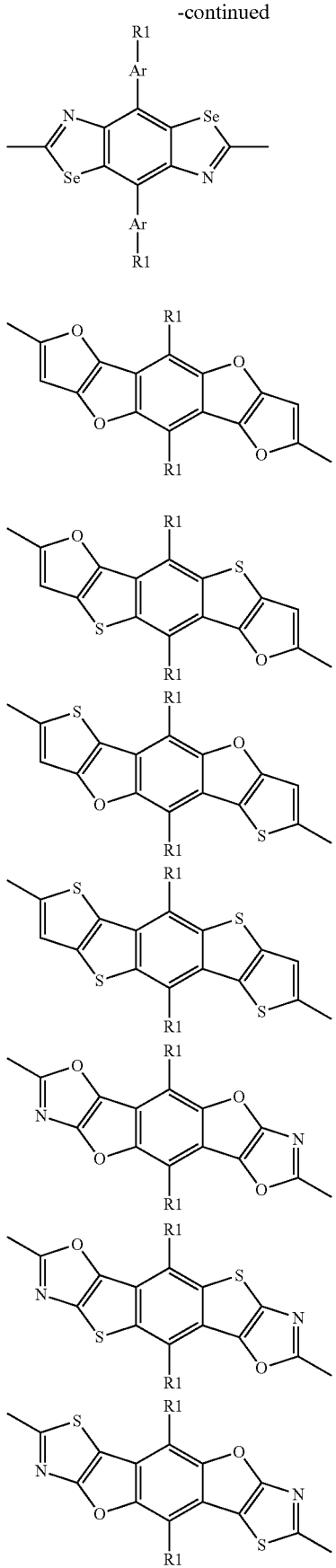
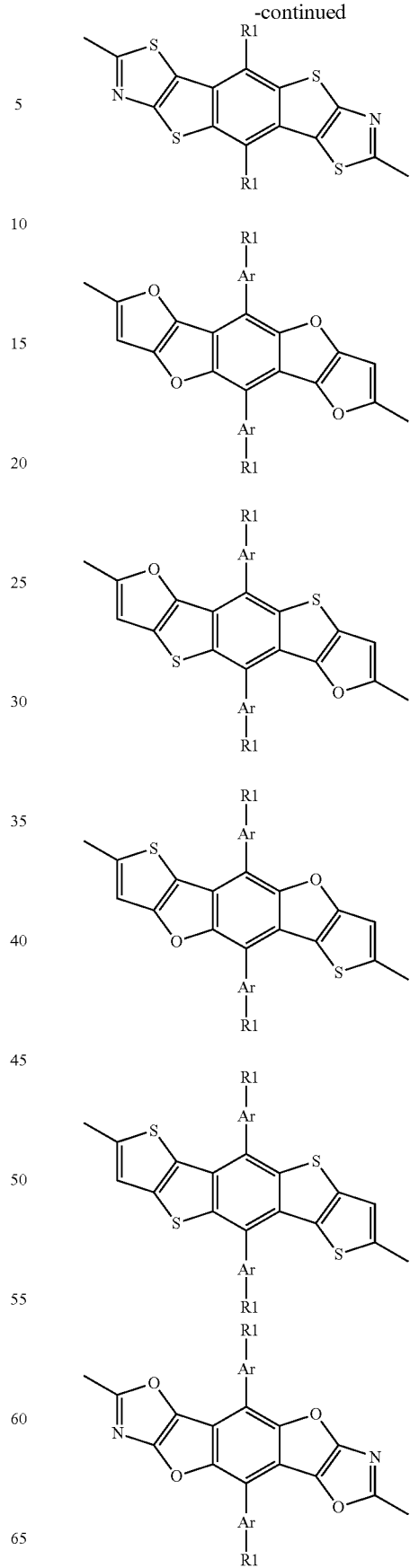

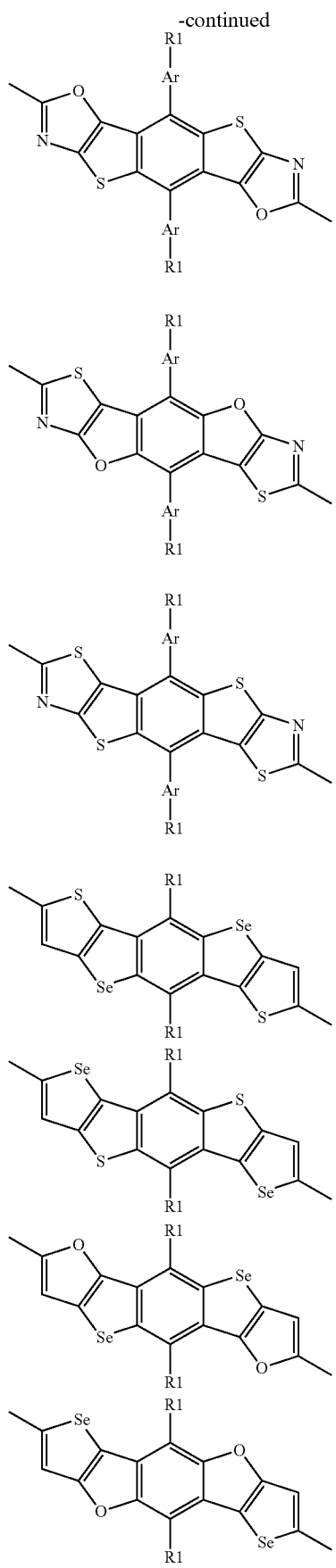
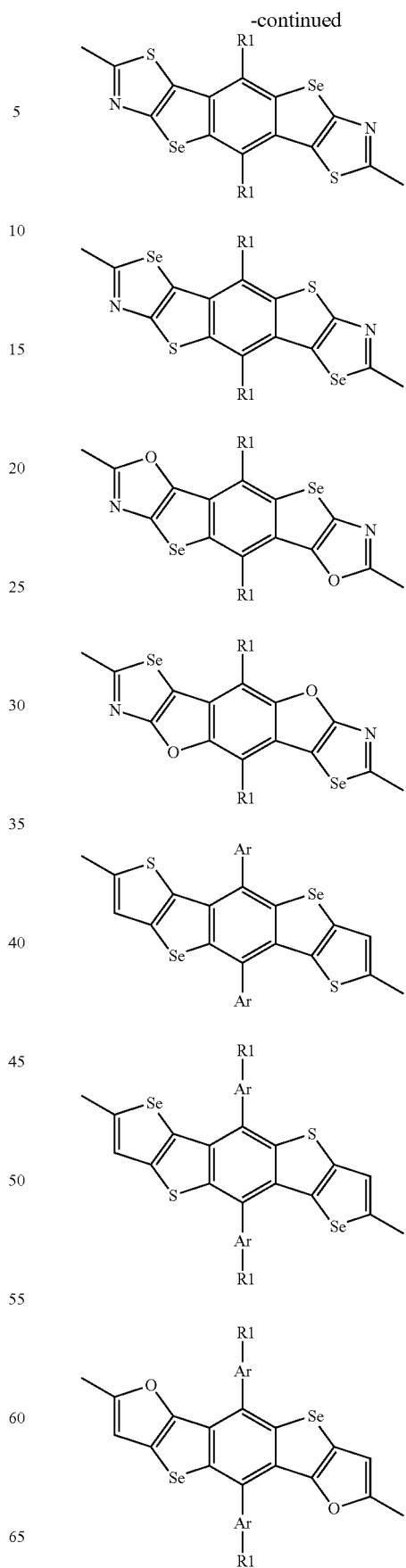

-continued

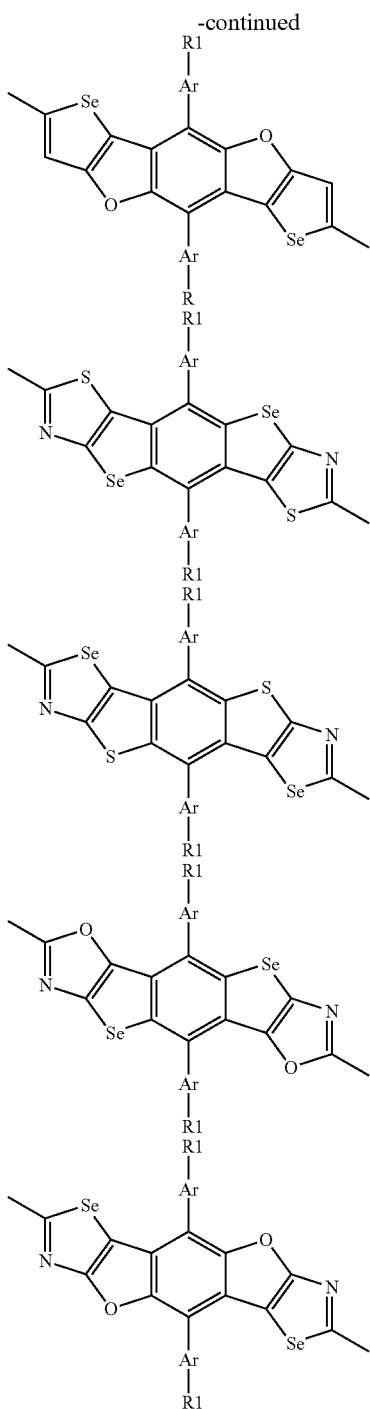

wherein, R1 is selected from the following groups and their derivatives consisting of C1-C30 alkyl, C3-C30 branched alkyl, C1-C30 silyl, C2-C30 ester, C1-C30 alkoxy, C1-C30 alkylthio, C1-C30 haloalkyl, C2-C30 alkene, C2-C30 alkyne, C2-C30 cyano-containing carbon chain, C1-C30 nitro-containing carbon chain, C1-C30 hydroxy-containing carbon chain, C3-C30 keto-containing carbon chain, halogen, hydrogen atom and cyano; Ar is selected from the following groups and their derivatives consisting of substituted and unsubstituted aromatic ring, substituted and unsubstituted heterocyclic ring, substituted and unsubstituted fused ring, substituted and unsubstituted fused heterocyclic ring, C1-C30 alkyl, C3-C30 branched alkyl, C1-C30 silyl, C2-C30 ester, C1-C30 alkoxy, C1-C30 alkylthio, C1-C30 haloalkyl, C2-C30 alkene, C2-C30 alkyne, C2-C30 cyano-containing carbon chain, C1-C30 nitro-containing carbon chain, C1-C30 hydroxy-containing carbon chain, C3-C30 keto-containing carbon chain, halogen-containing benzene ring, halogen-containing five-membered heterocyclic ring, and halogen-containing six-membered heterocyclic ring.

5. The conjugated polymer material of claim 2, wherein A1 further includes substituted and unsubstituted heterocyclic ring, substituted and unsubstituted fused heterocyclic ring and derivatives thereof, wherein the heteroatom of the heterocyclic ring and the fused heterocyclic ring includes at least one of selenium, sulfur, nitrogen, and oxygen, and the number of the ring is at least 2.

6. The conjugated polymer material of claim 5, wherein A1 is selected from the following structures and their derivatives:

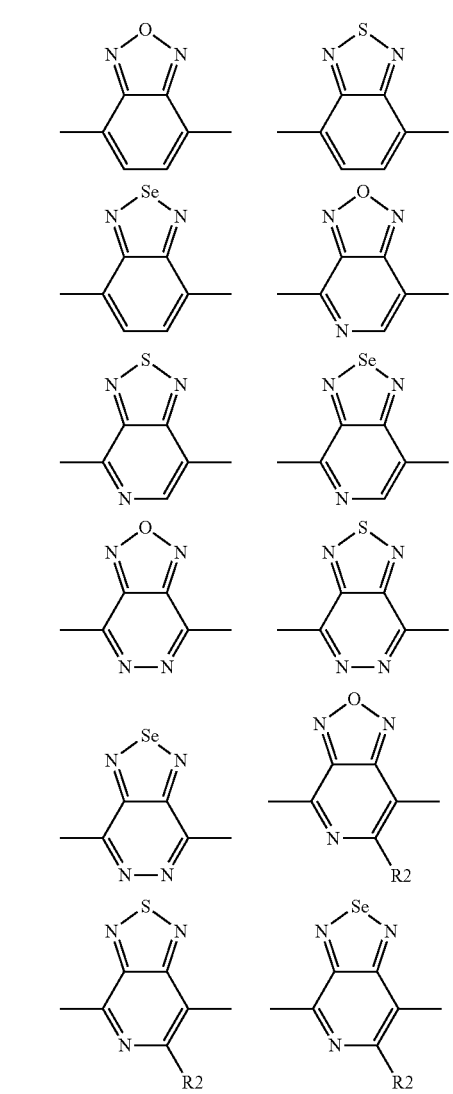

85
-continued
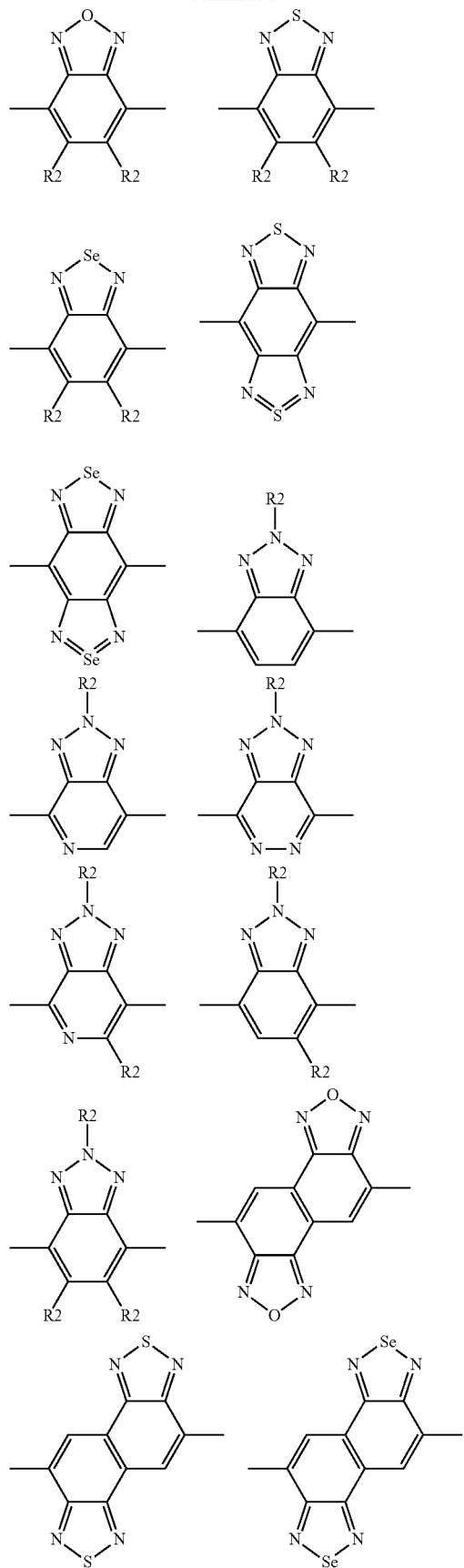
86
-continued
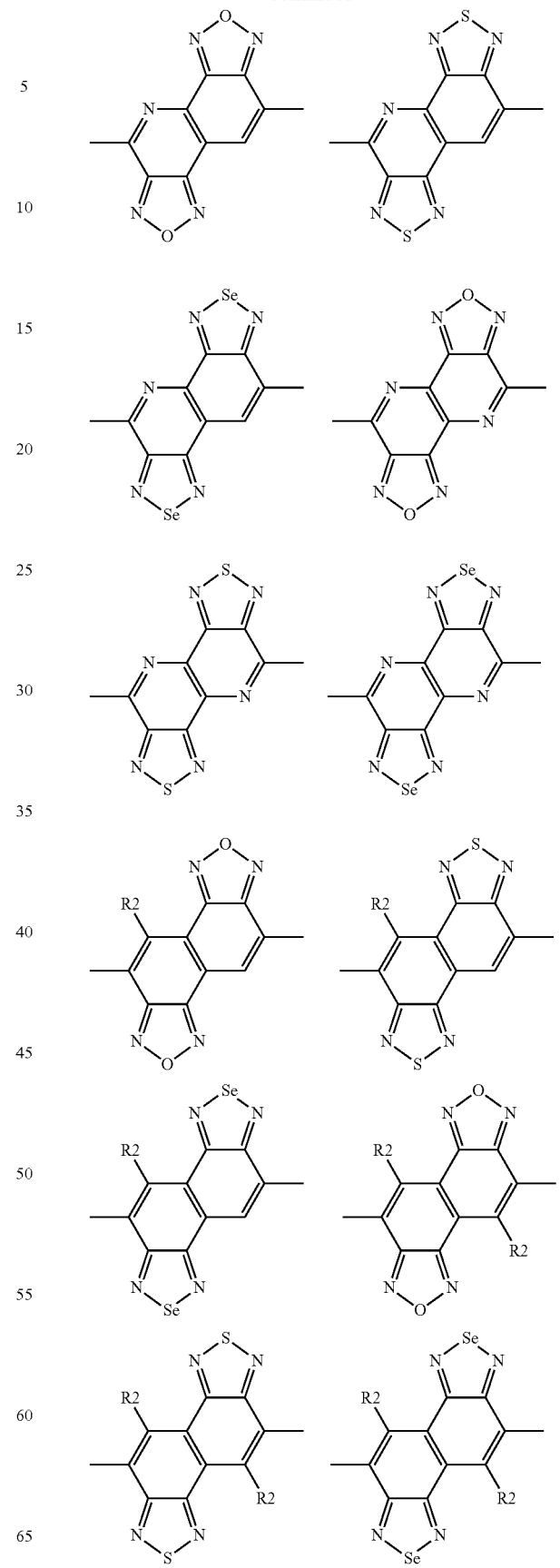

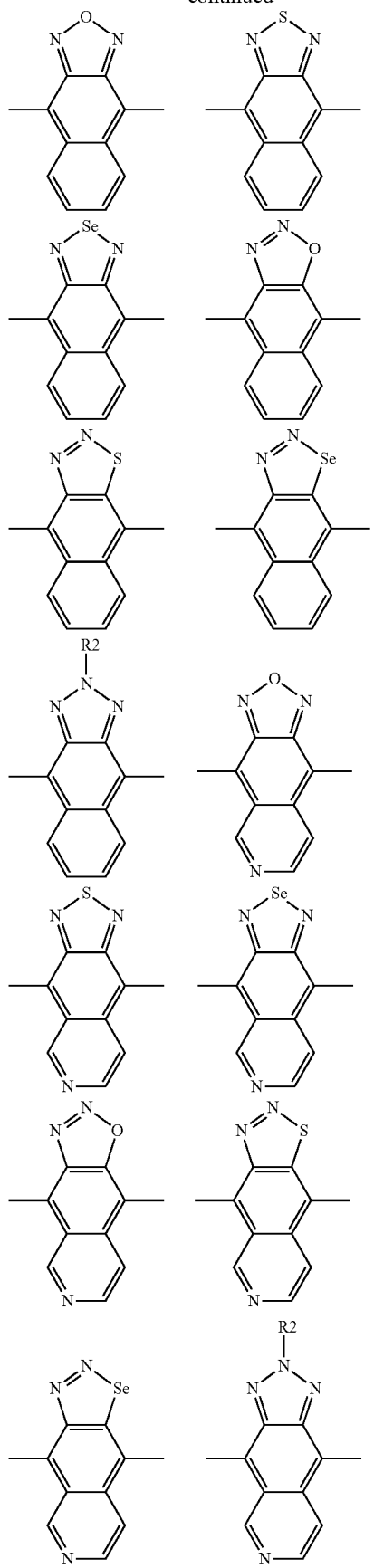
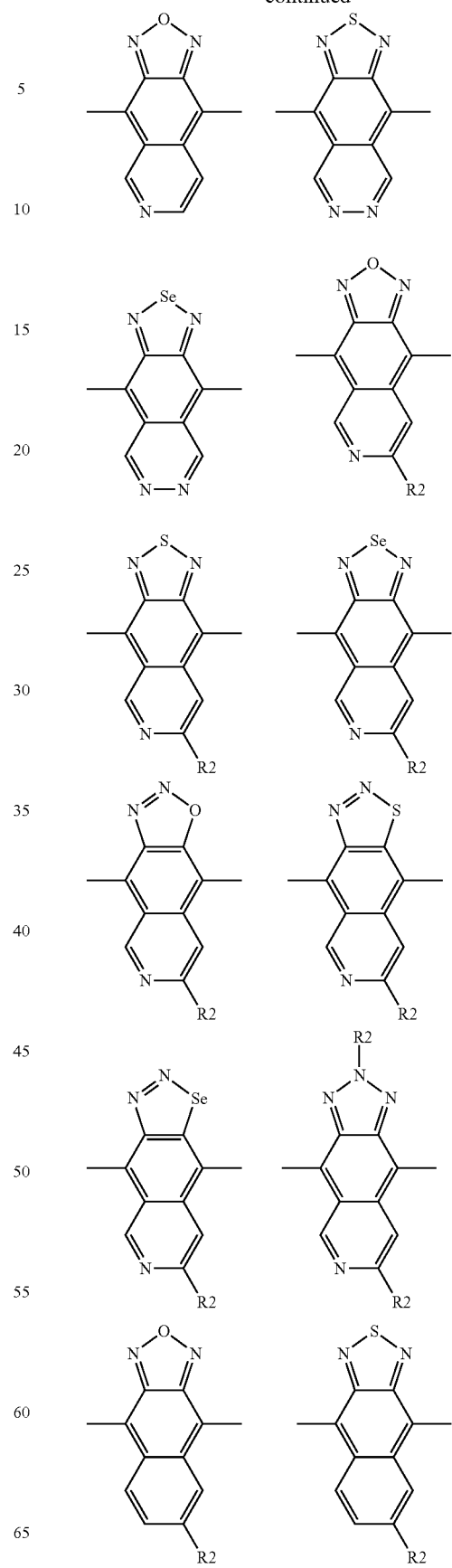

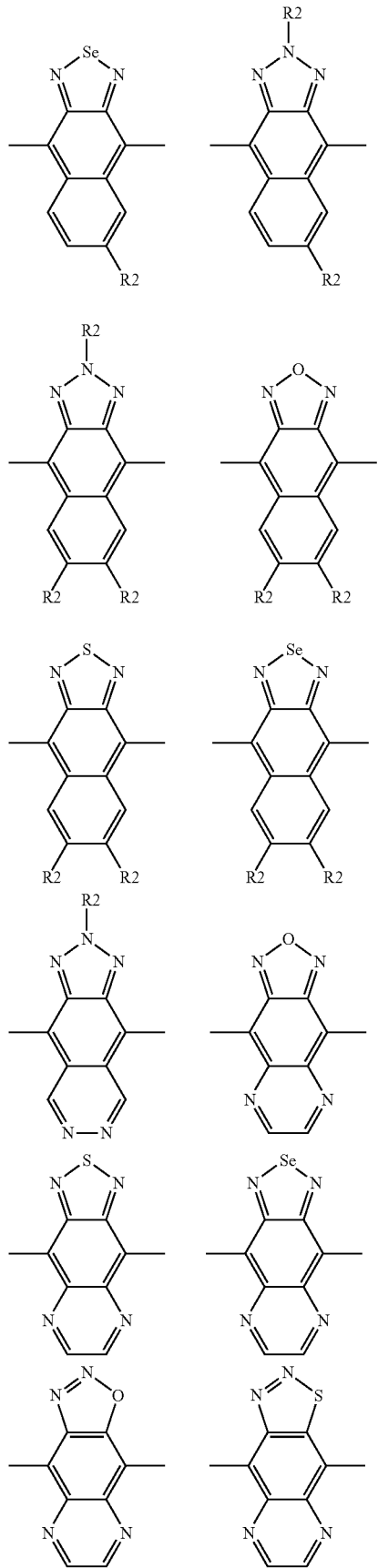
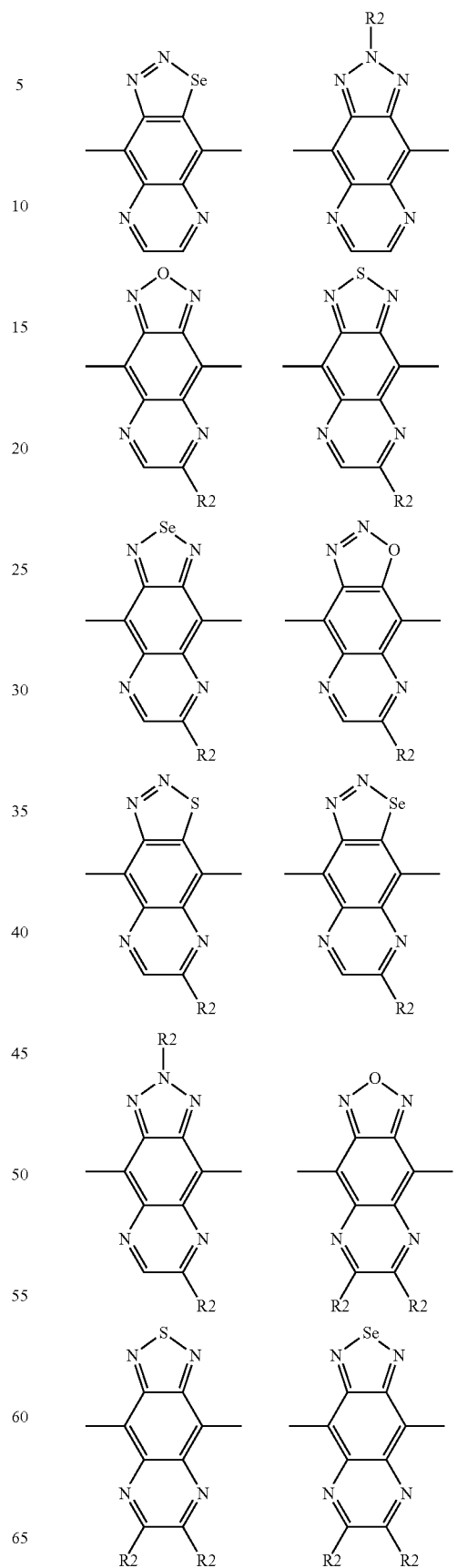

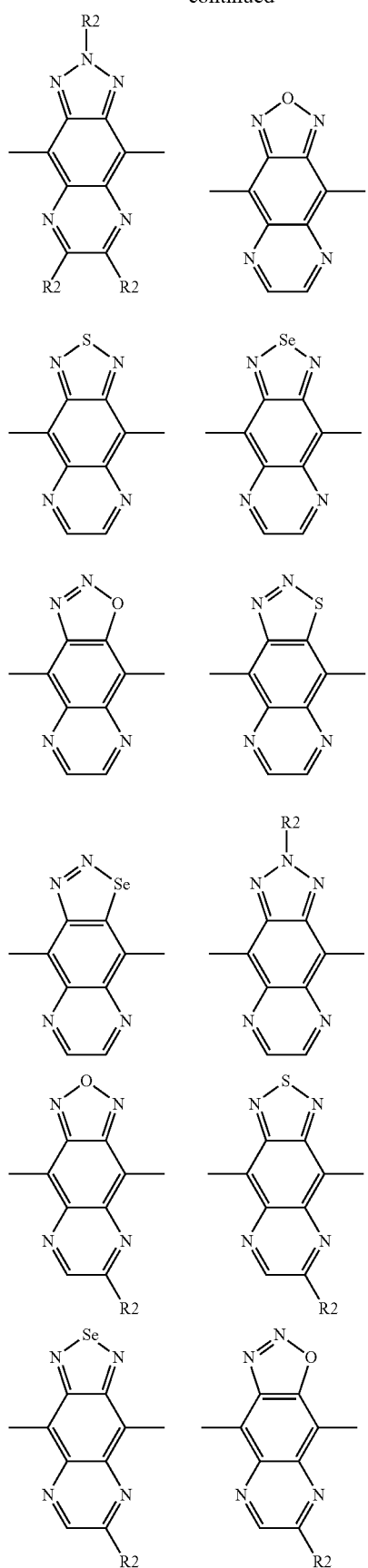
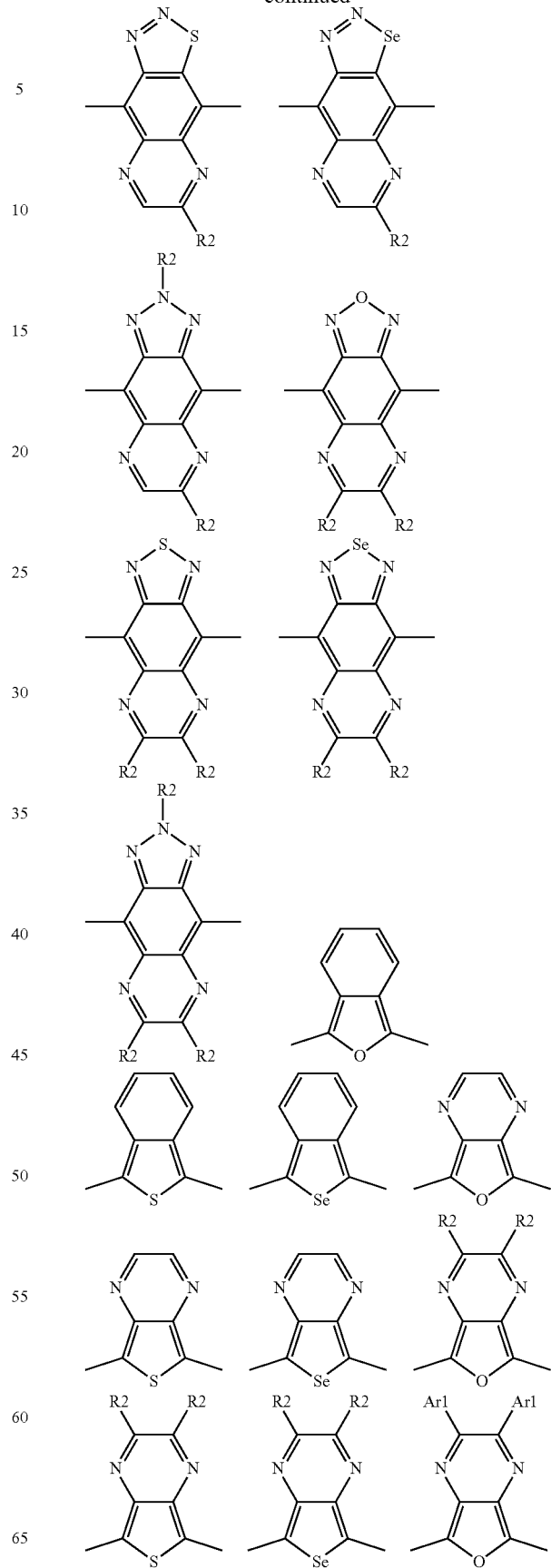

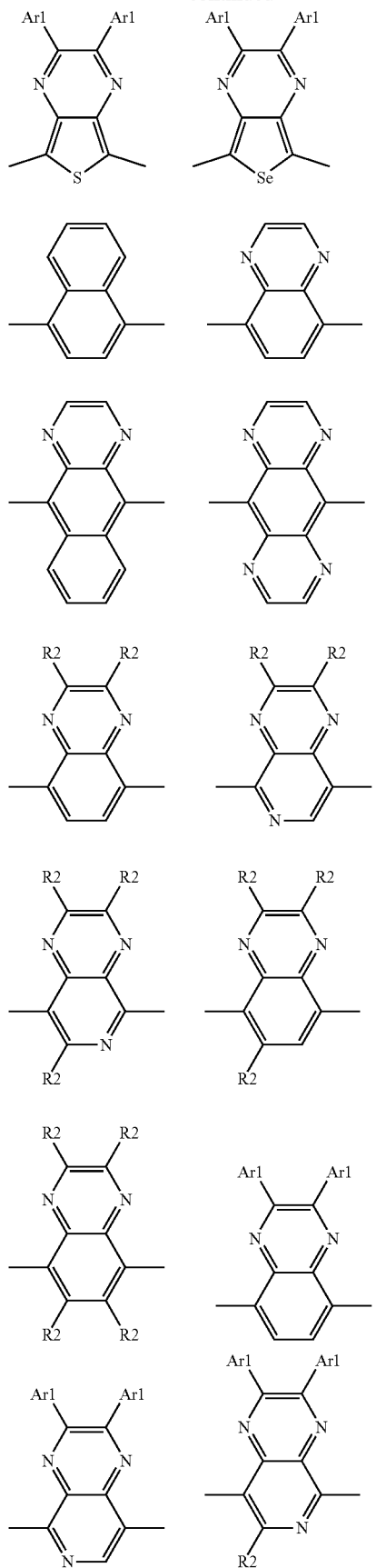
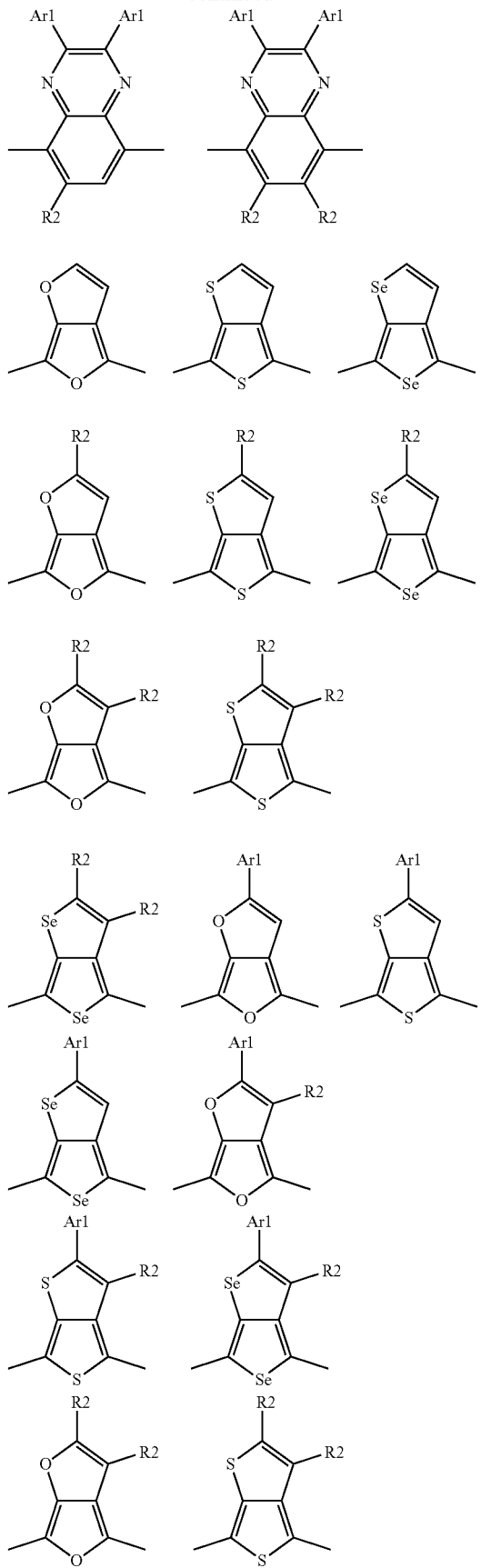

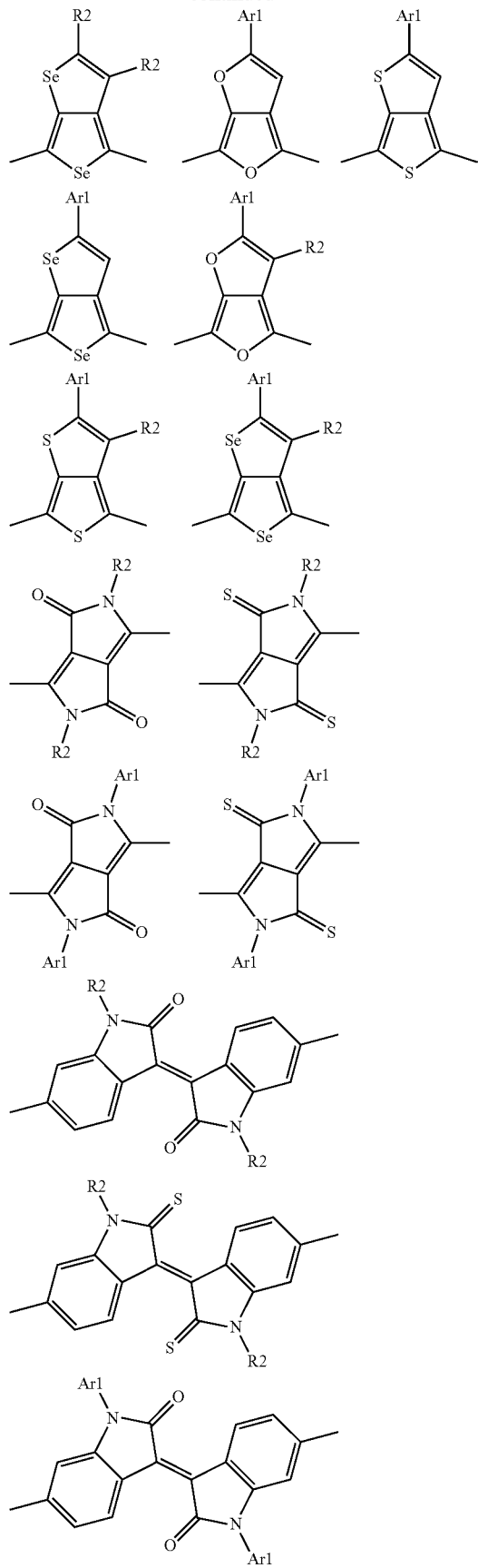
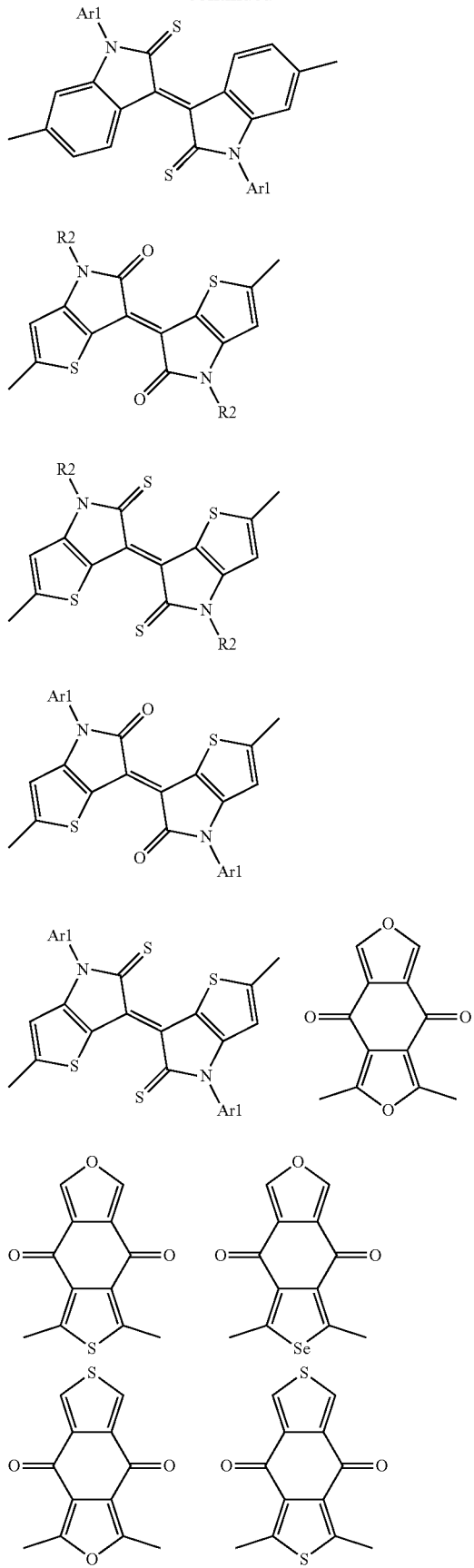

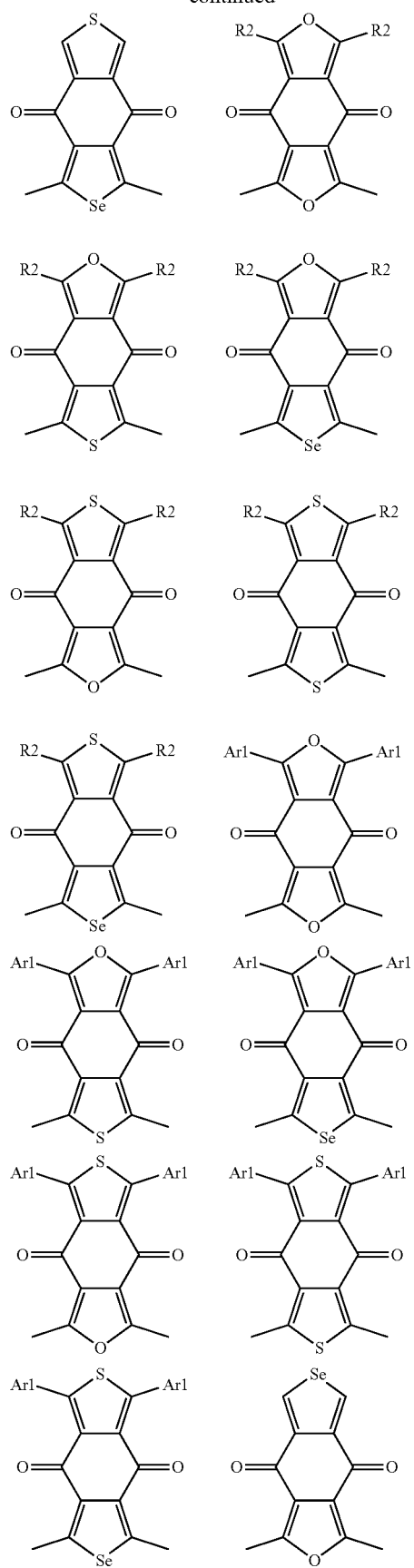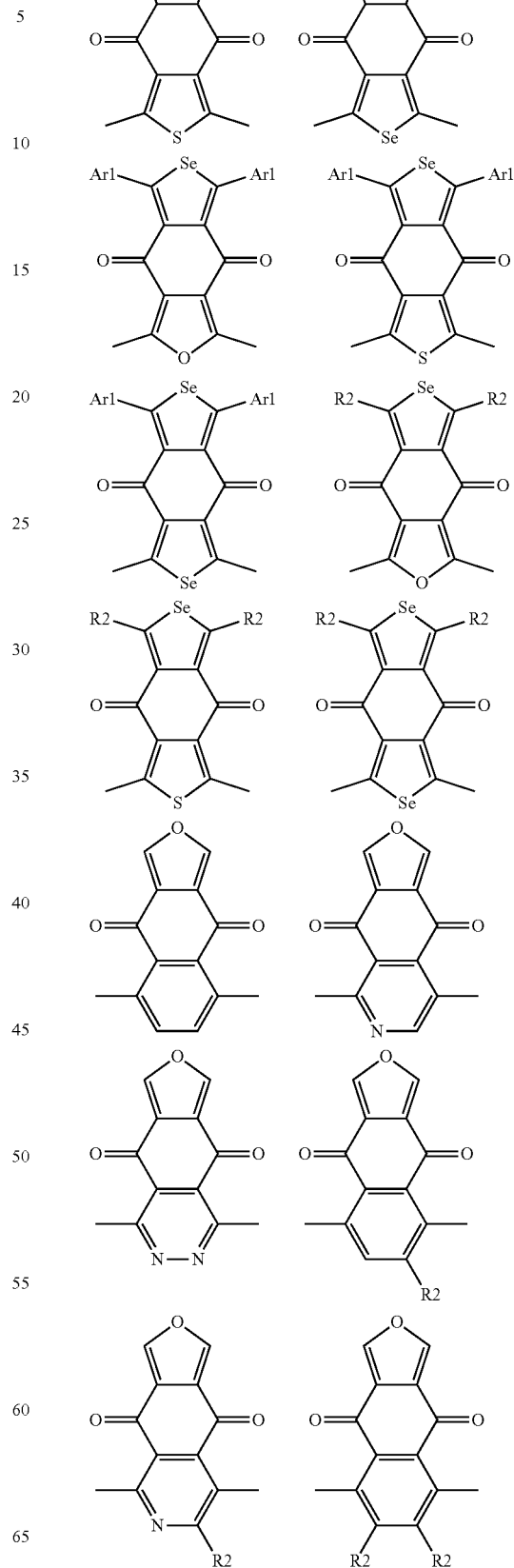

-continued
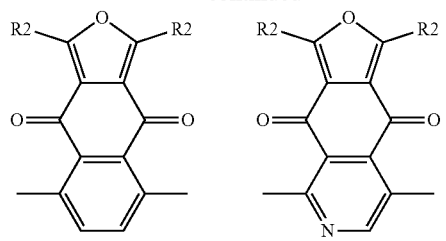
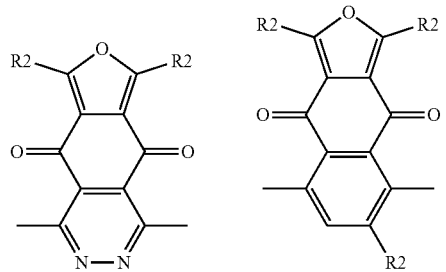
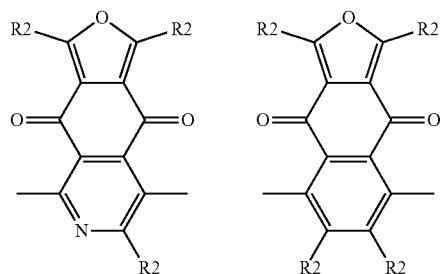
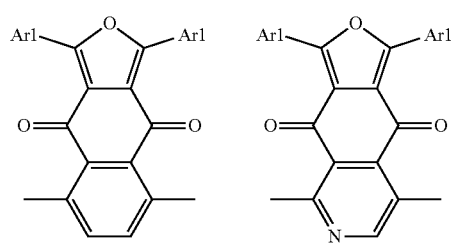
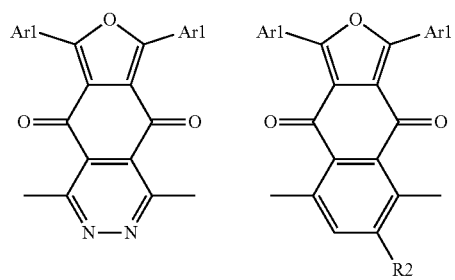
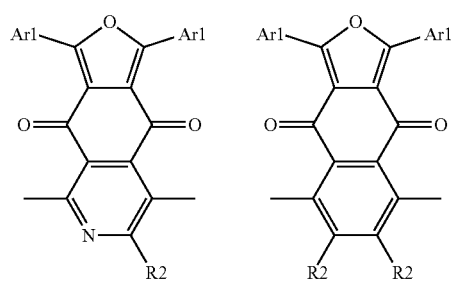
-continued
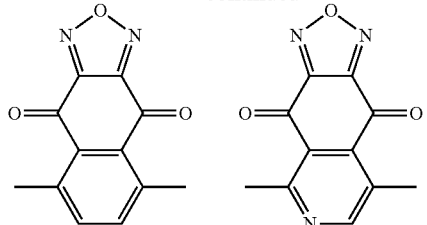
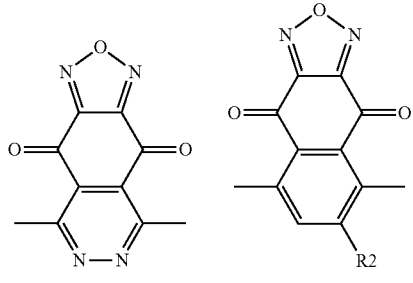
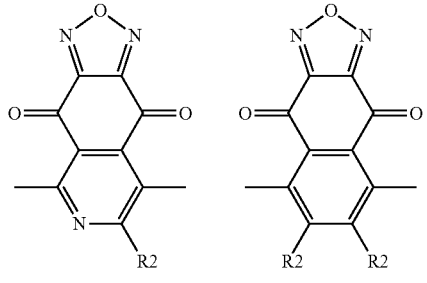
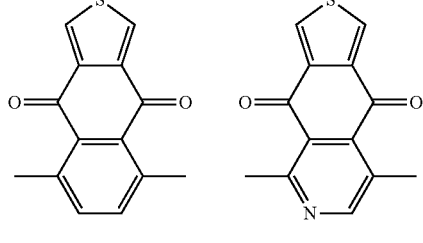
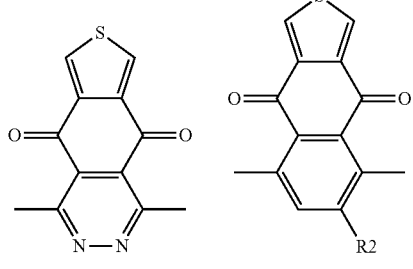
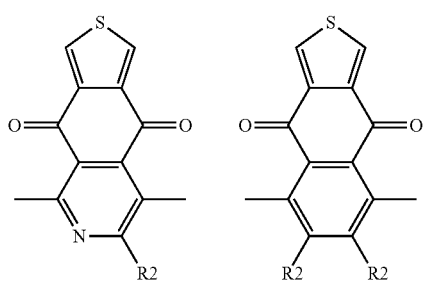

101
-continued
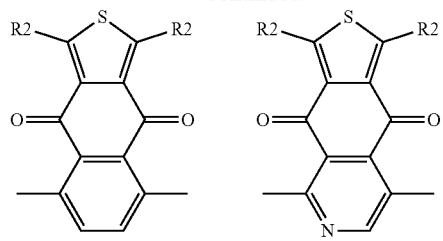
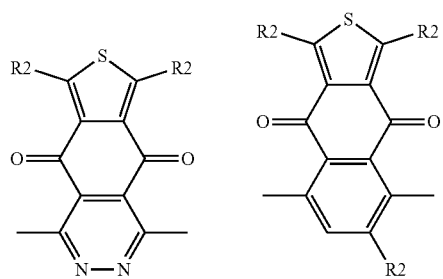
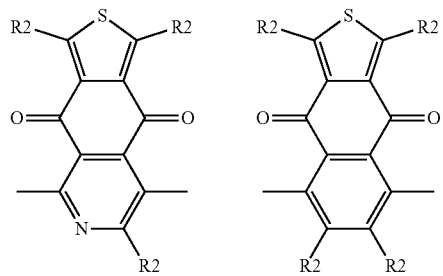
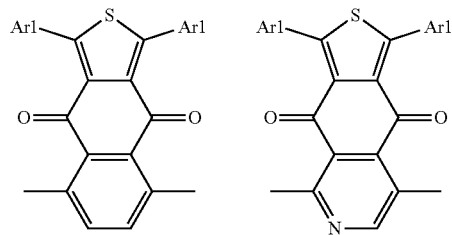
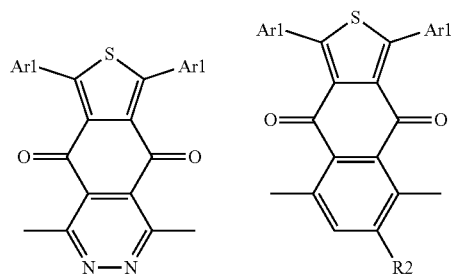
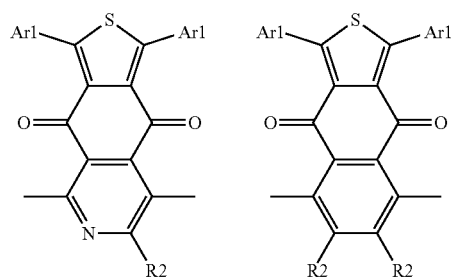
102
-continued
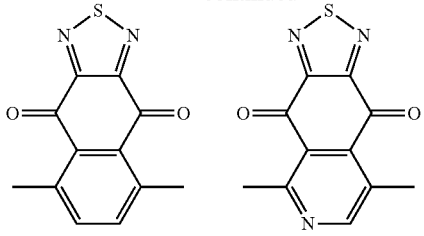
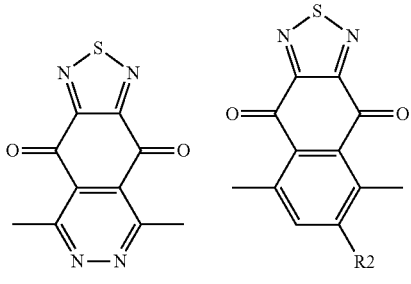
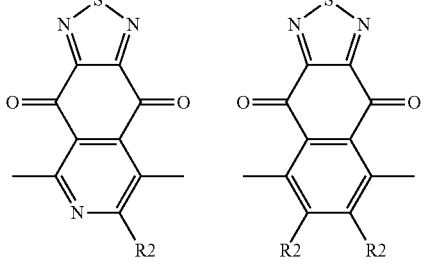
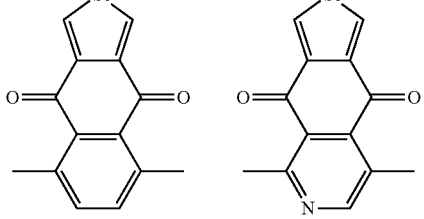
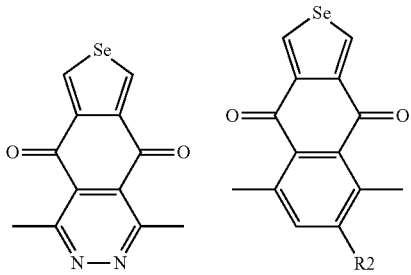
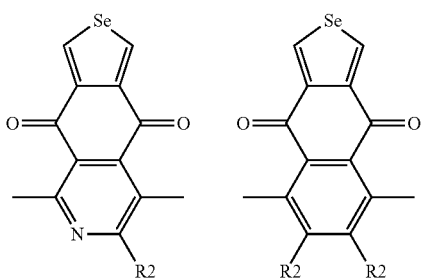

-continued
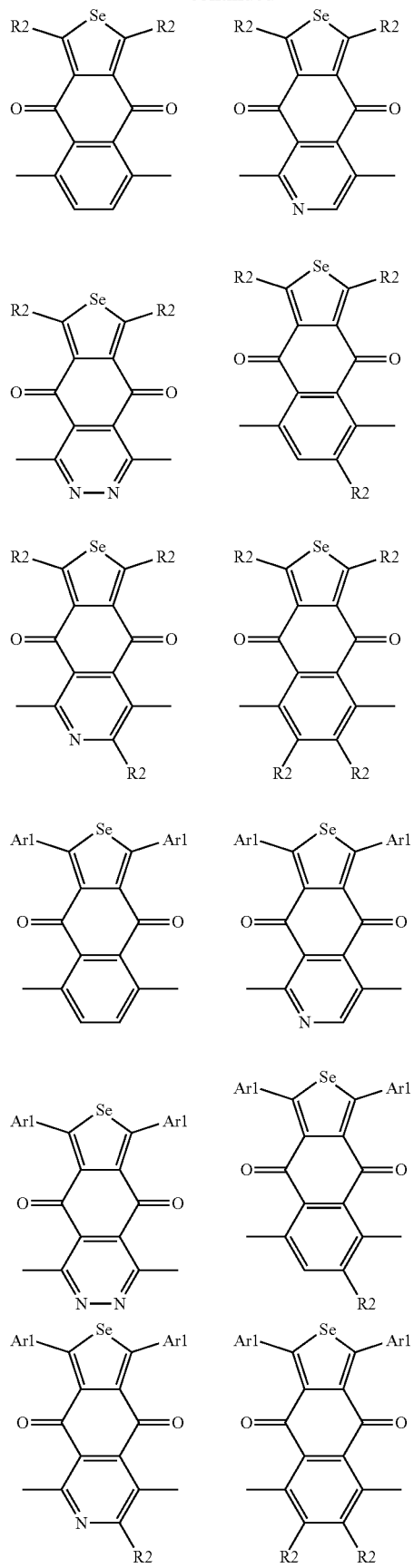
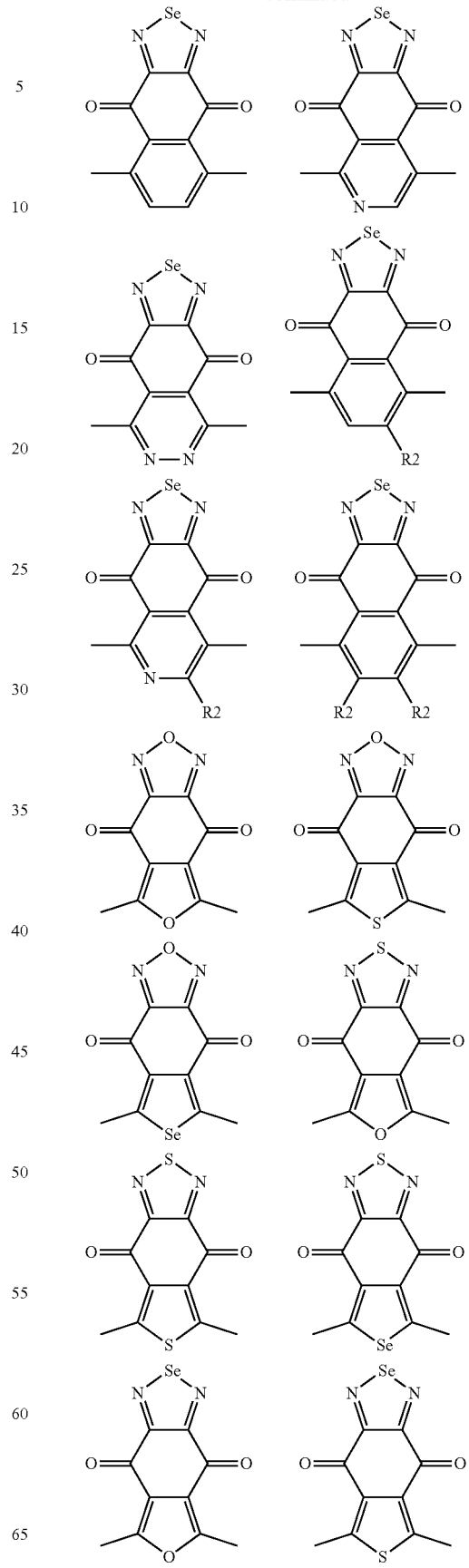

105
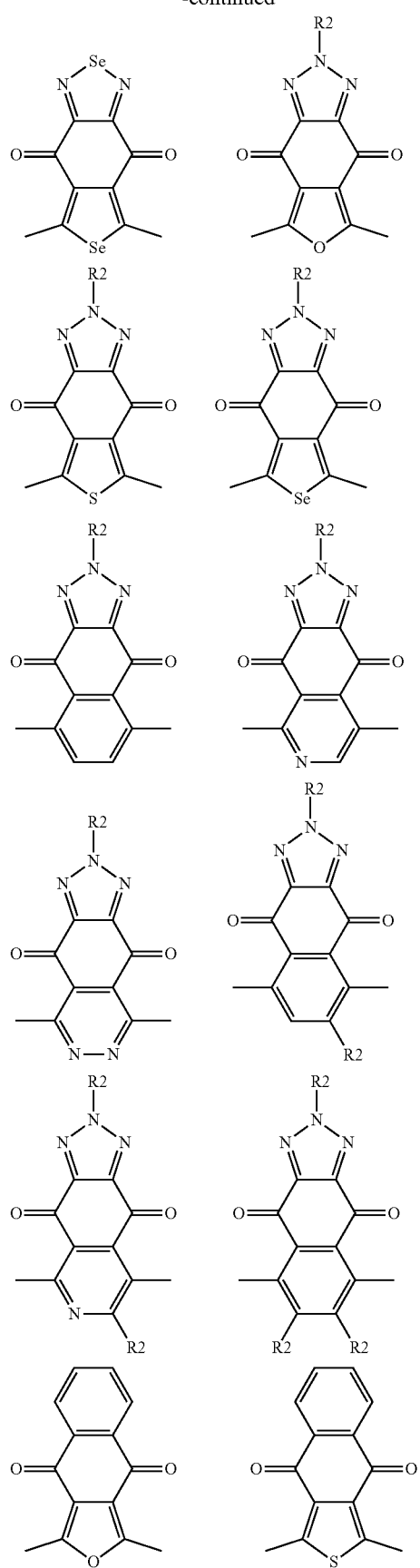
106
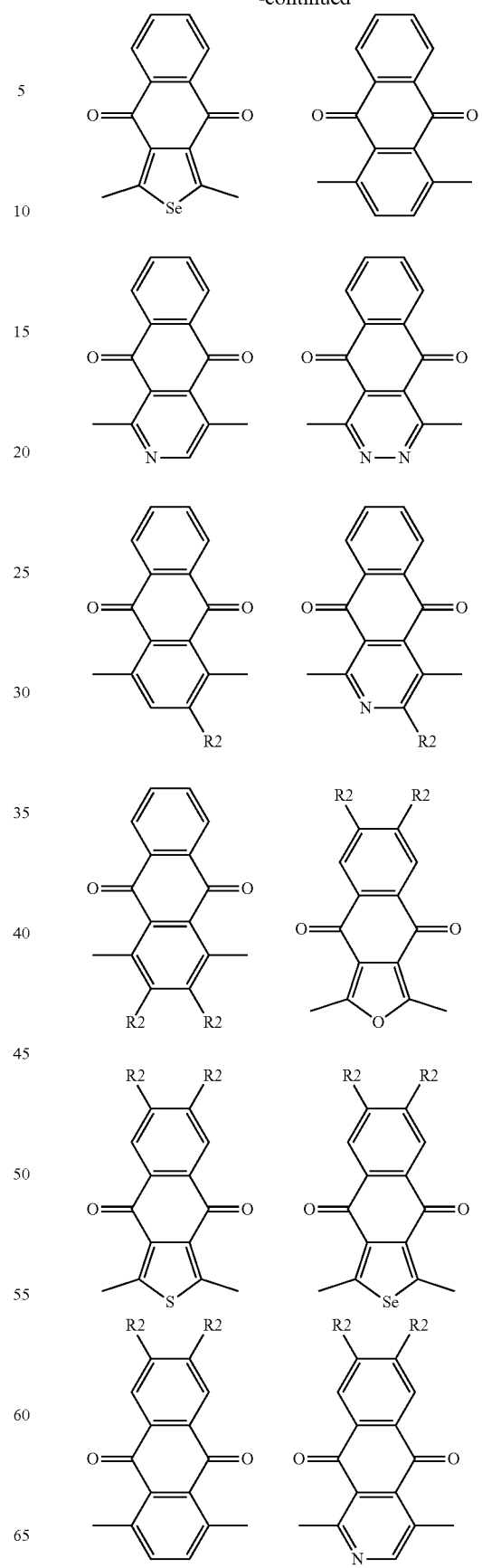

-continued

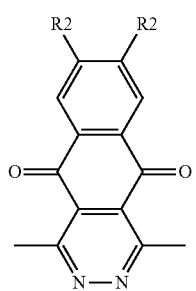
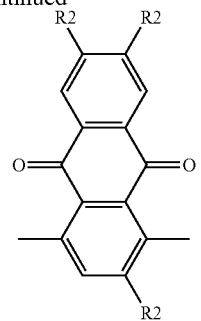
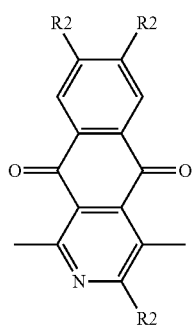
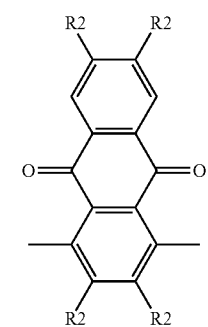
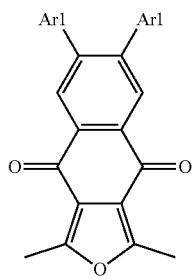
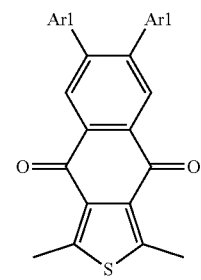
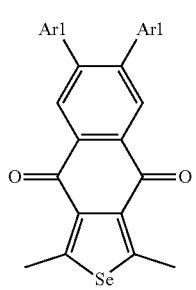
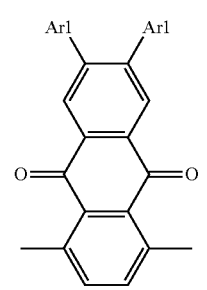
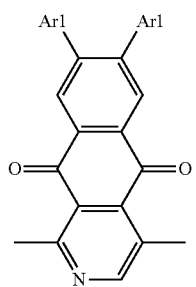
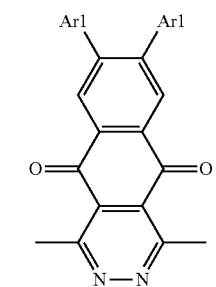

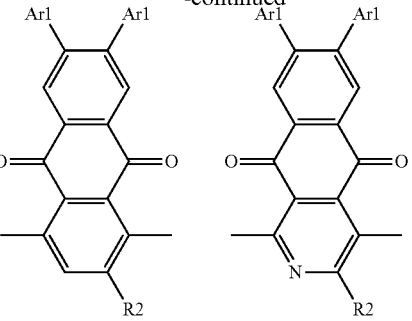
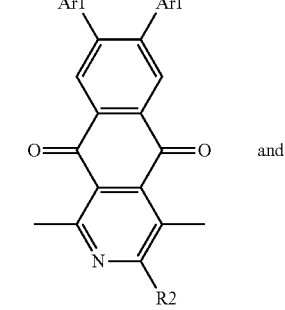

and

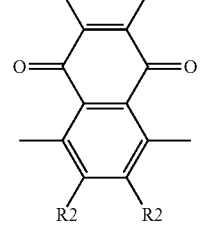

wherein, R2 is selected from the following groups and their derivatives consisting of C1-C30 alkyl, C3-C30 branched alkyl, C1-C30 silyl, C2-C30 ester, C1-C30 alkoxy, C1-C30 alkylthio, C1-C30 haloalkyl, C2-C30 alkene, C2-C30 alkyne, C2-C30 cyano-containing carbon chain, C1-C30 nitro-containing carbon chain, C1-C30 hydroxy-containing carbon chain, C3-C30 keto-containing carbon chain, halogen, hydrogen atom and cyan; Ar1 is selected from the following groups and their derivatives consisting of substituted and unsubstituted aromatic ring, substituted and unsubstituted heterocyclic ring, substituted and unsubstituted fused ring, substituted and unsubstituted fused heterocyclic ring, C1-C30 alkyl, C3-C30 branched alkyl, C1-C30 silyl, C2-C30 ester, C1-C30 alkoxy, C1-C30 alkylthio, C1-C30 haloalkyl, C2-C30 alkene, C2-C30 alkyne, C2-C30 cyano-containing carbon chain, C1-C30 nitro-containing carbon chain, C1-C30 hydroxy-containing carbon chain, C3-C30 keto-containing carbon chain, halogen-containing benzene ring, halogen-containing five-membered heterocyclic ring, and halogen-containing six-membered heterocyclic ring.

7. The conjugated polymer material of claim 2, wherein π1 and π2 further include substituted and unsubstituted monocyclic aromatic ring, substituted and unsubstituted polycyclic aromatic ring, substituted and unsubstituted heterocyclic aromatic ring and derivatives thereof, and the heteroatom of the heterocyclic ring includes at least one of selenium, sulfur, nitrogen, and oxygen.

8. The conjugated polymer material of claim 7, wherein π1 and π2 are independently selected from the following structures and their derivatives:

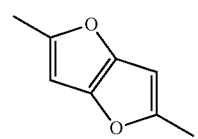
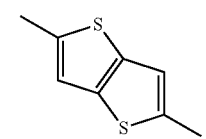

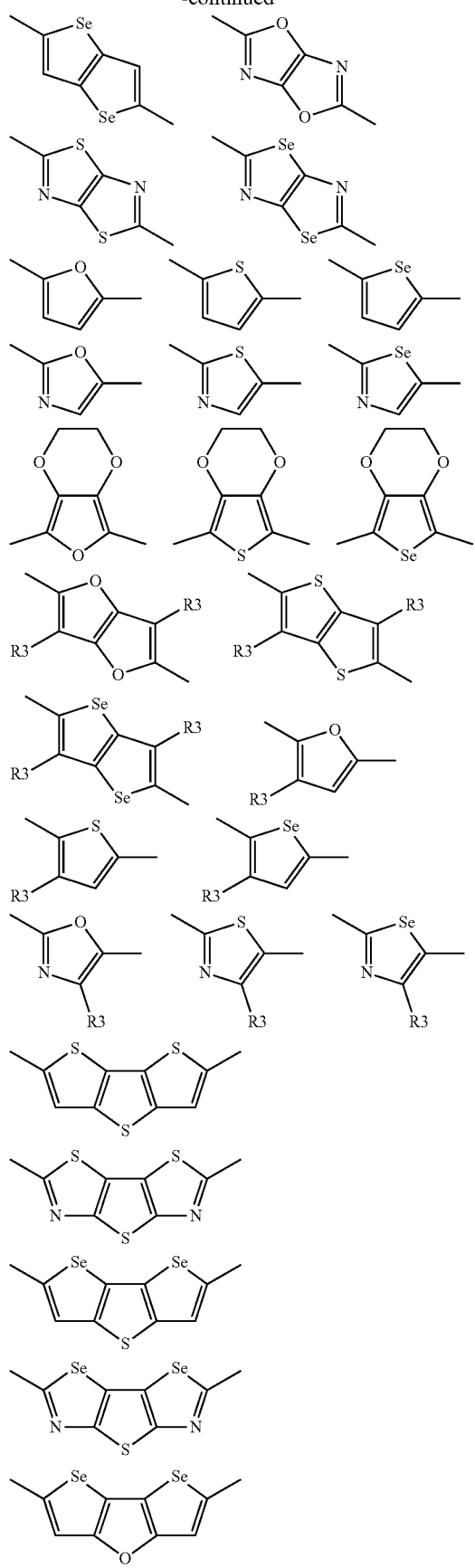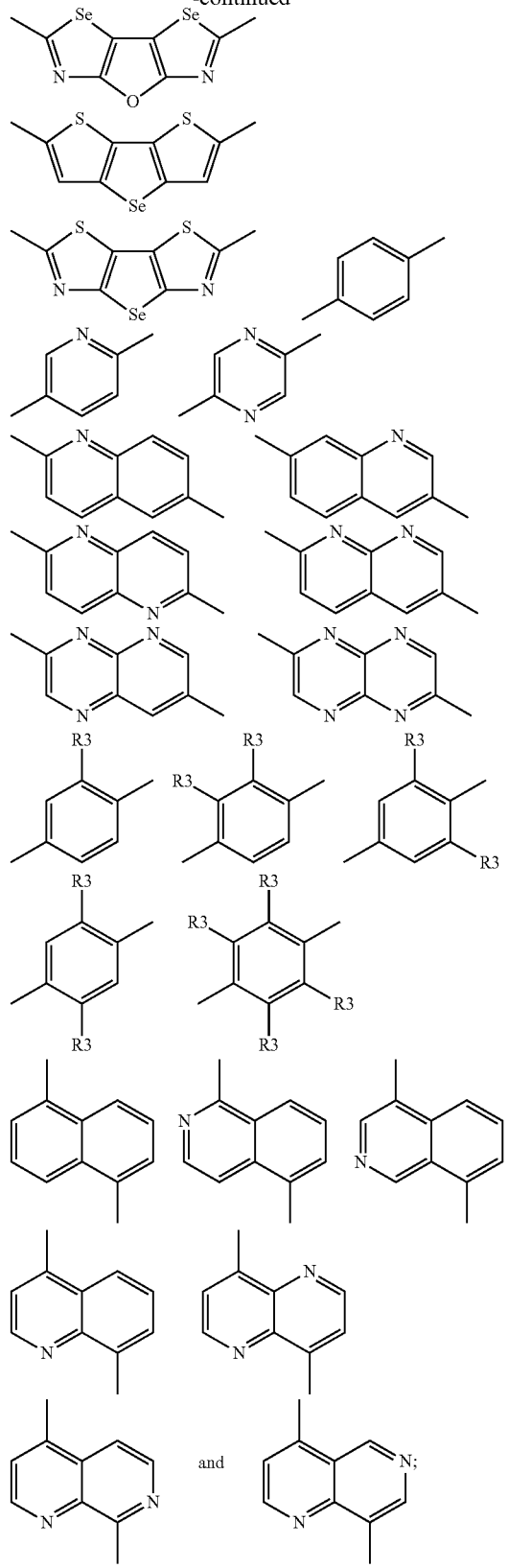
wherein, R3 is selected from the following groups and their derivatives consisting of C1-C30 alkyl, C3-C30 branched alkyl, C1-C30 silyl, C2-C30 ester, C1-C30 alkoxy, C1-C30 alkylthio, C1-C30 haloalkyl, C2-C30 alkene, C2-C30 alkyne, C2-C30 cyano-containing carbon chain, C1-C30 nitro-containing carbon chain, C1-C30 hydroxy-containing carbon chain, C3-C30 keto-containing carbon chain, halogen, hydrogen atom and cyano.

9. The conjugated polymer material of claim 1, further comprising a structure of formula III:

(formula III)

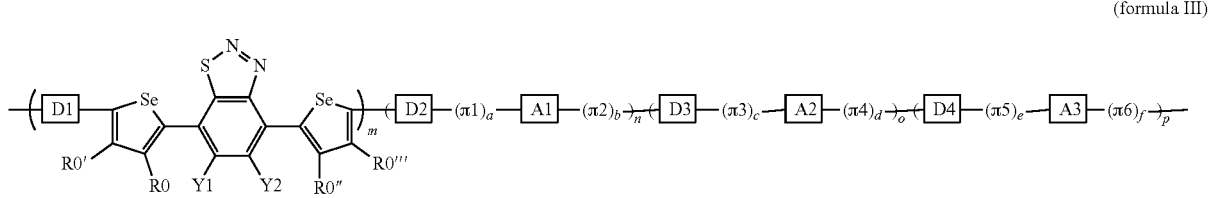

wherein, D1, D2, D3, and D4 can be the same or different electron donor groups from each other;
A1, A2, and A3 can be the same or different electron acceptor groups from each other;
π1, π2, π3, π4, π5, and π6 can be the same or different conjugated groups from each other;
a, b, c, d, e, and f are independently selected from 0 or 1; and
m, n, o, and p are integers and are independently selected from 0 to 1000, m is not equal to and o and p are not 0 at the same time.

10. An organic photovoltaic device comprising:
a first electrode including a transparent electrode;
a first carrier transfer layer;
an active layer which at least comprises a conjugated polymer material of claim 2;
a second carrier transfer layer; and
a second electrode;
wherein the first carrier transfer layer is disposed between the first electrode and the active layer, the active layer is disposed between the first carrier transfer layer and the second carrier transfer layer, and the second carrier transfer layer is disposed between the active layer and the second electrode.

* * * * *